United States Patent
Ohmaru et al.

(10) Patent No.: US 9,935,143 B2
(45) Date of Patent: Apr. 3, 2018

(54) SEMICONDUCTOR DEVICE AND ELECTRONIC DEVICE

(71) Applicant: Semiconductor Energy Laboratory Co., Ltd., Atsugi-shi, Kanagawa-ken (JP)

(72) Inventors: Takuro Ohmaru, Fukuoka (JP); Yukio Maehashi, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 15/272,093

(22) Filed: Sep. 21, 2016

(65) Prior Publication Data

US 2017/0092674 A1    Mar. 30, 2017

(30) Foreign Application Priority Data

Sep. 30, 2015  (JP) ................. 2015-192760

(51) Int. Cl.
*H01L 27/108* (2006.01)
*H01L 29/10* (2006.01)
(Continued)

(52) U.S. Cl.
CPC .. *H01L 27/14616* (2013.01); *H01L 27/14636* (2013.01); *H01L 29/24* (2013.01); *H01L 29/7869* (2013.01); *H04N 5/378* (2013.01)

(58) Field of Classification Search
CPC ........................... G11C 11/413; G11C 7/1048
See application file for complete search history.

(56) References Cited

U.S. PATENT DOCUMENTS 5,731,856 A    3/1998  Kim et al.
5,744,864 A    4/1998  Cillessen et al.
(Continued)

FOREIGN PATENT DOCUMENTS

CN    001770324 A    5/2006
EP    1737044 A    12/2006
(Continued)

OTHER PUBLICATIONS

International Search Report (Application No. PCT/IB2016/055614) dated Nov. 29, 2016.

(Continued)

*Primary Examiner* — Sitaramarao S Yechuri
(74) *Attorney, Agent, or Firm* — Fish & Richardson P.C.

(57) ABSTRACT

A small semiconductor device suitable for high-speed operation is provided. The semiconductor device includes a first circuit, a global bit line pair for writing, a global bit line pair for reading, and a local bit line pair. The first circuit includes second to fifth circuits. The second to fifth circuits are electrically connected to each other by the local bit line pair. The second circuit functions as a read/write selection switch. The third circuit functions as a working memory that stores 1-bit complementary data temporarily. The fourth circuit has a function of precharging the local bit line pair. The fifth circuit includes n (n is an integer of 2 or more) sixth circuits. The sixth circuits each have a function of retaining 1-bit complementary data written from the third circuit.

9 Claims, 37 Drawing Sheets

(51) Int. Cl.
*H01L 27/146* (2006.01)
*H01L 29/24* (2006.01)
*H01L 29/786* (2006.01)
*H04N 5/378* (2011.01)

(56) References Cited

U.S. PATENT DOCUMENTS

| | | | |
|---|---|---|---|
| 6,201,728 B1* | 3/2001 | Narui | G11C 7/065 |
| | | | 257/E27.085 |
| 6,294,274 B1 | 9/2001 | Kawazoe et al. | |
| 6,504,766 B1* | 1/2003 | Pilo | G11C 7/062 |
| | | | 365/189.14 |
| 6,563,174 B2 | 5/2003 | Kawasaki et al. | |
| 6,569,723 B2 | 5/2003 | Liaw | |
| 6,727,522 B1 | 4/2004 | Kawasaki et al. | |
| 6,737,685 B2 | 5/2004 | Aipperspach et al. | |
| 7,049,190 B2 | 5/2006 | Takeda et al. | |
| 7,061,014 B2 | 6/2006 | Hosono et al. | |
| 7,064,346 B2 | 6/2006 | Kawasaki et al. | |
| 7,105,868 B2 | 9/2006 | Nause et al. | |
| 7,211,825 B2 | 5/2007 | Shih et al. | |
| 7,282,782 B2 | 10/2007 | Hoffman et al. | |
| 7,297,977 B2 | 11/2007 | Hoffman et al. | |
| 7,323,356 B2 | 1/2008 | Hosono et al. | |
| 7,385,224 B2 | 6/2008 | Ishii et al. | |
| 7,402,506 B2 | 7/2008 | Levy et al. | |
| 7,411,209 B2 | 8/2008 | Endo et al. | |
| 7,453,065 B2 | 11/2008 | Saito et al. | |
| 7,453,087 B2 | 11/2008 | Iwasaki | |
| 7,462,862 B2 | 12/2008 | Hoffman et al. | |
| 7,468,304 B2 | 12/2008 | Kaji et al. | |
| 7,501,293 B2 | 3/2009 | Ito et al. | |
| 7,674,650 B2 | 3/2010 | Akimoto et al. | |
| 7,732,819 B2 | 6/2010 | Akimoto et al. | |
| 8,593,857 B2 | 11/2013 | Takemura | |
| 8,599,604 B2 | 12/2013 | Takemura | |
| 8,624,650 B2 | 1/2014 | Ishii | |
| 8,787,102 B2 | 7/2014 | Ishizu | |
| 8,854,867 B2 | 10/2014 | Takemura | |
| 8,964,450 B2 | 2/2015 | Ishizu | |
| 2001/0046027 A1 | 11/2001 | Tai et al. | |
| 2002/0056838 A1 | 5/2002 | Ogawa | |
| 2002/0132454 A1 | 9/2002 | Ohtsu et al. | |
| 2003/0189401 A1 | 10/2003 | Kido et al. | |
| 2003/0218222 A1 | 11/2003 | Wager, III et al. | |
| 2004/0038446 A1 | 2/2004 | Takeda et al. | |
| 2004/0127038 A1 | 7/2004 | Carcia et al. | |
| 2004/0232497 A1* | 11/2004 | Akiyama | H01L 23/5223 |
| | | | 257/390 |
| 2005/0017302 A1 | 1/2005 | Hoffman | |
| 2005/0199959 A1 | 9/2005 | Chiang et al. | |
| 2006/0035452 A1 | 2/2006 | Carcia et al. | |
| 2006/0043377 A1 | 3/2006 | Hoffman et al. | |
| 2006/0091793 A1 | 5/2006 | Baude et al. | |
| 2006/0092720 A1* | 5/2006 | Kodama | G11C 7/1048 |
| | | | 365/189.11 |
| 2006/0108529 A1 | 5/2006 | Saito et al. | |
| 2006/0108636 A1 | 5/2006 | Sano et al. | |
| 2006/0110867 A1 | 5/2006 | Yabuta et al. | |
| 2006/0113536 A1 | 6/2006 | Kumomi et al. | |
| 2006/0113539 A1 | 6/2006 | Sano et al. | |
| 2006/0113549 A1 | 6/2006 | Den et al. | |
| 2006/0113565 A1 | 6/2006 | Abe et al. | |
| 2006/0169973 A1 | 8/2006 | Isa et al. | |
| 2006/0170111 A1 | 8/2006 | Isa et al. | |
| 2006/0197092 A1 | 9/2006 | Hoffman et al. | |
| 2006/0208977 A1 | 9/2006 | Kimura | |
| 2006/0228974 A1 | 10/2006 | Thelss et al. | |
| 2006/0231882 A1 | 10/2006 | Kim et al. | |
| 2006/0238135 A1 | 10/2006 | Kimura | |
| 2006/0244107 A1 | 11/2006 | Sugihara et al. | |
| 2006/0284171 A1 | 12/2006 | Levy et al. | |
| 2006/0284172 A1 | 12/2006 | Ishii | |
| 2006/0292777 A1 | 12/2006 | Dunbar | |
| 2007/0024187 A1 | 2/2007 | Shin et al. | |
| 2007/0046191 A1 | 3/2007 | Saito | |
| 2007/0052025 A1 | 3/2007 | Yabuta | |
| 2007/0054507 A1 | 3/2007 | Kaji et al. | |
| 2007/0070754 A1* | 3/2007 | Vogelsang | G11C 7/12 |
| | | | 365/208 |
| 2007/0090365 A1 | 4/2007 | Hayashi et al. | |
| 2007/0108446 A1 | 5/2007 | Akimoto | |
| 2007/0152217 A1 | 7/2007 | Lai et al. | |
| 2007/0172591 A1 | 7/2007 | Seo et al. | |
| 2007/0187678 A1 | 8/2007 | Hirao et al. | |
| 2007/0187760 A1 | 8/2007 | Furuta et al. | |
| 2007/0194379 A1 | 8/2007 | Hosono et al. | |
| 2007/0252928 A1 | 11/2007 | Ito et al. | |
| 2007/0272922 A1 | 11/2007 | Kim et al. | |
| 2007/0287296 A1 | 12/2007 | Chang | |
| 2008/0006877 A1 | 1/2008 | Mardilovich et al. | |
| 2008/0038882 A1 | 2/2008 | Takechi et al. | |
| 2008/0038929 A1 | 2/2008 | Chang | |
| 2008/0050595 A1 | 2/2008 | Nakagawara et al. | |
| 2008/0073653 A1 | 3/2008 | Iwasaki | |
| 2008/0083950 A1 | 4/2008 | Pan et al. | |
| 2008/0106191 A1 | 5/2008 | Kawase | |
| 2008/0128689 A1 | 6/2008 | Lee et al. | |
| 2008/0129195 A1 | 6/2008 | Ishizaki et al. | |
| 2008/0137459 A1* | 6/2008 | Morishima | G11C 7/1051 |
| | | | 365/208 |
| 2008/0166834 A1 | 7/2008 | Kim et al. | |
| 2008/0182358 A1 | 7/2008 | Cowdery-Corvan et al. | |
| 2008/0224133 A1 | 9/2008 | Park et al. | |
| 2008/0254569 A1 | 10/2008 | Hoffman et al. | |
| 2008/0258139 A1 | 10/2008 | Ito et al. | |
| 2008/0258140 A1 | 10/2008 | Lee et al. | |
| 2008/0258141 A1 | 10/2008 | Park et al. | |
| 2008/0258143 A1 | 10/2008 | Kim et al. | |
| 2008/0296568 A1 | 12/2008 | Ryu et al. | |
| 2009/0068773 A1 | 3/2009 | Lai et al. | |
| 2009/0073325 A1 | 3/2009 | Kuwabara et al. | |
| 2009/0114910 A1 | 5/2009 | Chang | |
| 2009/0134399 A1 | 5/2009 | Sakakura et al. | |
| 2009/0152506 A1 | 6/2009 | Umeda et al. | |
| 2009/0152541 A1 | 6/2009 | Maekawa et al. | |
| 2009/0278122 A1 | 11/2009 | Hosono et al. | |
| 2009/0280600 A1 | 11/2009 | Hosono et al. | |
| 2010/0065844 A1 | 3/2010 | Tokunaga | |
| 2010/0092800 A1 | 4/2010 | Itagaki et al. | |
| 2010/0109002 A1 | 5/2010 | Itagaki et al. | |
| 2011/0089417 A1 | 4/2011 | Yamazaki et al. | |
| 2012/0012837 A1* | 1/2012 | Yamazaki | H01L 27/11517 |
| | | | 257/43 |
| 2012/0235240 A1 | 9/2012 | Dixit | |
| 2012/0271984 A1 | 10/2012 | Ohmaru et al. | |
| 2012/0294069 A1 | 11/2012 | Ohmaru et al. | |
| 2013/0301331 A1 | 11/2013 | Onuki et al. | |
| 2014/0111262 A1 | 4/2014 | Ishii | |
| 2014/0326995 A1 | 11/2014 | Ishizu | |
| 2015/0070962 A1 | 3/2015 | Ohmaru et al. | |
| 2015/0109870 A1 | 4/2015 | Ishizu et al. | |
| 2015/0117093 A1 | 4/2015 | Onuki et al. | |
| 2015/0269977 A1 | 9/2015 | Ishizu et al. | |
| 2015/0294991 A1 | 10/2015 | Ishizu | |

FOREIGN PATENT DOCUMENTS

| | | |
|---|---|---|
| EP | 2226847 A | 9/2010 |
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |

(56) References Cited

FOREIGN PATENT DOCUMENTS

| | | |
|---|---|---|
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2006-134375 A | 5/2006 |
| JP | 2007-042172 A | 2/2007 |
| JP | 2007-096055 A | 4/2007 |
| JP | 2007-123861 A | 5/2007 |
| WO | WO-2003/052829 | 6/2003 |
| WO | WO-2004/114391 | 12/2004 |
| WO | WO-2016/181256 | 11/2016 |

OTHER PUBLICATIONS

Written Opinion (Application No. PCT/IB2016/055614) dated Nov. 29, 2016.
Asakuma.N et al., "Crystallization and Reduction of Sol-Gel-Derived Zinc Oxide Films by Irradiation With Ultraviolet Lamp", Journal of Sol-Gel Science and Technology, 2003, vol. 26, pp. 181-184.
Asaoka.Y et al., "29.1:Polarizer-Free Reflective LCD Combined With Ultra Low-Power Driving Technology", SID Digest '09 : SID International Symposium Digest of Technical Papers, May 31, 2009, pp. 395-398.
Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.
Cho.D et al., "21.2:Al and Sn-Doped Zinc Indium Oxide Thin Film Transistors for AMOLED Back-Plane", SID Digest '09 : SID International Symposium Digest of Technical Papers, May 31, 2009, pp. 280-283.
Clark.S et al., "First Principles Methods Using Castep", Zeitschrift fur Kristallographie, 2005, vol. 220, pp. 567-570.
Coates.D et al., "Optical Studies of the Amorphous Liquid-Cholesteric Liquid Crystal Transition:The "Blue Phase"", Physics Letters, Sep. 10, 1973, vol. 45A, No. 2, pp. 115-116.
Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.
Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.
Fortunato.E et al., "Wide-Bandgap High-Mobility ZnO Thin-Film Transistors Produced at Room Temperature", Appl. Phys. Lett. (Applied Physics Letters) , Sep. 27, 2004, vol. 85, No. 13, pp. 2541-2543.
Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.
Godo.H et al., "P-9:Numerical Analysis on Temperature Dependence of Characteristics of Amorphous In—Ga—Zn-Oxide TFT", SID Digest '09 : SID International Symposium Digest of Technical Papers, May 31, 2009, pp. 1110-1112.
Godo.H et al., "Temperature Dependence of Characteristics and Electronic Structure for Amorphous In—Ga—Zn-Oxide TFT", AM-FPD '09 Digest of Technical Papers, Jul. 1, 2009, pp. 41-44.
Hayashi.R et al., "42.1: Invited Paper: Improved Amorphous In—Ga—Zn—O TFTs", SID Digest '08 : SID International Symposium Digest of Technical Papers, May 20, 2008, vol. 39, pp. 621-624.
Hirao.T et al., "Novel Top-Gate Zinc Oxide Thin-Film Transistors (ZnO TFTs) for AMLCDs", J. Soc. Inf. Display (Journal of the Society for Information Display), 2007, vol. 15, No. 1, pp. 17-22.
Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.
Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.
Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.
Ikeda.T et al., "Full-Functional System Liquid Crystal Display Using CG-Silicon Technology", SID Digest '04 : SID International Symposium Digest of Technical Papers, 2004, vol. 35, pp. 860-863.
Janotti.A et al., "Native Point Defects in ZnO", Phys. Rev. B (Physical Review. B), Oct. 4, 2007, vol. 76, No. 16, pp. 165202-1-165202-22.
Janotti.A et al., "Oxygen Vacancies in ZnO", Appl. Phys. Lett. (Applied Physics Letters) , 2005, vol. 87, pp. 122102-1-122102-3.
Jeong.J et al., "3.1: Distinguished Paper: 12.1-Inch WXGA AMOLED Display Driven by Indium-Gallium-Zinc Oxide TFTs Array", SID Digest '08 : SID International Symposium Digest of Technical Papers, May 20, 2008, vol. 39, No. 1, pp. 1-4.
Jin.D et al., "65.2:Distinguished Paper:World-Largest (6.5") Flexible Full Color Top Emission AMOLED Display on Plastic Film and Its Bending Properties", SID Digest '09 : SID International Symposium Digest of Technical Papers, May 31, 2009, pp. 983-985.
Kanno.H et al., "White Stacked Electrophosphorecent Organic Light-Emitting Devices Employing MOO3 as a Charge-Generation Layer", Adv. Mater. (Advanced Materials), 2006, vol. 18, No. 3, pp. 339-342.
Kikuchi.H et al., "39.1:Invited Paper:Optically Isotropic Nano-Structured Liquid Crystal Composited for Display Applications", SID Digest '09 : SID International Symposium Digest of Technical Papers, May 31, 2009, pp. 578-581.
Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.
Kikuchi.H et al., "Polymer-Stabilized Liquid Crystal Blue Phases", Nature Materials, Sep. 2, 2002, vol. 1, pp. 64-68.
Kim.S et al., "High-Performance oxide thin film transistors passivated by various gas plasmas", 214th ECS Meeting, 2008, No. 2317, ECS.
Kimizuka.N et al., "Spinel,YbFe2O4, and Yb2Fe3O7 Types of Structures for Compounds in the In2O3 and Sc2O3—A2O3—BO Systems [A; Fe, Ga, or Al; B: Mg, Mn, Fe, Ni, Cu,or Zn] at Temperatures over 1000° C.", Journal of Solid State Chemistry, 1985, vol. 60, pp. 382-384.
Kimizuka.N et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3—ZnGa2O4—ZnO System", Journal of Solid State Chemistry, Apr. 1, 1995, vol. 116, No. 1, pp. 170-178.
Kitzerow.H et al., "Observation of Blue Phases in Chiral Networks", Liquid Crystals, 1993, vol. 14, No. 3, pp. 911-916.
Kurokawa.Y et al., "UHF RFCPUS on Flexible and Glass Substrates for Secure RFID Systems", Journal of Solid-State Circuits , 2008, vol. 43, No. 1, pp. 292-299.
Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.
Lee.H et al., "Current Status of, Challenges to, and Perspective View of AM-OLED", IDW '06 : Proceedings of the 13th International Display Workshops, Dec. 7, 2006, pp. 663-666.
Lee.J et al., "World's Largest (15-Inch) XGA AMLCD Panel Using IGZO Oxide TFT", SID Digest '08 : SID International Symposium Digest of Technical Papers, May 20, 2008, vol. 39, pp. 625-628.
Lee.M et al., "15.4:Excellent Performance of Indium-Oxide-Based Thin-Film Transistors by DC Sputtering", SID Digest '09 : SID Internatioanl Symposium Digest of Technical Papers, May 31, 2009, pp. 191-193.

(56) References Cited

OTHER PUBLICATIONS

Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.

Masuda.S et al., "Transparent thin film transistors using ZnO as an active channel layer and their electrical properties", J. Appl. Phys. (Journal of Applied Physics), Feb. 1, 2003, vol. 93, No. 3, pp. 1624-1630.

Meiboom.S et al., "Theory of the Blue Phase of Cholesteric Liquid Crystals", Phys. Rev. Lett. (Physical Review Letters), May 4, 1981, vol. 46, No. 18, pp. 1216-1219.

Miyasaka.M, "Suftla Flexible Microelectronics on Their Way to Business", SID Digest '07 : SID International Symposium Digest of Technical Papers, 2007, vol. 38, pp. 1673-1676.

Mo.Y et al., "Amorphous Oxide TFT Backplanes for Large Size AMOLED Displays", IDW '08 : Proceedings of the 6th International Display Workshops, Dec. 3, 2008, pp. 581-584.

Nakamura.M et al., "The phase relations in the In2O3—Ga2ZnO4—ZnO system at 1350° C.", Journal of Solid State Chemistry, Aug. 1, 1991, vol. 93, No. 2, pp. 298-315.

Nakamura.M, "Synthesis of Homologous Compound with New Long-Period Structure", Nirim Newsletter, Mar. 1, 1995, vol. 150, pp. 1-4.

Nomura.K et al., "Amorphous Oxide Semiconductors for High-Performance Flexible Thin-Film Transistors", Jpn. J. Appl. Phys. (Japanese Journal of Applied Physics), 2006, vol. 45, No. 5B, pp. 4303-4308.

Nomura.K et al., "Carrier transport in transparent oxide semiconductor with intrinsic structural randomness probed using single-crystalline InGaO3(ZnO)5 films", Appl. Phys. Lett. (Applied Physics Letters), Sep. 13, 2004, vol. 85, No. 11, pp. 1993-1995.

Nomura.K et al., "Room-Temperature Fabrication of Transparent Flexible Thin-Film Transistors Using Amorphous Oxide Semiconductors", Nature, Nov. 25, 2004, vol. 432, pp. 488-492.

Nomura.K et al., "Thin-Film Transistor Fabricated in Single-Crystalline Transparent Oxide Semiconductor", Science, May 23, 2003, vol. 300, No. 5623, pp. 1269-1272.

Nowatari.H et al., "60.2: Intermediate Connector With Suppressed Voltage Loss for White Tandem OLEDs", SID Digest '09 : SID International Symposium Digest of Technical Papers, May 31, 2009, vol. 40, pp. 899-902.

Oba.F et al., "Defect energetics in ZnO: A hybrid Hartree-Fock density functional study", Phys. Rev. B (Physical Review. B), 2008, vol. 77, pp. 245202-1-245202-6.

Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.

Ohara.H et al., "21.3:4.0 In. QVGA AMOLED Display Using In—Ga—Zn-Oxide TFTs With a Novel Passivation Layer", SID Digest '09 : SID International Symposium Digest of Technical Papers, May 31, 2009, pp. 284-287.

Ohara.H et al., "Amorphous In—Ga—Zn-Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.

Orita.M et al., "Amorphous transparent conductive oxide InGaO3(ZnO)m (m<4):a Zn4s conductor", Philosophical Magazine, 2001, vol. 81, No. 5, pp. 501-515.

Orita.M et al., "Mechanism of Electrical Conductivity of Transparent InGaZnO4", Phys. Rev. B (Physical Review. B), Jan. 15, 2000, vol. 61, No. 3, pp. 1811-1816.

Osada.T et al., "15.2: Development of Driver-Integrated Panel using Amorphous In—Ga—Zn-Oxide TFT", SID Digest '09 : SID International Symposium Digest of Technical Papers, May 31, 2009, vol. 40, pp. 184-187.

Osada.T et al., "Development of Driver-Integrated Panel Using Amorphous In—Ga—Zn-Oxide TFT", AM-FPD '09 Digest of Technical Papers, Jul. 1, 2009, pp. 33-36.

Park.J et al., "Amorphous Indium-Gallium-Zinc Oxide TFTs and Their Application for Large Size AMOLED", AM-FPD '08 Digest of Technical Papers, Jul. 2, 2008, pp. 275-278.

Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.

Park.J et al., "Electronic Transport Properties of Amorphous Indium-Gallium-Zinc Oxide Semiconductor Upon Exposure to Water", Appl. Phys. Lett. (Applied Physics Letters), 2008, vol. 92, pp. 072104-1-072104-3.

Park.J et al., "High performance amorphous oxide thin film transistors with self-aligned top-gate structure", IEDM 09: Technical Digest of International Electron Devices Meeting, Dec. 7, 2009, pp. 191-194.

Park.J et al., "Improvements in the Device Characteristics of Amorphous Indium Gallium Zinc Oxide Thin-Film Transistors by Ar Plasma Treatment", Appl. Phys. Lett. (Applied Physics Letters), Jun. 26, 2007, vol. 90, No. 26, pp. 262106-1-262106-3.

Park.S et al., "Challenge to Future Displays: Transparent AM-OLED Driven by Peald Grown ZnO TFT", IMID '07 Digest, 2007, pp. 1249-1252.

Park.Sang-Hee et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.

Prins.M et al., "A Ferroelectric Transparent Thin-Film Transistor", Appl. Phys. Lett. (Applied Physics Letters), Jun. 17, 1996, vol. 68, No. 25, pp. 3650-3652.

Sakata.J et al., "Development of 4.0-In. AMOLED Display With Driver Circuit Using Amorphous In—Ga—Zn-Oxide TFTs", IDW '09 : Proceedings of the 16th International Display Workshops, 2009, pp. 689-692.

Son.K et al., "42.4L: Late-News Paper: 4 Inch QVGA AMOLED Driven by the Threshold Voltage Controlled Amorphous GIZO (Ga2O3—In2O3—ZnO) TFT", SID Digest '08 : SID Internationanl Symposium Digest of Technical Papers, May 20, 2008, vol. 39, pp. 633-636.

Takahashi.M et al., "Theoretical Analysis of IGZO Transparent Amorphous Oxide Semiconductor", IDW'08 : Proceedings of the 15th International Display Workshops, Dec. 3, 2008, pp. 1637-1640.

Tsuda.K et al., "Ultra Low Power Consumption Technologies for Mobile TFT-LCDs", IDW '02 : Proceedings of the 9th International Display Workshops, Dec. 4, 2002, pp. 295-298.

Ueno.K et al., "Field-Effect Transistor on SrTiO3 With Sputtered Al2O3 Gate Insulator", Appl. Phys. Lett. (Applied Physics Letters), Sep. 1, 2003, vol. 83, No. 9, pp. 1755-1757.

Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

Funatsu.R et al., "133Mpixel 60fps CMOS Image Sensor with 32-Column Shared High-Speed Column-Parallel SAR ADCs", ISSCC 2015 (Digest of Technical Papers. IEEE International Solid-State Circuits Conference), Feb. 23, 2015, pp. 112-113.

Watabe.T et al., "A 33Mpixel 120fps CMOS Image Sensor Using 12b Column-Parallel Pipelined Cyclic ADCs", ISSCC 2012 (Digest of Technical Papers. IEEE International Solid-State Circuits Conference), Feb. 19, 2012, pp. 388-390.

\* cited by examiner

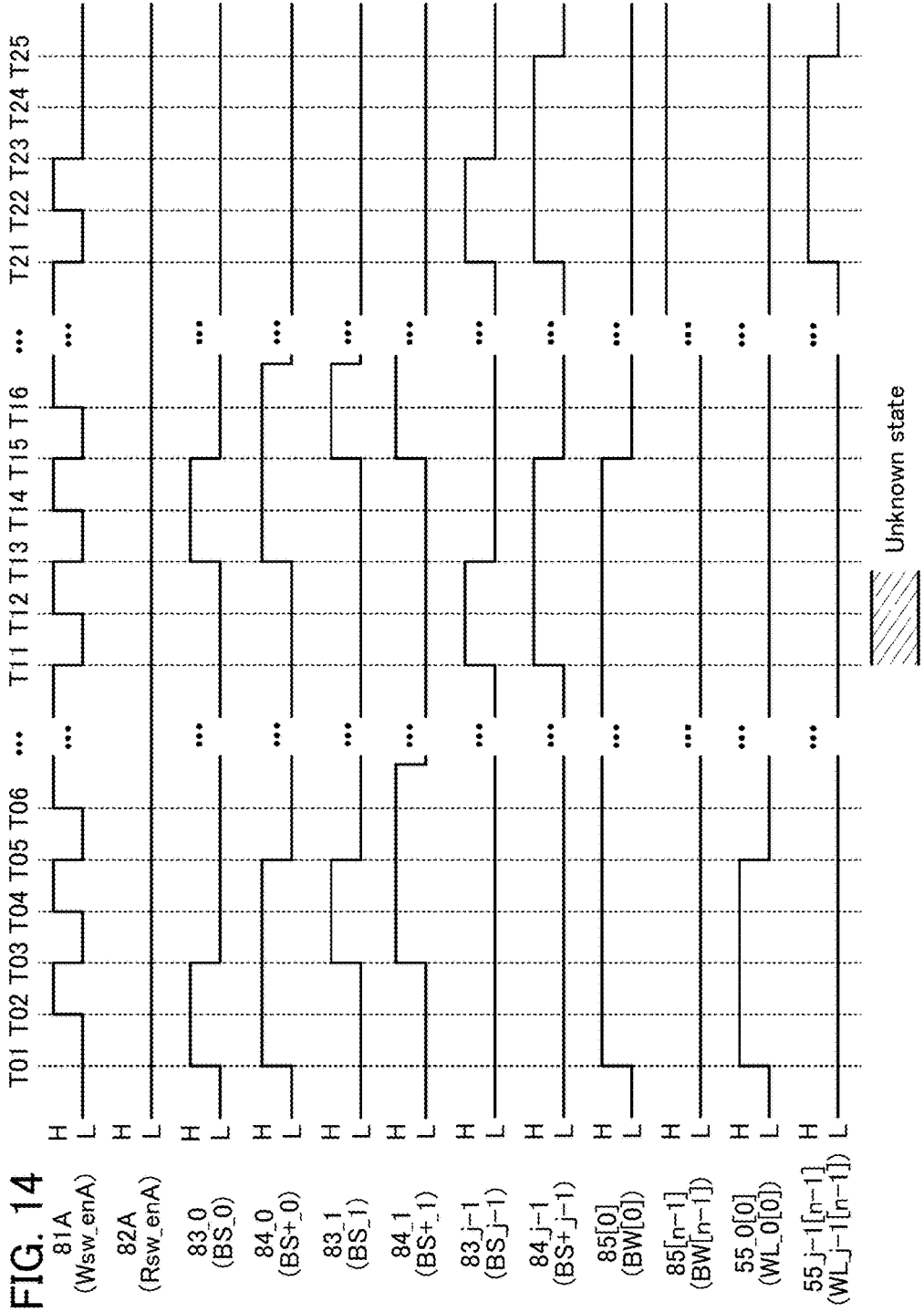

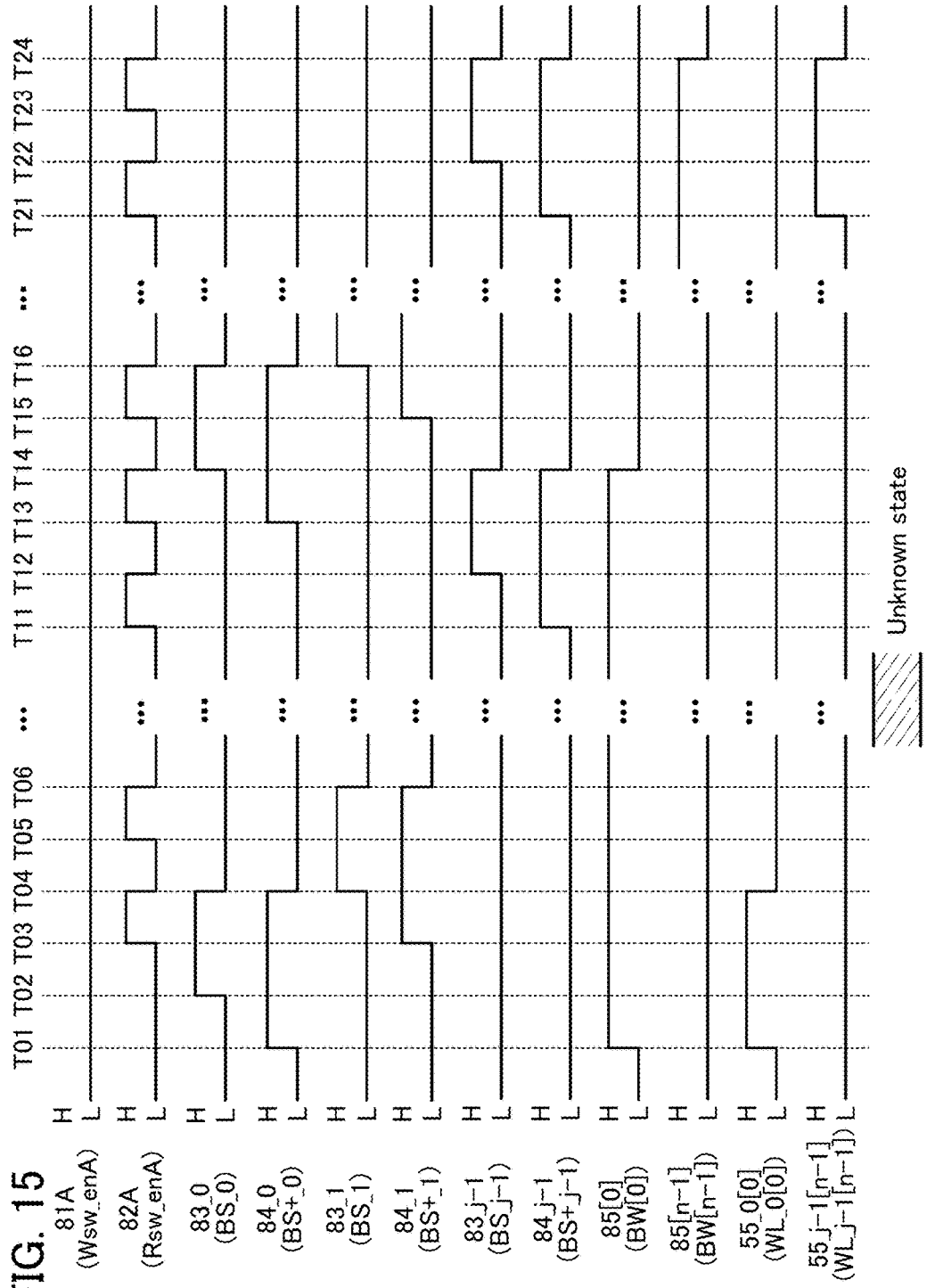

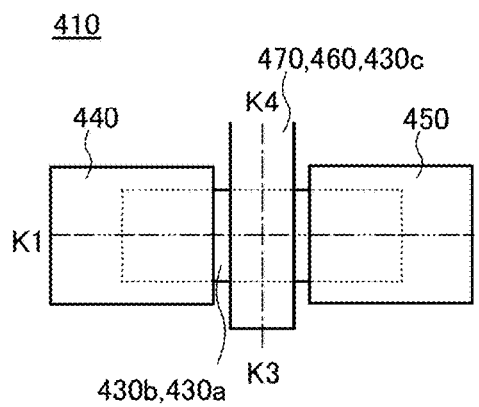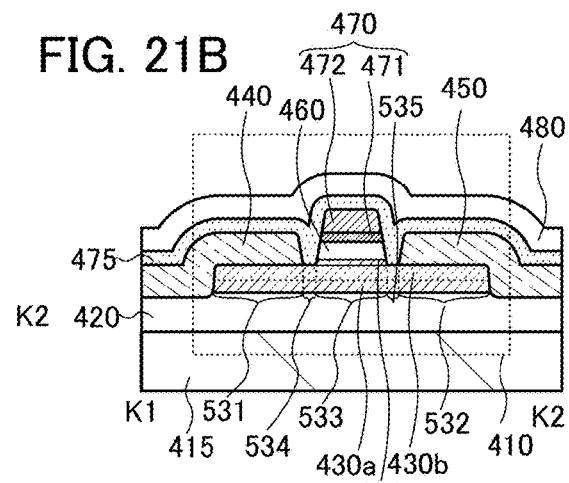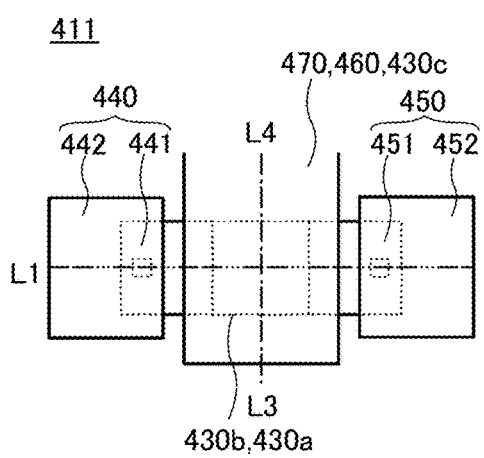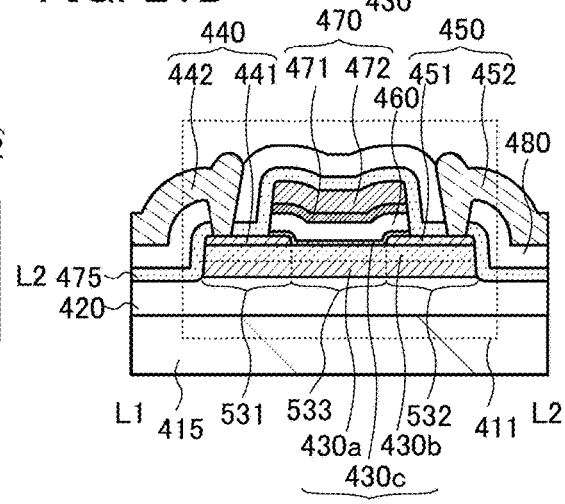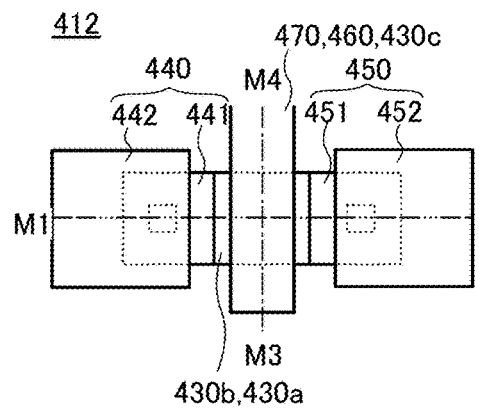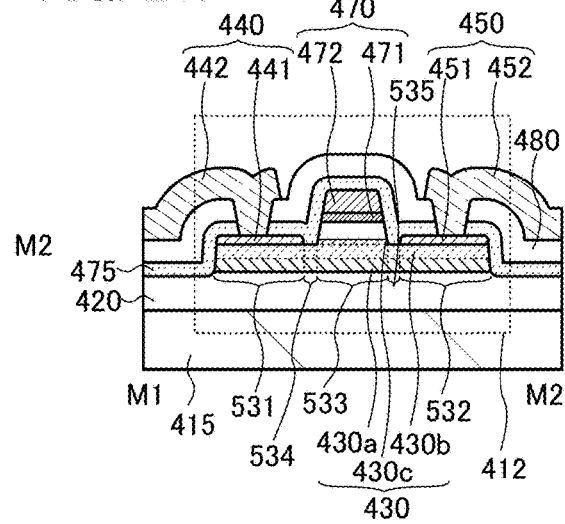

H1  407  415  430b 430a  473  H2
              430c
              430

I1  408  415  430b 430a  473  I2
              430c
              430

J1  409  415  430b 430a  473  J2
              430c
              430

K1  410  415  430b 430a  473  K2
              430c
              430

L1  411  415  430b 430a  473  L2
              430c
              430

M1  412  415  430b 430a  473  M2
              430c
              430

SEMICONDUCTOR DEVICE AND ELECTRONIC DEVICE

TECHNICAL FIELD

One embodiment of the present invention relates to a semiconductor device.

Note that one embodiment of the present invention is not limited to the above technical field. The technical field of one embodiment of the invention disclosed in this specification and the like relates to an object, a method, or a manufacturing method. In addition, one embodiment of the present invention relates to a process, a machine, manufacture, or a composition of matter. Specifically, examples of the technical field of one embodiment of the present invention disclosed in this specification include a semiconductor device, a display device, a liquid crystal display device, a light-emitting device, a lighting device, a power storage device, a memory device, an imaging device, a method for operating any of them, and a method for manufacturing any of them.

In this specification and the like, a semiconductor device generally means a device that can function by utilizing semiconductor characteristics. A transistor and a semiconductor circuit are embodiments of semiconductor devices. In some cases, a memory device, a display device, an imaging device, or an electronic device includes a semiconductor device.

BACKGROUND ART

In recent years, a great number of high-performance semiconductor devices have been developed owing to rapid development of IT. As imaging devices, for example, ultra-high speed image sensors, ultra-high sensitive image sensors, and ultra-high resolution image sensors have been developed.

As a semiconductor material applicable to transistors, an oxide semiconductor has been attracting attention. For example, a technique for forming a transistor using zinc oxide or an In—Ga—Zn-based oxide semiconductor as an oxide semiconductor is disclosed (see Patent Documents 1 and 2).

REFERENCE

Patent Documents

[Patent Document 1] Japanese Published Patent Application No. 2007-123861
[Patent Document 2] Japanese Published Patent Application No. 2007-096055

DISCLOSURE OF INVENTION

The amounts of data used and power consumed by semiconductor devices are increased, and at the same time, reductions in size, thickness, and power consumption of semiconductor devices are required.

An object of one embodiment of the present invention is to provide a semiconductor device with reduced power consumption. Another object is to provide a small semiconductor device. Another object is to provide a semiconductor device suitable for high-speed operation. Another object is to provide a semiconductor device suitable for low-voltage operation. Another object is to provide a semiconductor device including a transistor with a low off-state current. Another object is to provide a semiconductor device that can be used in a wide temperature range. Another object is to provide a highly reliable semiconductor device.

Another object of one embodiment of the present invention is to provide a novel semiconductor device, a novel driving method of a semiconductor device, a novel electronic device, or the like.

Note that the objects of one embodiment of the present invention are not limited to the above objects. The objects described above do not disturb the existence of other objects. The other objects are the ones that are not described above but will be described below. The other objects that are not described above are apparent from and can be derived from the description of the specification, the drawings, and the like by those skilled in the art. One embodiment of the present invention solves at least one of the above objects and the other objects.

One embodiment of the present invention is a semiconductor device including a first circuit, a first wiring, a second wiring, a third wiring, a fourth wiring, a fifth wiring, and a sixth wiring. The first circuit operates in a first mode or a second mode. The first circuit includes a second circuit, a third circuit, a fourth circuit, and a fifth circuit. The fifth circuit includes n sixth circuits, where n is an integer of 2 or more. The second circuit, the third circuit, the fourth circuit, and the fifth circuit are electrically connected to one another by the fifth wiring and the sixth wiring. The second circuit has a function of transferring data in the first wiring to the fifth wiring and data in the second wiring to the sixth wiring in the case where the first circuit operates in the first mode. The second circuit has a function of outputting a signal corresponding to data in the fifth wiring to the third wiring and a signal corresponding to data in the sixth wiring to the fourth wiring in the case where the first circuit operates in the second mode. The third circuit has a function of storing 1-bit image data. The third circuit has a function of writing complementary data stored in the third circuit to the sixth circuits in the case where the first circuit operates in the first mode. The third circuit has a function of amplifying complementary data transferred from the sixth circuits in the case where the first circuit operates in the second mode. The fourth circuit has a function of precharging the fifth wiring and the sixth wiring. The sixth circuits each have a function of retaining 1-bit complementary data written from the third circuit.

The second circuit may include a first transistor, a second transistor, a third transistor, a fourth transistor, a fifth transistor, and a sixth transistor. One of a source and a drain of the first transistor is electrically connected to the first wiring. The other of the source and the drain of the first transistor is electrically connected to the fifth wiring. The other of the source and the drain of the first transistor is electrically connected to a gate of the third transistor. One of a source and a drain of the second transistor is electrically connected to the third wiring. The other of the source and the drain of the second transistor is electrically connected to one of a source and a drain of the third transistor. The other of the source and the drain of the third transistor is electrically connected to one of a source and a drain of the sixth transistor. One of a source and a drain of the fourth transistor is electrically connected to the second wiring. The other of the source and the drain of the fourth transistor is electrically connected to the sixth wiring. The other of the source and the drain of the fourth transistor is electrically connected to a gate of the sixth transistor. One of a source and a drain of the fifth transistor is electrically connected to the fourth wiring.

The other of the source and the drain of the fifth transistor is electrically connected to the other of the source and the drain of the sixth transistor.

The third circuit may include a latch circuit.

The sixth circuits may each include a seventh transistor, an eighth transistor, a first capacitor, and a second capacitor. One of a source and a drain of the seventh transistor is electrically connected to the fifth wiring. The other of the source and the drain of the seventh transistor is electrically connected to one terminal of the first capacitor. One of a source and a drain of the eighth transistor is electrically connected to the sixth wiring. The other of the source and the drain of the eighth transistor is electrically connected to one terminal of the second capacitor. The other terminal of the first capacitor is electrically connected to the other terminal of the second capacitor.

The seventh transistor and the eighth transistor may each include an oxide semiconductor in an active layer. The oxide semiconductor may contain In, Zn, and M, where M is Al, Ti, Ga, Sn, Y, Zr, La, Ce, Nd, or Hf.

The fifth circuit may include a region overlapping with each of the second circuit, the third circuit, and the fourth circuit.

An electronic device including the semiconductor device of one embodiment of the present invention and a display device is also one embodiment of the present invention.

According to one embodiment of the present invention, a semiconductor device with reduced power consumption can be provided. A small semiconductor device can be provided. A semiconductor device suitable for high-speed operation can be provided. A semiconductor device suitable for low-voltage operation can be provided. A semiconductor device including a transistor with a low off-state current can be provided. A semiconductor device that can be used in a wide temperature range can be provided. A highly reliable semiconductor device can be provided.

According to one embodiment of the present invention, a novel semiconductor device, a novel driving method of a semiconductor device, a novel electronic device, or the like can be provided.

Note that the effects of one embodiment of the present invention are not limited to the above effects. The effects described above do not disturb the existence of other effects. The other effects are the ones that are not described above bet will be described below. The other effects that are not described above will be apparent from and can be derived from the description of the specification, the drawings, and the like by those skilled in the art. One embodiment of the present invention has at least one of the above effects and the other effects. Accordingly, one embodiment of the present invention does not have the aforementioned effects in some cases.

BRIEF DESCRIPTION OF DRAWINGS

FIG. 14 is a timing chart illustrating the operation of a line buffer.

FIG. 15 is a timing chart illustrating the operation of a line buffer.

FIGS. 21A to 21F are top views and cross-sectional views illustrating transistors.

BEST MODE FOR CARRYING OUT THE INVENTION

Figure 1:
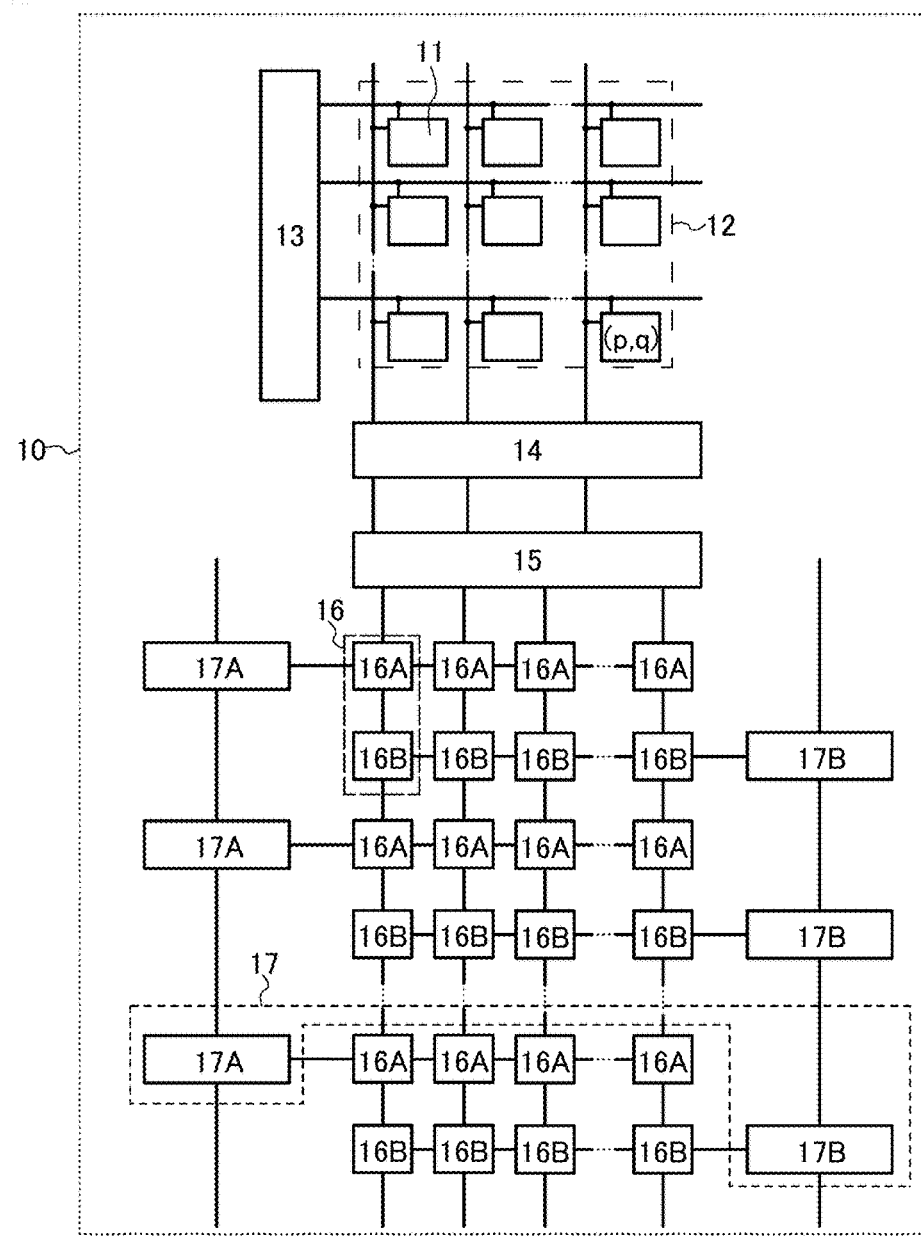
FIGS. 1A and 1B are a block diagram illustrating an imaging device and a timing chart illustrating the operation of a line buffer.

Embodiments are described in detail with reference to drawings. Note that the present invention is not limited to the following description and it is readily appreciated by those skilled in the art that modes and details can be modified in various ways without departing from the spirit and the scope of the present invention. Therefore, the present invention should not be construed as being limited to the description of the embodiments below. Note that in structures of the invention described below, the same portions or portions having similar functions are denoted by the same reference numerals in different drawings, and description thereof is not repeated in some cases. The same components are denoted by different hatching patterns in different drawings, or the hatching patterns are omitted in some cases.

Note that the ordinal numbers such as "first" and "second" in this specification are used for convenience and do not denote the order of steps or the stacking order of layers. Therefore, for example, the term "first" can be replaced with the term "second," "third," or the like as appropriate. In addition, the ordinal numbers in this specification and the like do not correspond to the ordinal numbers that specify one embodiment of the present invention in some cases.

In the drawings, the size, the layer thickness, or the region is exaggerated for clarity in some cases. Therefore, embodiments of the present invention are not limited to such a scale. Note that the drawings are schematic views showing ideal examples, and embodiments of the present invention are not limited to shapes or values shown in the drawings. For example, variations in signal, voltage, or current due to noise or difference in timing can be included.

In this specification and the like, a transistor is an element having at least three terminals: a gate, a drain, and a source. The transistor includes a channel region between the drain (a drain terminal, a drain region, or a drain electrode) and the source (a source terminal, a source region, or a source electrode) and current can flow through the drain, the channel region, and the source.

Since the source and the drain of the transistor change depending on the structure, operating conditions, and the like of the transistor, it is difficult to define which is a source or a drain. Thus, the terms "source" and "drain" can be interchanged with each other depending on the case or circumstances.

In this specification and the like, an explicit description "X and Y are connected" means that X and Y are electrically connected, X and Y are functionally connected, and X and Y are directly connected. Accordingly, without being limited to a predetermined connection relation, for example, a connection relation shown in drawings or text, another connection relation is included in the drawings or the text.

Here, X and Y each denote an object (e.g., a device, an element, a circuit, a wiring, an electrode, a terminal, a conductive film, or a layer).

Examples of the case where X and Y are directly connected include the case where an element that enables electrical connection between X and Y (e.g., a switch, a transistor, a capacitor, an inductor, a resistor, a diode, a display element, a light-emitting element, or a load) is not connected between X and Y, and the case where X and Y are connected without the element that enables electrical connection between X and Y provided therebetween.

For example, in the case where X and Y are electrically connected, one or more elements that enable electrical connection between X and Y (e.g., a switch, a transistor, a capacitor, an inductor, a resistor, a diode, a display element, a light-emitting element, or a load) can be connected between X and Y. Note that the switch is controlled to be turned on or off. That is, a switch is conducting or not conducting (is turned on or off) to determine whether current flows therethrough or not. Alternatively, the switch has a function of selecting and changing a current path. Note that the case where X and Y are electrically connected includes the case where X and Y are directly connected.

For example, in the case where X and Y are functionally connected, one or more circuits that enable functional connection between X and Y (e.g., a logic circuit such as an inverter, a NAND circuit, or a NOR circuit; a signal converter circuit such as a DA converter circuit, an AD converter circuit, or a gamma correction circuit; a potential level converter circuit such as a power supply circuit (e.g., a step-up circuit or a step-down circuit) or a level shifter circuit for changing the potential level of a signal; a voltage source; a current source; a switching circuit; an amplifier circuit such as a circuit capable of increasing signal amplitude, the amount of current, or the like, an operational amplifier, a differential amplifier circuit, a source follower circuit, or a buffer circuit; a signal generation circuit; a memory circuit; and/or a control circuit) can be connected between X and Y. For example, in the case where a signal output from X is transmitted to Y even when another circuit is placed between X and Y, X and Y are functionally connected. Note that the case where X and Y are functionally connected includes the case where X and Y are directly connected and the case where X and Y are electrically connected.

Note that in this specification and the like, an explicit description "X and Y are electrically connected" means that X and Y are electrically connected (i.e., the case where X and Y are connected with another element or another circuit provided therebetween), X and Y are functionally connected (i.e., the case where X and Y are functionally connected with another circuit provided therebetween), and X and Y are directly connected (i.e., the case where X and Y are connected without another element or another circuit provided therebetween). That is, in this specification and the like, the explicit description "X and Y are electrically connected" is the same as the description "X and Y are connected."

For example, any of the following expressions can be used for the case where a source (or a first terminal or the like) of a transistor is electrically connected to X through (or not through) Z1 and a drain (or a second terminal or the like) of the transistor is electrically connected to Y through (or not through) Z2, or the case where a source (or a first terminal or the like) of a transistor is directly connected to one part of Z1 and another part of Z1 is directly connected to X while a drain (or a second terminal or the like) of the transistor is directly connected to one part of Z2 and another part of Z2 is directly connected to Y.

Examples of the expressions include, "X, Y, a source (or a first terminal or the like) of a transistor, and a drain (or a second terminal or the like) of the transistor are electrically connected to each other, and X, the source (or the first terminal or the like) of the transistor, the drain (or the second terminal or the like) of the transistor, and Y are electrically connected to each other in this order," "a source (or a first terminal or the like) of a transistor is electrically connected to X, a drain (or a second terminal or the like) of the transistor is electrically connected to Y, and X, the source (or the first terminal or the like) of the transistor, the drain (or the second terminal or the like) of the transistor, and Y are electrically connected to each other in this order," and "X is electrically connected to Y through a source (or a first terminal or the like) and a drain (or a second terminal or the like) of a transistor, and X, the source (or the first terminal or the like) of the transistor, the drain (or the second terminal or the like) of the transistor, and Y are provided to be connected in this order." When the connection order in a circuit structure is defined by an expression similar to the above examples, a source (or a first terminal or the like) and a drain (or a second terminal or the like) of a transistor can be distinguished from each other to specify the technical scope.

Other examples of the expressions include, "a source (or a first terminal or the like) of a transistor is electrically connected to X through at least a first connection path, the first connection path does not include a second connection path, the second connection path is a path between the source (or the first terminal or the like) of the transistor and a drain (or a second terminal or the like) of the transistor, Z1 is on the first connection path, the drain (or the second terminal or the like) of the transistor is electrically connected to Y through at least a third connection path, the third connection path does not include the second connection path, and Z2 is on the third connection path." Another example of the expression is "a source (or a first terminal or the like) of a transistor is electrically connected to X at least with a first connection path through Z1, the first connection path does not include a second connection path, the second connection path includes a connection path through which the transistor is provided, a drain (or a second terminal or the like) of the transistor is electrically connected to Y at least with a third connection path through Z2, and the third connection path does not include the second connection path." Still another example of the expression is "a source (or a first terminal or the like) of a transistor is electrically connected to X through at least Z1 on a first electrical path, the first electrical path does not include a second electrical path, the second electrical path is an electrical path from the source (or the first terminal or the like) of the transistor to a drain (or a second terminal or the like) of the transistor, the drain (or the second terminal or the like) of the transistor is electrically connected to Y through at least Z2 on a third electrical path, the third electrical path does not include a fourth electrical path, and the fourth electrical path is an electrical path from the drain (or the second terminal or the like) of the transistor to the source (or the first terminal or the like) of the transistor." When the connection path in a circuit configuration is defined by an expression similar to the above examples, a source (or a first terminal or the like) and a drain (or a second terminal or the like) of a transistor can be distinguished from each other to specify the technical scope.

Note that these expressions are examples and there is no limitation on the expressions. Here, X, Y, Z1, and Z2 each denote an object (e.g., a device, an element, a circuit, a wiring, an electrode, a terminal, a conductive film, and a layer).

Even when independent components are electrically connected to each other in a circuit diagram, one component has functions of a plurality of components in some cases. For example, when part of a wiring also functions as an electrode, one conductive film functions as the wiring and the electrode. Thus, "electrical connection" in this specification includes in its category such a case where one conductive film has functions of a plurality of components.

Note that the terms "film" and "layer" can be interchanged with each other depending on the case or circumstances. For example, the term "conductive layer" can be changed into the term "conductive film" in some cases, and the term "insulating layer" can be changed into the term "insulating film" in some cases.

Note that in general, a potential (voltage) is relative and is determined depending on the amount relative to a certain potential. Therefore, even when the expression "ground," "GND," or the like is used, the potential is not necessarily 0 V. For example, the "ground potential" or "GND" may be defined using the lowest potential in a circuit as a reference. Alternatively, the "ground potential" or "GND" may be defined using an intermediate potential in a circuit as a reference. In those cases, a positive potential and a negative potential are set using the potential as a reference.

Note that in this specification, terms for explaining arrangement, such as "over" and "under," are used for convenience to describe the positional relationship between components with reference to drawings. The positional relationship between components is changed as appropriate in accordance with a direction in which each component is described. Thus, there is no limitation on terms used in this specification, and description can be made appropriately depending on the situation.

Embodiment 1

In this embodiment, an imaging device will be described as an example of a semiconductor device.

One embodiment of the present invention relates to a line buffer including a plurality of long-term memories in each working memory. The line buffer has functions of retaining image data output from a pixel included in an imaging device and outputting the retained image data to, for example, a frame memory or the like in a signal processing LSI. The working memory includes a latch circuit and has higher writing and reading speeds than those of a DRAM, a nonvolatile memory, and the like. Each of the long-term memories is a memory including a capacitor and a transistor with an extremely low off-state current, such as a transistor whose active layer or active region is formed using an oxide semiconductor. The memory including a transistor with an extremely low off-state current has a smaller occupation area per bit, that is, larger storage capacity per unit area, than that of the memory including the latch circuit. According to the above, the line buffer including a plurality of long-term memories in each working memory, which is one embodiment of the present invention, can achieve small size and high writing and reading speeds.

<Imaging Device>

FIG. 1A is a block diagram illustrating the configuration of an imaging device 10 of one embodiment of the present invention. The imaging device 10 includes pixels 11, a circuit 13, a circuit 14, a circuit 15, circuits 16, and circuits 17. The pixels 11 are arranged in a matrix of p rows and q columns (p and q are each a natural number) to form a pixel array 12. The circuits 16 are arranged in a matrix, and one circuit 17 is provided for each row of the circuits 16.

The circuits 16 include a circuit 16A and a circuit 16B, and the circuits 17 include a circuit 17A and a circuit 17B. The circuit 17A is electrically connected to the circuit 16A and the circuit 17B is electrically connected to the circuit 16B.

The positional relations of circuit blocks in diagrams are specified for description. Even when a diagram illustrates that different functions are achieved by different circuit blocks, one circuit block may be actually configured to achieve different functions. Furthermore, the functions of circuit blocks in diagrams are specified for description. Even when a diagram illustrates one circuit block performing processing, a plurality of circuit blocks may be actually provided to perform the processing.

The circuit 13 functions as a row driver that selects a row in the pixel array 12. The circuit 14 functions as a column driver that selects a column in the pixel array 12. The circuit 13 selects the pixels 11 from the first row to the p-th row sequentially. In other words, the circuit 13 has a function of scanning the pixels 11 in the horizontal direction.

Any of a variety of circuits, such as a decoder or a shift register, is used for the circuit 13 and the circuit 14.

The circuit 15 functions as an A/D converter circuit and converts analog image data output from the pixels 11 to digital data.

In this specification, the term "image data" means, in some cases, a signal output from a pixel in accordance with the illuminance of light cast on the pixel. When the term "image data" is simply used, it means image data before A/D conversion in some cases and image data after A/D conversion in other cases.

The circuit 16A and the circuit 16B each function as a line buffer that retains digital data. Digital data output from the circuit 15 are written to and retained in the circuit 16A or the circuit 16B and then are read out and output to, for example, a frame memory or the like in a signal processing LSI. Since the digital data output from the circuit 15 are not directly output to the frame memory or the like in the signal processing LSI but are output after being retained in the circuit 16A or the circuit 16B, the digital data can be output from the circuit 15 to the frame memory or the like in the signal processing LSI even when the circuit 15 and the frame memory or the like in the signal processing LSI have different driving speeds, access timing, or the like, for example.

The circuit 17A functions as a control circuit that controls the whole operation of the circuit 16A. The circuit 17B functions as a control circuit that controls the whole operation of the circuit 16B. Note that the specific functions of the circuit 17A and the circuit 17B will be described later in Embodiment 3.

FIG. 1B is a timing chart illustrating the operations of the circuit 13, the circuit 15, the circuit 16A, and the circuit 16B. In Period T1, while the circuit 13 selects the pixels 11 in the N-th row (N is a natural number less than or equal to p), the circuit 15 performs A/D conversion of image data that are output from the pixels 11 in the N-th row. In addition, image data output from the pixels 11 in the (N−1)-th row and A/D converted are written to the circuit 16A. Note that image data output from the pixels 11 in the (N−2)-th row are retained in the circuit 16B, and the image data are read from the circuit 16B.

In Period T2, while the circuit 13 selects the pixels 11 in the (N+1)-th row, the circuit 15 performs A/D conversion of image data that are output from the pixels 11 in the (N+1)-th row and the image data of the pixels 11 in the (N−1)-th row, which have been written to the circuit 16A in Period T1, are read out. In addition, the image data that have been output from the pixels 11 in the N-th row and A/D converted in Period T1 are written to the circuit 16B. In Period T3, while the circuit 13 selects the pixels 11 in the (N+2)-th row, the circuit 15 performs A/D conversion of image data that are output from the pixels 11 in the (N+2)-th row. In addition, the image data that have been output from the pixels 11 in the (N+1)-th row and A/D converted in Period T2 are written to the circuit 16A, and the image data of the pixels 11 in the N-th row, which have been written to the circuit 16B in Period T2, are read out.

With a plurality of line buffers (the circuits 16A and 16B), writing of image data to a line buffer and reading of image data from a line buffer can be performed in parallel as described above. Accordingly, the imaging device 10 with high-speed operation can be provided.

<Line Buffer>

Figure 2:
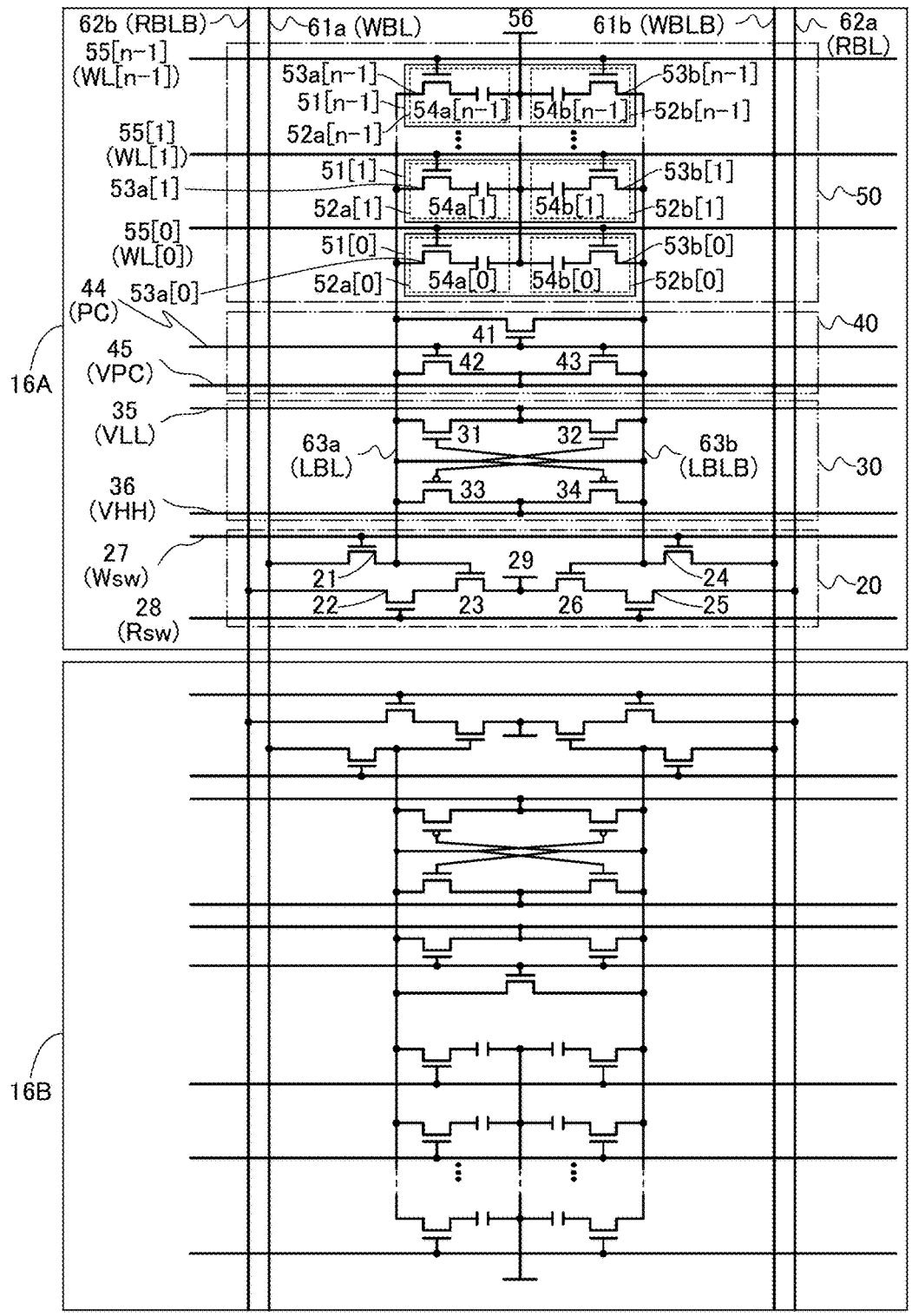
FIG. 2 is a circuit diagram illustrating a line buffer.

FIG. 2 illustrates the circuit configurations of the circuit 16A and the circuit 16B. The circuit 16A includes a circuit 20, a circuit 30, a circuit 40, and a circuit 50. Note that the configuration of the circuit 16B is similar to that of the circuit 16A.

The circuit 16A and the circuit 16B are electrically connected to each other by a wiring 61a (WBL), a wiring 61b (WBLB), a wiring 62a (RBL), and a wiring 62b (RBLB). The circuit 20, the circuit 30, the circuit 40, and the circuit 50 are electrically connected to one another by a wiring 63a (LBL) and a wiring 63b (LBLB).

The circuit 20 functions as a read/write selection switch. The circuit 30 functions as a working memory that stores 1-bit image data temporarily. The circuit 40 functions as a local precharge circuit that precharges the wiring 63a (LBL) and the wiring 63b (LBLB), which are local bit lines. The circuit 50 functions as a long-term memory that retains n-bit (n is an integer of 2 or more) image data.

Note that n can be 8, 16, or 32, for example.

The wiring 61a (WBL), the wiring 61b (WBLB), the wiring 62a (RBL), and the wiring 62b (RBLB) function as global bit lines. The wiring 63a (LBL) and the wiring 63b (LBLB) function as local bit lines. Note that image data to be written to the circuit 16A or the circuit 16B are input to the wiring 61a (WBL) and the wiring 61b (WBLB), and image data read out from the circuit 16A or the circuit 16B are output to the wiring 62a (RBL) and the wiring 62b (RBLB).

As described above, when a global bit line used for writing of image data and a global bit line used for reading of image data are individually provided, writing of image data to the circuit 16A and reading of image data retained in the circuit 16B can be performed in parallel as illustrated in FIG. 1B. In addition, reading of image data retained in the circuit 16A and writing of image data to the circuit 16B can be performed in parallel.

The wiring 61a (WBL) and the wiring 61b (WBLB) are a bit line pair for transmitting complementary data, and the wiring 62a (RBL) and the wiring 62b (RBLB) are a bit line pair for transmitting complementary data. This means that data whose logic is inverted from that of data to be input to the wiring 61a (WBL) are input to the wiring 61b (WBLB), and data whose logic is inverted from that of data to be output to the wiring 62a (RBL) are output to the wiring 62b (RBLB).

<Read/Write Selection Switch>

The circuit 20 includes a transistor 21, a transistor 22, a transistor 23, a transistor 24, a transistor 25, and a transistor 26. Note that the transistors 21 to 26 are all n-channel transistors.

In this specification, in some cases, an n-channel transistor is referred to as an n-ch transistor and a p-channel transistor is referred to as a p-ch transistor.

One of a source and a drain of the transistor 21 is electrically connected to the wiring 61a (WBL). The other of the source and the drain of the transistor 21 is electrically connected to a gate of the transistor 23 and the wiring 63a (LBL). A gate of the transistor 21 is electrically connected to a wiring 27 (Wsw). One of a source and a drain of the transistor 22 is electrically connected to the wiring 62b (RBLB). The other of the source and the drain of the transistor 22 is electrically connected to one of a source and a drain of the transistor 23. A gate of the transistor 22 is electrically connected to a wiring 28 (Rsw). The other of the source and the drain of the transistor 23 is electrically connected to one of a source and a drain of the transistor 26 and a wiring 29.

Note that an L level potential can be applied to the wiring 29, for example.

In this specification, an H level potential and an L level potential refer to a high potential and a low potential, respectively. An L level potential can be, for example, a ground potential.

One of a source and a drain of the transistor 24 is electrically connected to the wiring 61b (WBLB). The other of the source and the drain of the transistor 24 is electrically connected to a gate of the transistor 26 and the wiring 63b (LBLB). A gate of the transistor 24 is electrically connected to the wiring 27 (Wsw). One of a source and a drain of the transistor 25 is electrically connected to the wiring 62a (RBL). The other of the source and the drain of the transistor 25 is electrically connected to the other of the source and the drain of the transistor 26. A gate of the transistor 25 is electrically connected to the wiring 28 (Rsw).

In the case of the writing operation of the circuit 16A, the transistor 21 and the transistor 24 are turned on. As a result, image data in the wiring 61a (WBL) are transferred to the wiring 63a (LBL), and image data in the wiring 61b (WBLB) are transferred to the wiring 63b (LBLB).

In the case of the reading operation of the circuit 16A, the transistor 22 and the transistor 25 are turned on. As a result, an inverted signal of a signal corresponding to image data in the wiring 63a (LBL) is output to the wiring 62b (RBLB), and an inverted signal of a signal corresponding to image data in the wiring 63b (LBLB) is output to the wiring 62a (RBL).

<Working Memory>

The circuit 30 includes a transistor 31, a transistor 32, a transistor 33, and a transistor 34. Note that the transistors 31 and 32 are n-ch transistors and the transistors 33 and 34 are p-ch transistors.

One of a source and a drain of the transistor 31, a gate of the transistor 32, one of a source and a drain of the transistor 33, and a gate of the transistor 34 are electrically connected to the wiring 63a (LBL). A gate of the transistor 31, one of a source and a drain of the transistor 32, a gate of the transistor 33, and one of a source and a drain of the transistor 34 are electrically connected to the wiring 63b (LBLB).

The other of the source and the drain of the transistor 31 is electrically connected to the other of the source and the drain of the transistor 32 and a wiring 35 (VLL). The other of the source and the drain of the transistor 33 is electrically connected to the other of the source and the drain of the transistor 34 and a wiring 36 (VHH).

In such a manner, the transistor 31 and the transistor 33 form an inverter and the transistor 32 and the transistor 34 form an inverter. An input terminal of each of the two inverters is electrically connected to an output terminal of the other inverter, whereby a latch circuit is formed. Accordingly, 1-bit image data can be stored temporarily. The circuit 30 functions as a differential amplifier circuit, so that image data can be amplified and stored.

Since the circuit 30 includes the latch circuit, a data writing speed to the circuit 30 and a data reading speed from the circuit 30 are higher than those in the case of a DRAM, a nonvolatile memory, and the like.

The transistor 31 and the transistor 32 function as driving transistors (pull-down transistors). The transistor 33 and the transistor 34 function as load transistors (pull-up transistors).

The wiring 35 (VLL) and the wiring 36 (VHH) each have a function of supplying a power supply potential to the two inverters. An L level potential and an H level potential can be supplied to the wiring 35 (VLL) and the wiring 36 (VHH), respectively, as power supply potentials, for example.

<Local Precharge Circuit>

The circuit 40 includes a transistor 41, a transistor 42, and a transistor 43. Note that the transistors 41 to 43 are all n-ch transistors.

One of a source and a drain of the transistor 41 and one of a source and a drain of the transistor 42 are electrically connected to the wiring 63a (LBL). The other of the source and the drain of the transistor 41 and one of a source and a drain of the transistor 43 are electrically connected to the wiring 63b (LBLB).

A gate of the transistor 41, a gate of the transistor 42, and a gate of the transistor 43 are electrically connected to a wiring 44 (PC). The other of the source and the drain of the transistor 42 is electrically connected to the other of the source and the drain of the transistor 43 and a wiring 45 (VPC).

The transistor 41 functions as an equalizer that equalizes the potentials of the wiring 63a (LBL) and the wiring 63b (LBLB). The transistor 42 has a function of controlling the precharge operation of the wiring 63a (LBL). The transistor 43 has a function of controlling the precharge operation of the wiring 63b (LBLB).

The wiring 44 (PC) functions as a signal line for supplying a signal used for controlling the precharge operation of the wiring 63a (LBL) and the wiring 63b (LBLB). The wiring 45 (VPC) functions as a power line for supplying a precharge potential.

In the case of precharging the wiring 63a (LBL) and the wiring 63b (LBLB), for example, the potential of the wiring 44 (PC) is set at an H level, so that the transistor 41, the transistor 42, and the transistor 43 are turned on. Accordingly, the potentials of the wiring 63a (LBL) and the wiring 63b (LBLB) can each be a precharge potential, which is the potential of the wiring 45 (VPC).

The precharge potential can be "VDD/2," for example. Note that when an H level potential is "VHH" and an L level potential is "VLL," "VDD" can be defined by "VHH+VLL." When the L level potential is a ground potential, "VDD" is an H level potential.

<Long-Term Memory>

The circuit 50 includes n circuits 51. Each circuit 51 includes one circuit 52a and one circuit 52b. The circuit 52a includes a transistor 53a and a capacitor 54a. The circuit 52b includes a transistor 53b and a capacitor 54b. Although the transistor 53a and the transistor 53b are n-ch transistors in FIG. 2, they can be p-ch transistors.

According to the above, the circuit 50 includes n circuits 51, n circuits 52a, n circuits 52b, n transistors 53a, n transistors 53b, n capacitors 54a, and n capacitors 54b.

One of a source and a drain of each transistor 53a is electrically connected to one terminal of the corresponding capacitor 54a. The other of the source and the drain of each of the n transistors 53a is electrically connected to the wiring 63a (LBL).

One of a source and a drain of each transistor 53b is electrically connected to the other terminal of the corresponding capacitor 54b. The other of the source and the drain of each of the n transistors 53b is electrically connected to the wiring 63b (LBLB).

A gate of one transistor 53a and a gate of one transistor 53b are electrically connected to one wiring 55 (WL). In other words, there are n wirings 55 (WL), and gates of n transistors 53a and gates of n transistors 53b are electrically connected to their respective wirings 55 (WL).

The other terminal of each of the n capacitors 54a and one terminal of each of the n capacitors 54b are electrically connected to one wiring 56. Note that an L level potential can be applied to the wiring 56, for example.

Note that n circuits 51, n circuits 52a, n circuits 52b, n transistors 53a, n transistors 53b, n capacitors 54a, n capacitors 54b, and n wirings 55 (WL) are distinguished from one another by symbols such as "[0]," "[1]," and "[n−1]."

The circuit 52a has a function of retaining image data transferred from the wiring 63a (LBL), and the circuit 52b has a function of retaining image data transferred from the wiring 63b (LBLB). In other words, the circuit 51 has a function of retaining 1-bit complementary data.

The wiring 55 (WL) functions as a word line. In other words, the wiring 55 (WL) has a function of selecting which circuit 51 to use for writing operation or reading operation.

Note that a reduction in the off-state current of the transistor 53a and the transistor 53b can extend the retention time of the circuit 51. Here, off-state current refers to current that flows between a source and a drain of a transistor in an off state. In the case of an n-channel transistor, for example, when a threshold voltage is approximately 0 V to 2 V, current flowing between a source and a drain when a voltage between a gate and the source is negative can be referred to as off-state current. An extremely low off-state current means that, for example, an off-state current per micrometer of a channel width is lower than or equal to 100 zA (zeptoamperes). Since the off-state current is preferably as low as possible, the normalized off-state current is preferably lower than or equal to 10 zA/μm or lower than or equal to 1 zA/μm, and further preferably lower than or equal to 10 yA/μm (yA: yoctoamperes). Note that 1 zA is $1×10^{−21}$ A and 1 yA is $1×10^{−24}$ A.

To obtain such an extremely low off-state current, a channel formation region of the transistor is formed using a semiconductor with a wide band gap. An example of such a semiconductor is an oxide semiconductor. An oxide semiconductor has a band gap of 3.0 eV or more; thus, a transistor whose active layer or active region is formed using an oxide semiconductor (hereinafter, such a transistor is referred to as an OS transistor) has a low leakage current caused by thermal excitation and thus has an extremely low off-state current. A channel formation region of an OS transistor is preferably formed using an oxide semiconductor containing at least one of indium (In) and zinc (Zn). Typical examples of such an oxide semiconductor include an In-M-Zn oxide (the element M is Al, Ga, Y, or Sn, for example). A reduction in impurities serving as electron donors, such as moisture or hydrogen and a reduction in oxygen vacancies can make an oxide semiconductor i-type (intrinsic) or substantially i-type. Here, such an oxide semiconductor can be referred to as a highly purified oxide semiconductor. With the use of a highly purified oxide semiconductor, the off-state current of the OS transistor which is normalized by the channel width can be as low as several yoctoamperes per micrometer to several zeptoamperes per micrometer.

The use of OS transistors as the transistor 53a and the transistor 53b can extend the retention time of the circuit 51, in which case the circuit 51 can be used as a nonvolatile memory circuit. As a result, data can be retained in the circuit 51 for a long time even with an extremely low frequency of refresh operation or the like or even without refresh operation or the like, leading to a reduction in power consumption. Moreover, since an OS transistor has small temperature dependence of off-state current characteristics, a normalized off-state current of the OS transistor can be less than or equal to 100 zA even at high temperatures (e.g., 100° C. or higher). Thus, when the OS transistor is applied to the circuit 51, data can be retained even in an environment at high temperatures without being lost, which results in providing the imaging device 10 with high reliability even in an environment at high temperatures.

One circuit 51 including two transistors and two capacitors can retain 1-bit complementary data. Thus, the circuit 51 has a smaller occupation area per bit, that is, larger storage capacity per unit area, than that of the circuit 30 including a latch circuit.

The circuit 16, which is a line buffer of one embodiment of the present invention, includes the circuit 30 and the circuit 51; the circuit 30 is a memory having higher writing and reading speeds than those of a DRAM, a nonvolatile memory, and the like, and the circuit 51 has larger storage capacity per unit area than that of the circuit 30. According to the above, the circuit 16 can be a small line buffer that can perform writing operation and reading operation at high speed.

Note that a memory that can be used as the circuit 50 does not necessarily include an OS transistor. For example, a nonvolatile memory not including an OS transistor can be used as the circuit 50.

Figure 3:
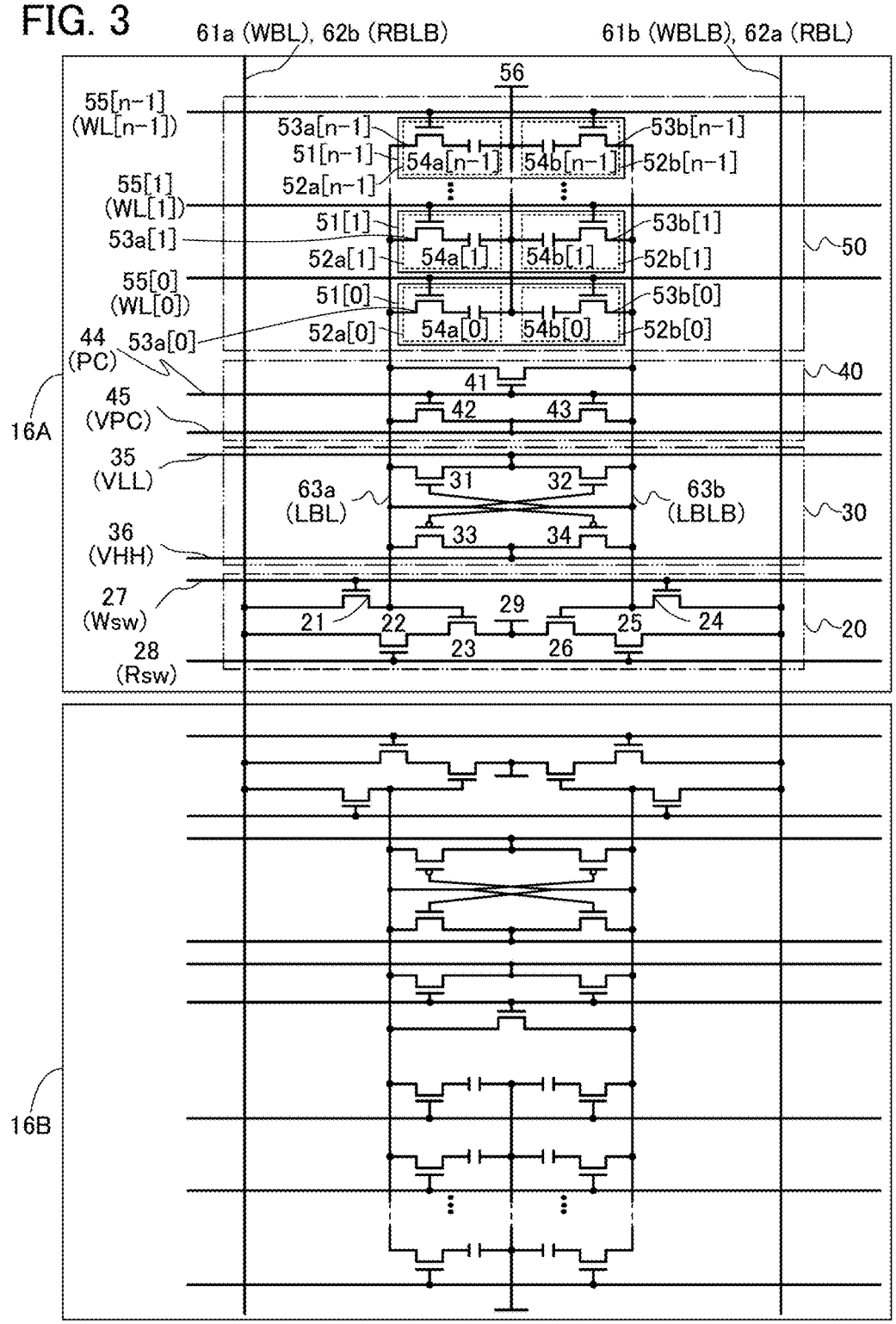
FIG. 3 is a circuit diagram illustrating a line buffer.

In the case where the circuit 16 does not concurrently perform writing operation and reading operation, one wiring can serve as the wirings 61a (WBL) and 62b (RBLB) and another wiring can serve as the wirings 61b (WBLB) and 62a (RBL) as illustrated in FIG. 3. With such a configuration, the number of wirings included in the imaging device 10 can be reduced, leading to a reduction in the size of the imaging device 10.

Alternatively, different wirings can be used as the wiring 61b (WBLB) and the wiring 62a (RBL) while one wiring is used as the wiring 61a (WBL) and the wiring 62b (RBLB), or different wirings can be used as the wiring 61a (WBL) and the wiring 62b (RBLB) while one wiring is used as the wiring 61b (WBLB) and the wiring 62a (RBL), for example.

Further alternatively, a wiring functioning as a global bit line can be provided in addition to the wiring 61a (WBL), the wiring 61b (WBLB), the wiring 62a (RBL), and the wiring 62b (RBLB).

<Device Configuration>

In the imaging device 10, the transistor 53a and the transistor 53b included in the circuit 50 can be OS transistors and other transistors can each be, for example, a transistor whose active layer or active region is formed using silicon (hereinafter, such a transistor is referred to as an Si transistor). In that case, the circuit 50 can be formed over a region where the circuit 20, the circuit 30, and the circuit 40 are formed, as in the device configuration example of the circuit 16A illustrated in FIG. 4. With such a layered structure, the imaging device 10 can be reduced in size. In addition, the capacity of the circuit 16A can be increased.

Furthermore, the channel lengths and channel widths of the transistors included in the circuit 30 can be increased, in which case a variation in the threshold voltage of the transistors included in the circuit 30 can be reduced. As a result, a static noise margin (SNM) can be increased, leading to low voltage operation.

Figure 4:
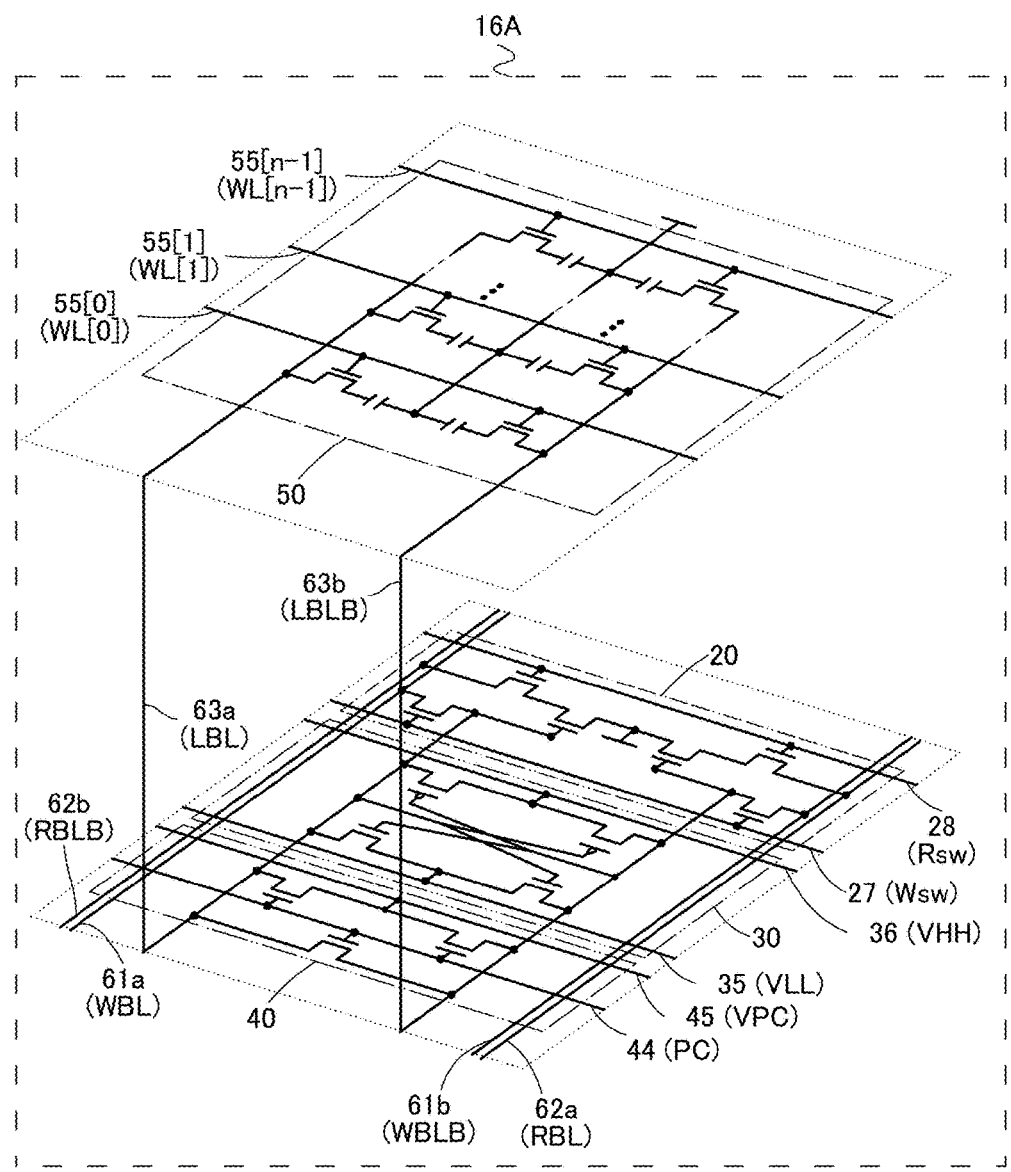
FIG. 4 is a circuit diagram schematically illustrating the device configuration of a line buffer.

Although the circuit 16A has a two-tier structure of a tier including an Si transistor (hereinafter referred to as an Si tier) and a tier including an OS transistor (hereinafter referred to as an OS tier) in FIG. 4, the structure is not limited thereto. For example, two or three or more OS tiers may be provided. An increase in the number of stacked tiers can further reduce the size of the imaging device 10 and increase the capacity of the circuit 16A as compared with the case in FIG. 4.

Note that the circuit 16B can have a device configuration similar to that of the circuit 16A. The Si tier of the circuit 16A and the Si tier of the circuit 16B can be provided in the same tier. The OS tier of the circuit 16A and the OS tier of the circuit 16B can be provided in the same tier.

Operation Examples

Next, the writing operation and reading operation of the circuit 16A will be described in detail with reference to timing charts in FIG. 5 and FIG. 6. The timing charts each shows the potentials of the wiring 27 (Wsw), the wiring 28 (Rsw), the wiring 35 (VLL), the wiring 36 (VHH), the wiring 44 (PC), the wiring 55 (WL), the wiring 61a (WBL), the wiring 61b (WBLB), the wiring 63a (LBL), and the wiring 63b (LBLB). Note that the writing operation and reading operation of the circuit 16B are similar to those of the circuit 16A.

Figure 5:
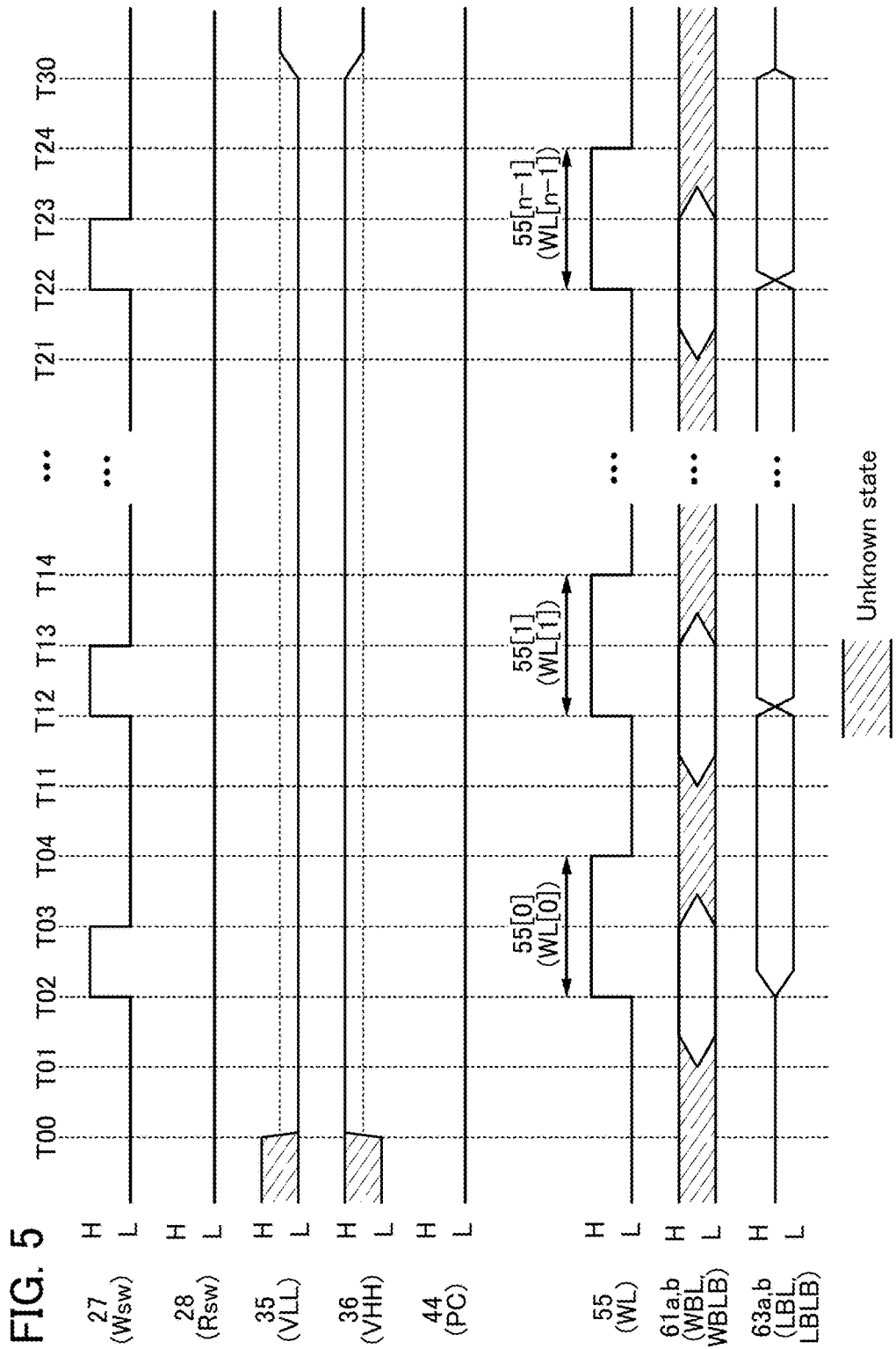
FIG. 5 is a timing chart illustrating the operation of a line buffer.

FIG. 5 is a timing chart illustrating the writing operation of the circuit 16A. At Time T00, the potential of the wiring 35 (VLL) is set at an L level and the potential of the wiring 36 (VHH) is set at an H level to make the circuit 30 active. In this state, the circuit 16A can perform writing operation.

At Time T01, image data that are A/D converted by the circuit 15 are transferred to the wiring 61a (WBL) and the wiring 61b (WBLB).

At Time T02, the potential of the wiring 27 (Wsw) is set at an H level to turn on the transistor 21 and the transistor 24. As a result, image data are transferred from the wiring 61a (WBL) to the wiring 63a (LBL) and from the wiring 61b (WBLB) to the wiring 63b (LBLB), and are written to the circuit 30. In addition, the potential of the wiring 55[0] (WL[0]) is set at an H level to turn on the transistor 53a[0] and the transistor 53b[0]. As a result, image data written to the circuit 30 are written to the capacitor 54a[0] through the transistor 53a[0] and to the capacitor 54b[0] through the transistor 53b[0].

Note that data written to the capacitor 54b[0] are data whose logic is inverted from that of image data written to the capacitor 54a[0]. In other words, the capacitor 54a[0] and the capacitor 54b[0] can retain 1-bit complementary data.

At Time T03, the potential of the wiring 27 (Wsw) is set at an L level to turn off the transistor 21 and the transistor 24. As a result, electrical connections between the wirings 61a (WBL) and 63a (LBL) and between the wirings 61b (WBLB) and 63b (LBLB) are broken; thus, image data written to the circuit 30 can be independent of the wiring 61a (WBL) and the wiring 61b (WBLB).

At Time T04, the wiring 55[0] (WL[0]) is set at an L level to turn off the transistor 53a[0] and the transistor 53b[0]. During a period in which the transistor 53a[0] and the transistor 53b[0] are on (from Time T02 to Time T04), image data from the circuit 30 are kept written to the capacitor 54a[0] and the capacitor 54b[0].

From Time T11 to Time T14, new image data are written to the capacitor 54a[1] and the capacitor 54b[1]. At Time T12, the potential of the wiring 55[1] (WL[1]) is set at an H level to turn on the transistor 53a[1] and the transistor 53b[1]. At Time T14, the potential of the wiring 55[1] (WL[1]) is set at an L level to turn off the transistor 53a[1] and the transistor 53b[1]. Other operations are similar to those performed from Time T01 to Time T04.

In such a manner, image data writing is performed sequentially from the capacitors 54a[0] and 54b[0] to the capacitors 54a[n-1] and 54b[n-1]. From Time T21 to Time T24, image data are written to the capacitor 54a[n-1] and the capacitor 54b[n-1]. At Time T22, the potential of the wiring 55[n-1] (WL[n-1]) is set at an H level to turn on the transistor 53a[n-1] and the transistor 53b[n-1]. At Time T24, the potential of the wiring 55[n-1] (WL[n-1]) is set at an L level to turn off the transistor 53a[n-1] and the transistor 53b[n-1]. Other operations are similar to those performed from Time T01 to Time T04.

At Time T30, the potentials of the wiring 35 (VLL) and the wiring 36 (VHH) are set to "VDD/2." Thus, the circuit 30 becomes inactive and the writing operation is completed. Note that the potentials of the wiring 35 (VLL) and the wiring 36 (VHH) can be controlled in synchronization with the potential of the wiring 55 (WL).

Figure 6:
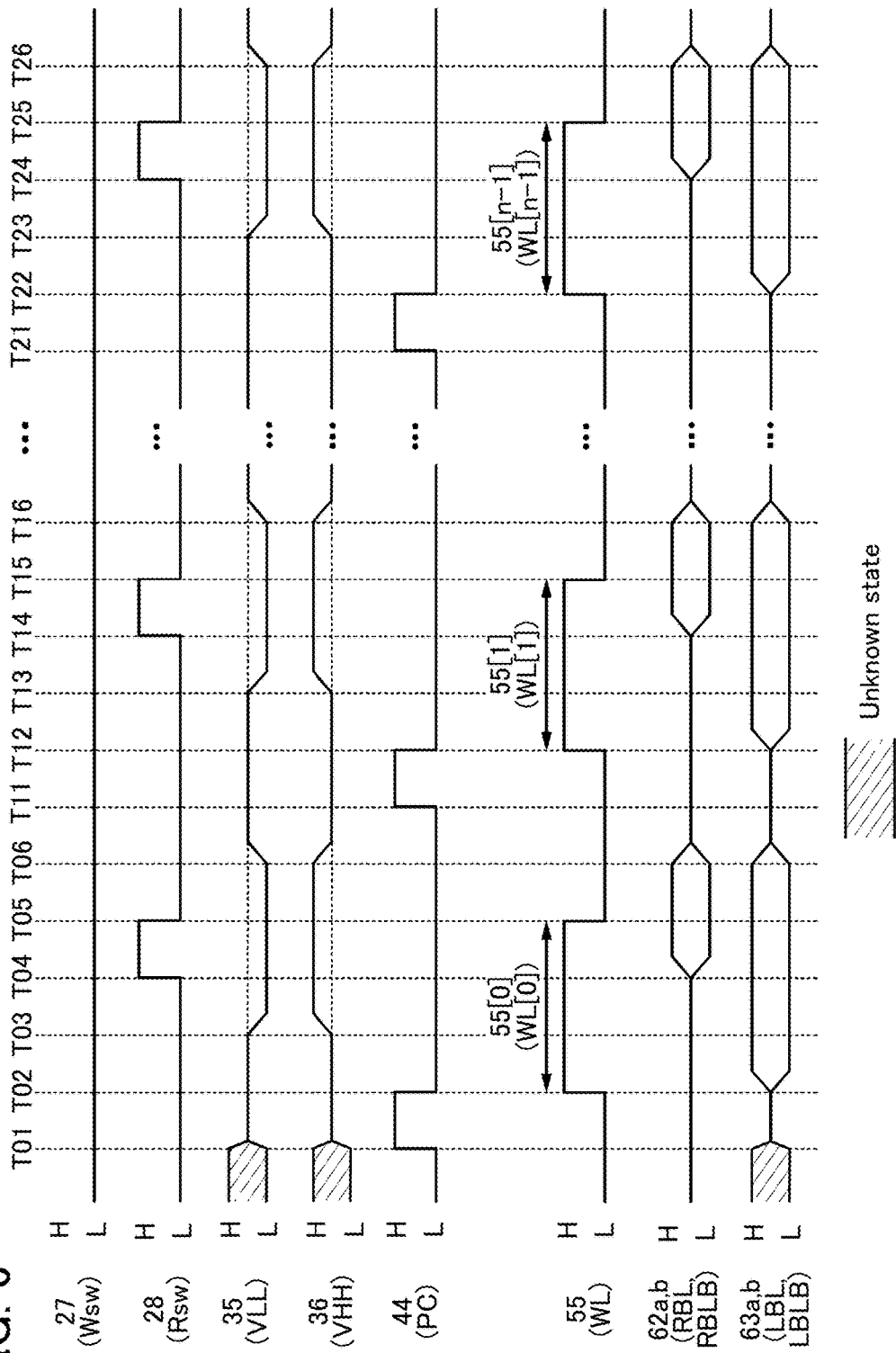
FIG. 6 is a timing chart illustrating the operation of a line buffer.

FIG. 6 is a timing chart illustrating the reading operation of the circuit 16A. Image data retained in the capacitors 54a[0] to 54a[n-1] and the capacitors 54b[0] to 54b[n-1] through the writing operation illustrated in FIG. 5 are read out and output to the outside.

At Time T01, the potentials of the wiring 35 (VLL) and the wiring 36 (VHH) are set to "VDD/2" to make the circuit 30 inactive. In addition, the potential of the wiring 45 (VPC) is set to "VDD/2" and the potential of the wiring 44 (PC) is set at an H level to turn on the transistors 41, 42, and 43, whereby the wiring 63a (LBL) and the wiring 63b (LBLB) are precharged to a potential "VDD/2." In this state, the circuit 16A can perform reading operation. Note that the potential of the wiring 45 (VPC) is not shown in FIG. 6.

At Time T02, the potential of the wiring 44 (PC) is set at an L level to turn off the transistor 41, the transistor 42, and the transistor 43. Furthermore, the potential of the wiring 55[0] (WL[0]) is set at an H level to turn on the transistor 53a[0] and the transistor 53b[0]. Accordingly, image data retained in the capacitor 54a[0] and image data retained in the capacitor 54b[0] are transferred to the wiring 63a (LBL) and the wiring 63b (LBLB), respectively, and then transferred to the circuit 30. In other words, 1-bit complementary data retained in the capacitor 54a[0] and the capacitor 54b[0] are transferred to the circuit 30.

At Time T03, the potential of the wiring 35 (VLL) is set at an L level and the potential of the wiring 36 (VHH) is set at an H level to make the circuit 30 active. Since image data transferred to the circuit 30 are complementary data, the circuit 30 functions as a differential amplifier circuit and amplifies the image data. Thus, the reading operation can be performed with high reliability even when the potential difference between image data retained in the capacitor 54a[0] and image data retained in the capacitor 54b[0] is small. In addition, the reading operation can be performed at high speed.

At Time T04, the potential of the wiring 28 (Rsw) is set at an H level to turn on the transistor 22 and the transistor 25. As a result, an inverted signal of a signal that corresponds to image data transferred to the circuit 30 is output to the wiring 62a (RBL) and the wiring 62b (RBLB), and image data are read out.

From Time T03 to Time T05, image data amplified by the circuit 30 are rewritten to the capacitor 54a[0] and the capacitor 54b[0]. Accordingly, image data can be kept retained in the capacitor 54a[0] and the capacitor 54b[0] even after image data are read out from the circuit 30.

At Time T05, the potentials of the wiring 28 (Rsw) and the wiring 55[0] (WL[0]) are set at an L level to turn off the transistor 22, the transistor 25, the transistor 53a[0], and the transistor 53b[0]. At Time T06, the potentials of the wiring 35 (VLL) and the wiring 36 (VHH) are set to "VDD/2" to make the circuit 30 inactive.

From Time T11 to Time T16, image data retained in the capacitor 54a[1] and the capacitor 54b[1] are read out. At Time T12, the potential of the wiring 55[1] (WL[1]) is set at an H level to turn on the transistor 53a[1] and the transistor 53b[1]. At Time T15, the potential of the wiring 55[1] (WL[1]) is set at an L level to turn off the transistor 53a[1] and the transistor 53b[1]. Other operations are similar to those performed from Time T01 to Time T06.

In such a manner, image data reading is performed sequentially from the capacitors 54a[0] and 54b[0] to the capacitors 54a[n−1] and 54b[n−1]. From Time T21 to Time T26, image data retained in the capacitor 54a[n−1] and the capacitor 54b[n−1] are read out. At Time T22, the potential of the wiring 55[n−1] (WL[n−1]) is set at an H level to turn on the transistor 53a[n−1] and the transistor 53b[n−1]. At Time T25, the potential of the wiring 55[n−1](WL[n−1]) is set at an L level to turn off the transistor 53a[n−1] and the transistor 53b[n−1]. Other operations are similar to those performed from Time T01 to Time T06.

In the writing operation and reading operation illustrated in FIG. 5 and FIG. 6, image data written to the capacitors 54a[0] to 54a[n−1] and the capacitors 54b[0] to 54b[n−1] are retained without power consumption while the transistors 53a[0] to 53a[n−1] and the transistors 53b[0] to 53b[n−1] are off. Thus, the imaging device 10 with low power consumption can be provided.

<Potential Generation Circuit>

Figure 7A:
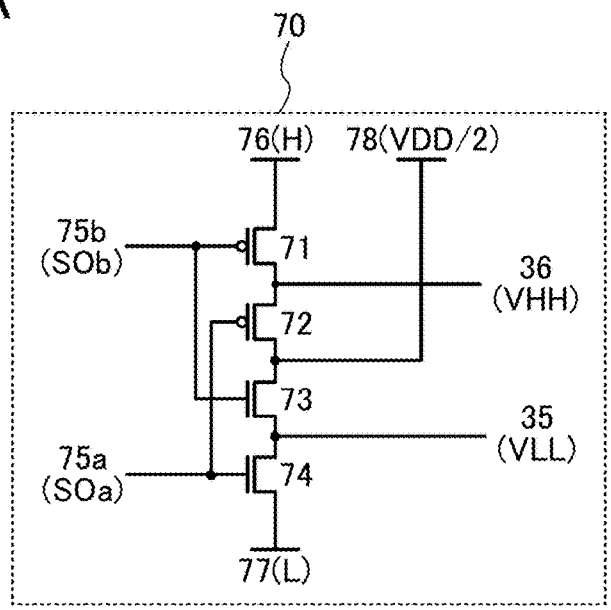
FIGS. 7A and 7B are a circuit diagram and a timing chart each illustrating a potential generation circuit.

FIG. 7A illustrates a configuration example of a circuit 70 for generating potentials applied to the wirings 36 (VHH) and 35 (VLL). The circuit 70 includes a transistor 71, a transistor 72, a transistor 73, and a transistor 74. Note that the transistor 71 and the transistor 72 are p-ch transistors and the transistor 73 and the transistor 74 are n-ch transistors.

One of a source and a drain of the transistor 71 is electrically connected to one of a source and a drain of the transistor 72 and the wiring 36 (VHH). The other of the source and the drain of the transistor 71 is electrically connected to a wiring 76 (H). The other of the source and the drain of the transistor 72 is electrically connected to one of a source and a drain of the transistor 73 and a wiring 78 (VDD/2). The other of the source and the drain of the transistor 73 is electrically connected to one of a source and a drain of the transistor 74 and the wiring 35 (VLL). The other of the source and the drain of the transistor 74 is electrically connected to a wiring 77 (L).

Note that an H level potential can be applied to the wiring 76 (H), an L level potential can be applied to the wiring 77 (L), and a potential VDD/2 can be applied to the wiring 78 (VDD/2), for example.

Gates of the transistors 72 and 74 are electrically connected to a wiring 75a (SOa), and gates of the transistors 71 and 73 are electrically connected to a wiring 75b (SOb).

In the case where an H level potential is applied to the wiring 75a (SOa), an L level potential can be applied to the wiring 75b (SOb). In that case, the potential of the wiring 36 (VHH) becomes the potential of the wiring 76 (H) (e.g., an H level), and the potential of the wiring 35 (VLL) becomes the potential of the wiring 77 (L) (e.g., an L level). This means that the circuit 30 becomes active. In the case where an L level potential is applied to the wiring 75a (SOa), an H level potential can be applied to the wiring 75b (SOb). In that case, the potentials of the wirings 36 (VHH) and 35 (VLL) each become the potential of the wiring 78 (VDD/2). This means that the circuit 30 becomes inactive.

In the reading operation illustrated in FIG. 6, potentials applied to the wiring 36 (VHH) and the wiring 35 (VLL) are changed in timing when image data are transferred between the circuit 30 and the circuit 50. The potentials applied to the wiring 36 (VHH) and the wiring 35 (VLL) are preferably changed in timing when the potential of the selected wiring 55 (WL) becomes an H level or an L level. As a result, the circuit 30 can be inactive for as long period as possible without reducing the response speed of the imaging device 10. Thus, the imaging device 10 with low power consumption can be provided.

Potentials applied to the wiring 36 (VHH) and the wiring 35 (VLL) can be changed in timing when image data are transferred between the circuit 30 and the circuit 50 also in the writing operation illustrated in FIG. 5. Accordingly, power consumption of the imaging device 10 can be further reduced.

Figure 7B:
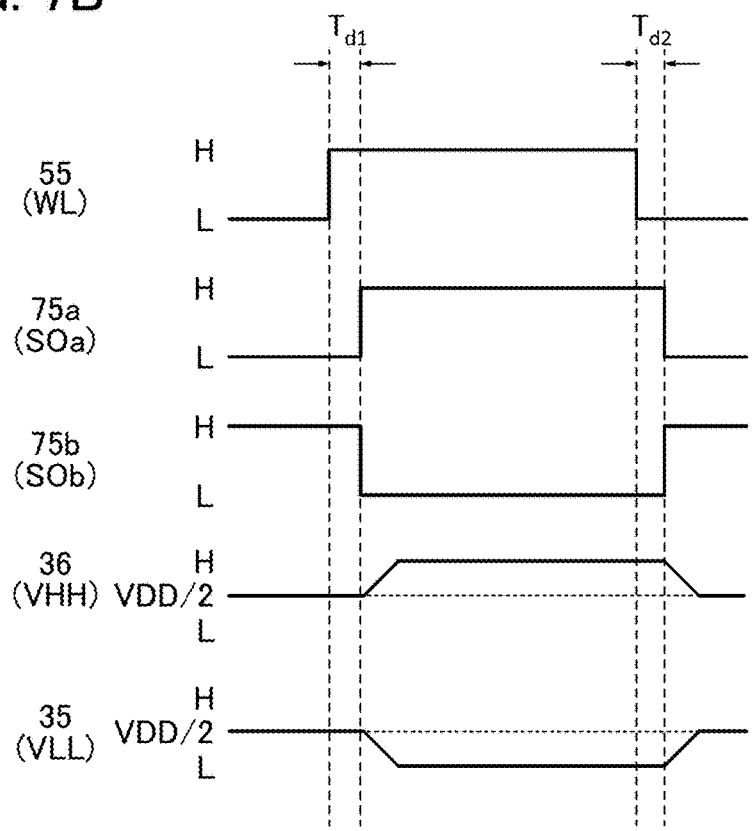

FIG. 7B is a timing chart illustrating an operation example of the circuit 70. The timing chart shows the potentials of the wiring 55 (WL), the wiring 75a (SOa), the wiring 75b (SOb), the wiring 36 (VHH), and the wiring 35 (VLL). Note that "the potential of the wiring 55 (WL) is at an H level" means that an H level potential is applied to one of the wirings 55[0](WL[0]) to 55[n−1] (WL[n−1]), and "the potential of the wiring 55 (WL) is at an L level" means that an L level potential is applied to all of the wirings 55[0] (WL[0]) to 55[n−1] (WL[n−1]).

The timing when the potential of the wiring 75a (SOa) becomes an H level is Time $T_{d1}$ after the timing when the potential of the wiring 55 (WL) becomes an H level. The timing when the potential of the wiring 75a (SOa) becomes an L level is Time $T_{d2}$ after the timing when the potential of the wiring 55 (WL) becomes an L level. Time $T_{d1}$ and Time $T_{d2}$ may be the same or different from each other.

The operation of the circuit 70 in the above manner allows the circuit 30 to be active immediately after any one of n circuits 51 included in the circuit 50 is selected and to be inactive immediately after all of the n circuits 51 included in the circuit 50 are unselected.

This embodiment can be applied not only to imaging devices but also to other semiconductor devices. For example, this embodiment can be applied to memory devices.

In this embodiment, one embodiment of the present invention has been described. Other embodiments of the present invention are described in the other embodiments. Note that one embodiment of the present invention is not limited to them. That is, since various embodiments of the present invention are disclosed in this embodiment and the other embodiments, one embodiment of the present invention is not limited to a specific embodiment. Although an example in which a channel formation region, a source region, a drain region, or the like of a transistor includes an oxide semiconductor is described as one embodiment of the present invention, one embodiment of the present invention is not limited thereto. Depending on circumstances or conditions, various transistors or a channel formation region, a source region, a drain region, or the like of a transistor in one embodiment of the present invention may include various semiconductors. Depending on circumstances or conditions, various transistors or a channel formation region, a source region, a drain region, or the like of a transistor in one embodiment of the present invention may include, for example, at least one of silicon, germanium, silicon germanium, silicon carbide, gallium arsenide, aluminum gallium arsenide, indium phosphide, gallium nitride, and an organic semiconductor. Alternatively, for example, depending on circumstances or conditions, various transistors or a channel formation region, a source region, a drain region, or the like of a transistor in one embodiment of the present invention does not necessarily include an oxide semiconductor.

This embodiment can be implemented in an appropriate combination with any of the structures described in the other embodiments.

Embodiment 2

In this embodiment, modification examples of the circuit 20, the circuit 40, and the circuit 50 described in Embodiment 1 will be described with reference to drawings.

<Read/Write Selection Switch>

Figure 8A:
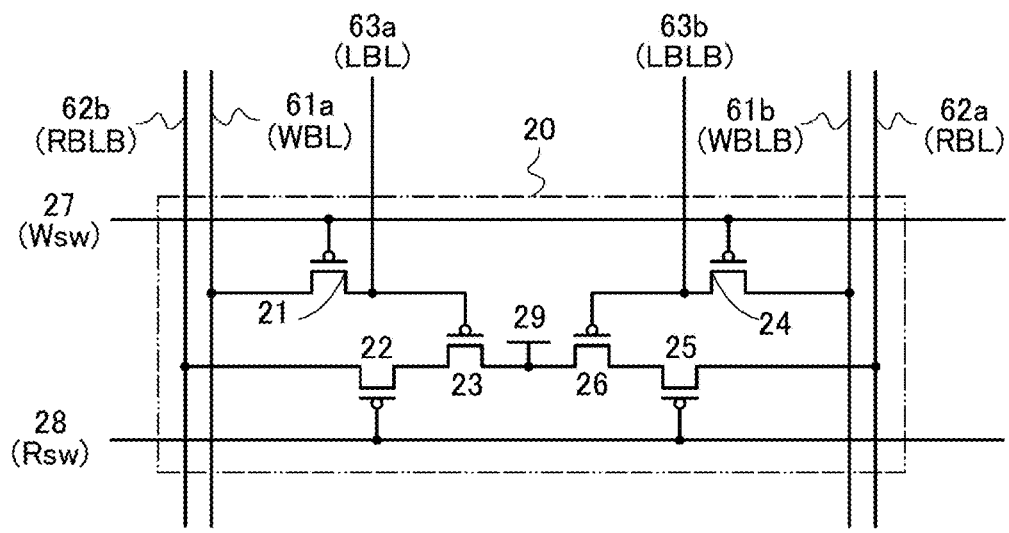
FIGS. 8A and 8B are circuit diagrams each illustrating a line buffer.

FIG. 8A illustrates a configuration in which the transistors 21 to 26 included in the circuit 20 illustrated in FIG. 2 are p-ch transistors. FIG. 5 and FIG. 6 can be referred to for the operation as long as the magnitude relationships of potentials applied to the wirings 27 (Wsw), the wiring 28 (Rsw), and the wiring 29 are reversed as necessary, for example. Note that only some of the transistors 21 to 26 may be p-ch transistors.

Figure 8B:
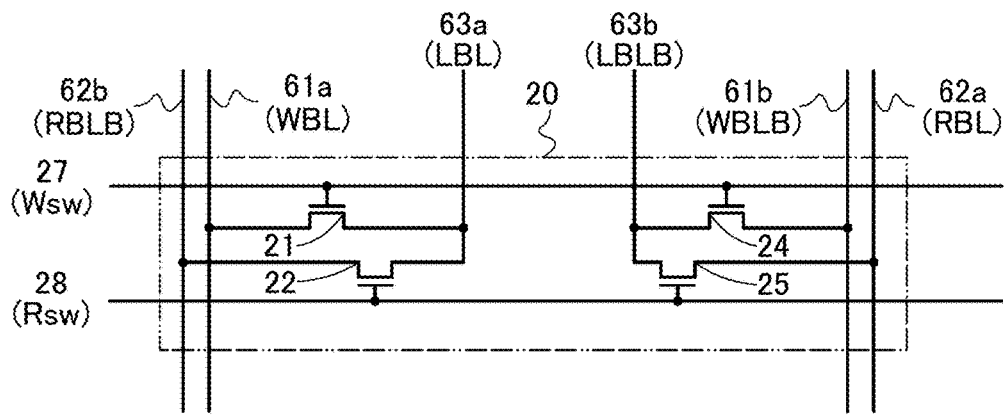

FIG. 8B illustrates the circuit 20 illustrated in FIG. 2 excluding the transistor 23 and the transistor 26. With such a configuration, the number of transistors in the imaging device 10 can be reduced, leading to a reduction in the size of the imaging device 10. Meanwhile, loads on the wiring 63a (LBL) and the wiring 63b (LBLB) in the reading operation are smaller in the circuit 20 illustrated in FIG. 2 than in the circuit 20 illustrated in FIG. 8B; thus, reading speed can be higher in the circuit 20 illustrated in FIG. 2.

<Local Precharge Circuit>

Figure 9A:
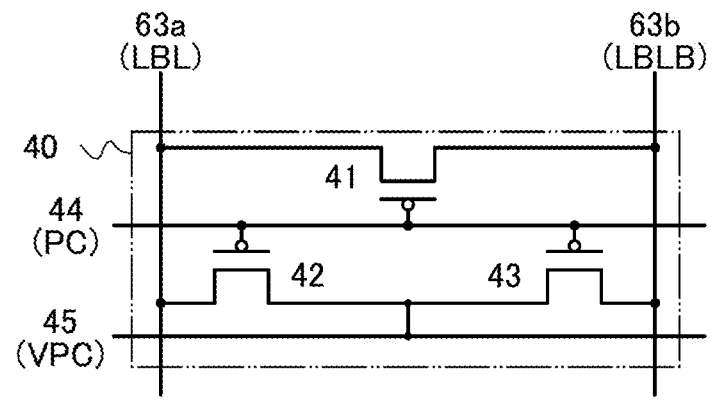
FIGS. 9A to 9C are circuit diagrams each illustrating a line buffer.

FIG. 9A illustrates a configuration in which the transistors 41 to 43 included in the circuit 40 illustrated in FIG. 2 are p-ch transistors. FIG. 5 and FIG. 6 can be referred to for the operation as long as the magnitude relationships of potentials applied to the wiring 44 (PC) and the wiring 45 (VPC) are reversed as necessary, for example. Note that only some of the transistors 41 to 43 may be p-ch transistors.

Figure 9B:
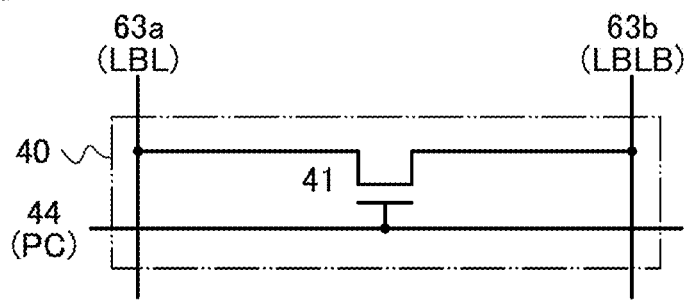

FIG. 9B illustrates the circuit 40 illustrated in FIG. 2 excluding the transistor 42 and the transistor 43. This means that the circuit 40 can be an equalizer with a simple circuit including only the transistor 41. Note that the wiring 63a (LBL) and the wiring 63b (LBLB) are not precharged.

Figure 9C:
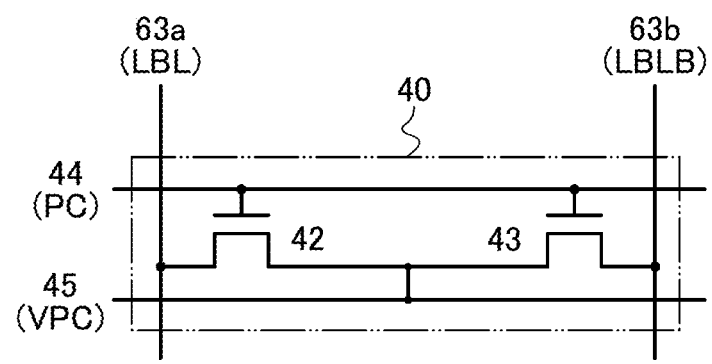

FIG. 9C illustrates the circuit 40 illustrated in FIG. 2 excluding the transistor 41. This means that the transistor 41 functioning as an equalizer can be omitted.

In the circuit 40 with a configuration illustrated in FIG. 9B or FIG. 9C, the number of transistors included in the imaging device 10 can be reduced. Accordingly, the imaging device 10 can be reduced in size.

<Long-Term Memory>

Figure 10:
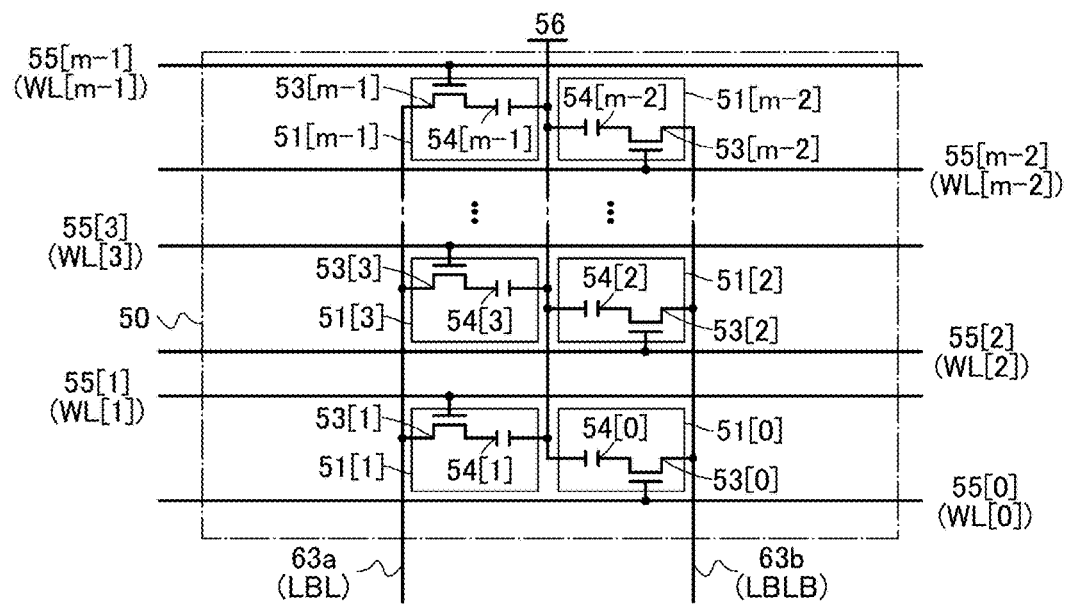
FIG. 10 is a circuit diagram illustrating a line buffer.

Although the circuit 50 illustrated in FIG. 2 has a configuration in which the circuit 51 includes the circuit 52a and the circuit 52b, the circuit 51 may include one of circuits corresponding to the circuits 52a and 52b as illustrated in FIG. 10.

The circuit 51 includes a transistor 53 and a capacitor 54. That is, in the case where the circuit 50 includes m circuits 51 (m is an integer of 2 or more), the circuit 50 includes m transistors 53 and m capacitors 54. Note that although the transistor 53 is an n-ch transistor in FIG. 10, the transistor 53 can be a p-ch transistor.

One of a source and a drain of each transistor 53 is electrically connected to one terminal of the corresponding capacitor 54. The other of the source and the drain of each of the m transistors 53 is electrically connected to the wiring 63a (LBL) or the wiring 63b (LBLB) functioning as a local bit line. The other terminal of each of the m capacitors 54 is electrically connected to the wiring 56.

A gate of each transistor 53 is electrically connected to the corresponding wiring 55 (WL). In other words, m wirings 55 (WL) are provided.

In the case where the numbers of the transistors and the capacitors included in the circuit 50 are the same, the circuit 50 with the configuration illustrated in FIG. 10 can retain image data with capacity twice as great as in the case of the circuit 50 with the configuration illustrated in FIG. 2. Accordingly, the number of transistors included in the imaging device 10 can be reduced, leading to a reduction in the size of the imaging device 10. Meanwhile, the circuit 50 with the configuration illustrated in FIG. 2 can retain complementary data as described above; thus, the circuit 30 can amplify image data at the time of reading. Accordingly, the reading speed can be higher in the case of the circuit 50 with the configuration illustrated in FIG. 2 than in the case of the circuit 50 with the configuration illustrated in FIG. 10.

Figure 11A:
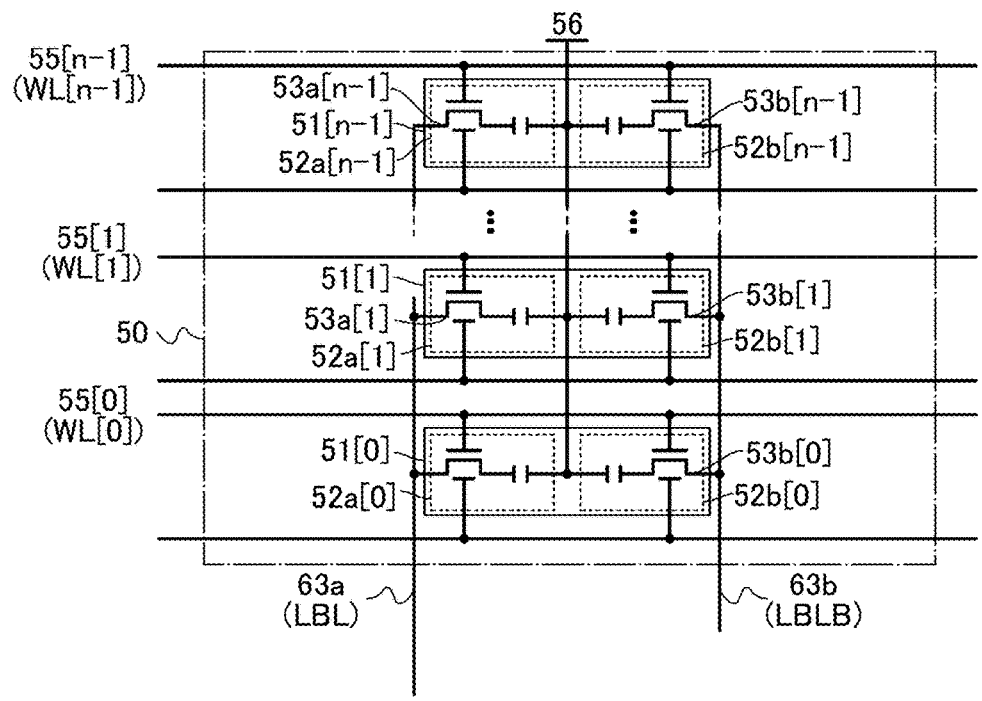
FIGS. 11A and 11B are circuit diagrams each illustrating a line buffer.
Figure 11B:
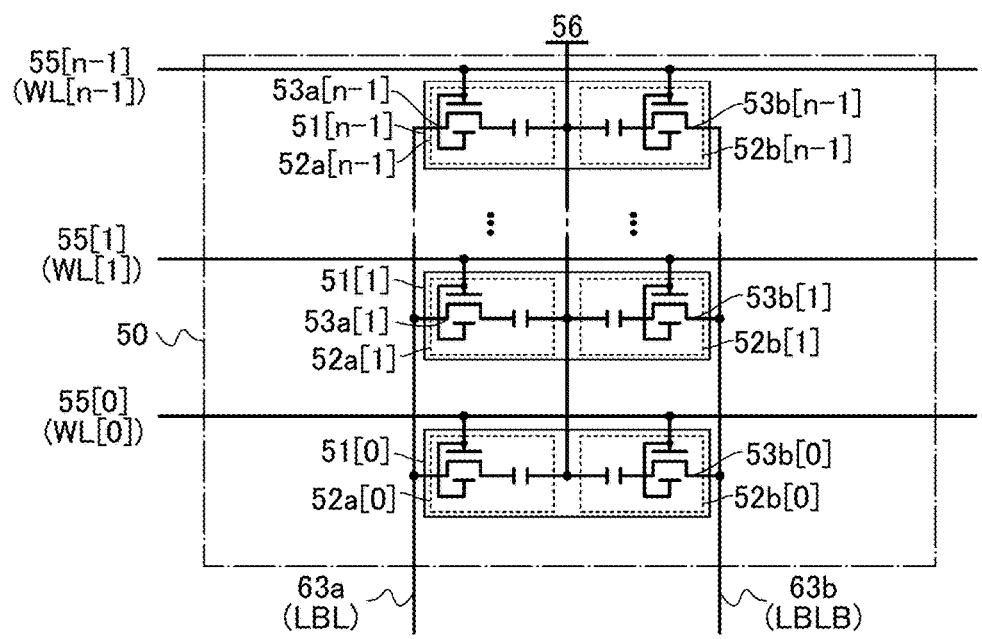

FIGS. 11A and 11B each illustrate a configuration in which the transistor 53a and the transistor 53b included in the circuit 50 illustrated in FIG. 2 have back gates. FIG. 11A illustrates a configuration in which a constant potential is applied to the back gates, which enables control of the threshold voltages. FIG. 11B illustrates a configuration in which the same potential is applied to the back gates and front gates, which enables an increase in on-state current.

The transistors included in the circuits 20, 30, and 40 may have back gates. The transistors included in the circuit 70 may have back gates.

Figure 12:
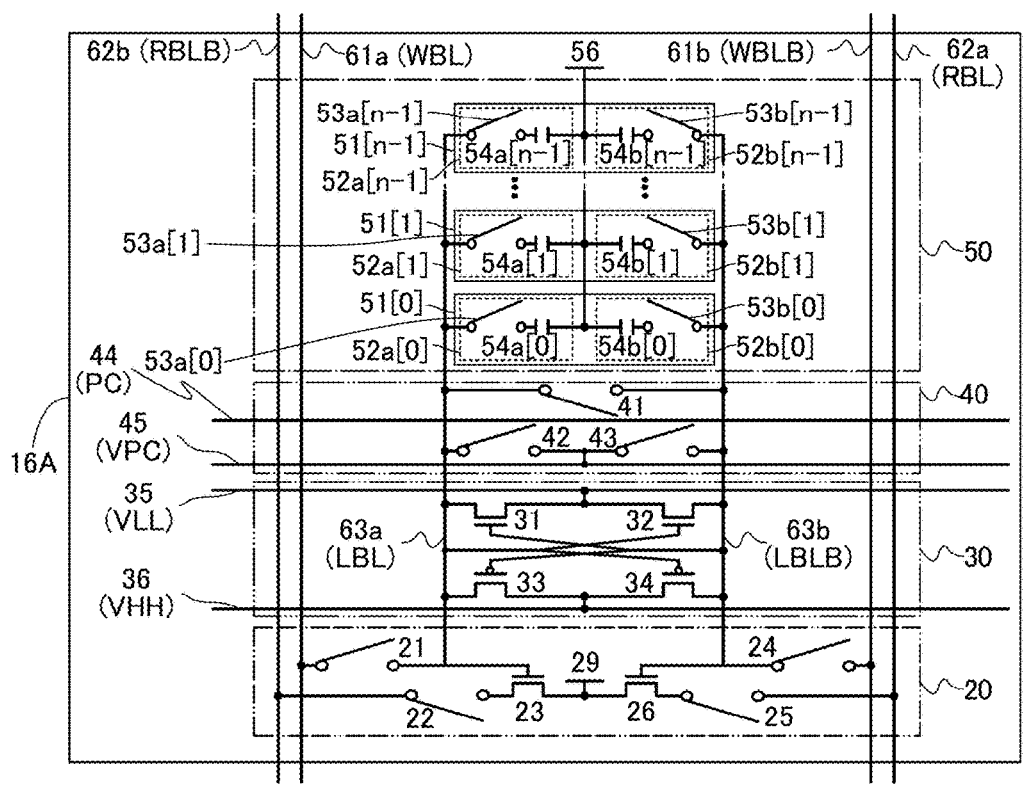
FIG. 12 is a circuit diagram illustrating a line buffer.

FIG. 12 illustrates a configuration in which the transistors 21, 22, 24, 25, 41, 42, 43, 53a, and 53b in the circuit 16A illustrated in FIG. 2 are replaced by switches. Each of the above transistors can be any element other than a transistor as long as it has a switching function. Note that some of the transistors 21, 22, 24, 25, 41, 42, 43, 53a, and 53b may be transistors while the rest may be other elements having a switching function. Furthermore, some or all of the above transistors in the circuit 16B may be replaced with other elements having a switching function.

Note that the configurations illustrated in FIG. 2, FIGS. 8A and 8B, FIGS. 9A to 9C, FIG. 10, FIGS. 11A and 11B, and FIG. 12 can be freely combined with one another.

This embodiment can be applied not only to imaging devices but also to other semiconductor devices. For example, this embodiment can be applied to memory devices.

This embodiment can be implemented in an appropriate combination with any of the structures described in the other embodiments.

Embodiment 3

In this embodiment, a system configuration example of the circuits 16 and 17 illustrated in FIGS. 1A and 1B will be described in detail with reference to drawings.

Note that as in Embodiment 1, the circuit 50 included in one circuit 16A or one circuit 16B has a function of retaining n-bit image data.

Figure 13:
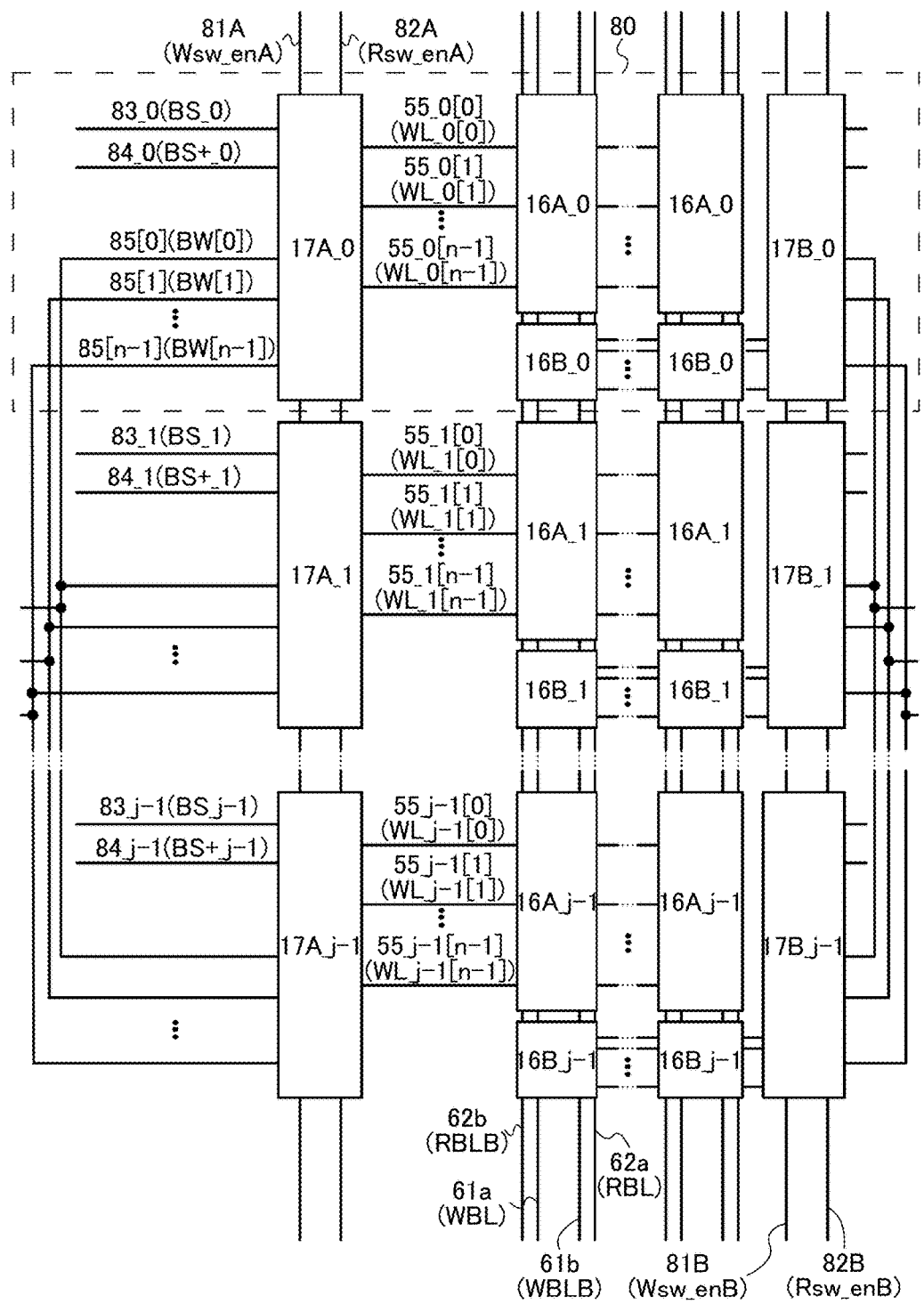
FIG. 13 is a block diagram illustrating a line buffer.

FIG. 13 is a block diagram illustrating a system configuration example of the circuits 16A, 16B, 17A, and 17B in FIGS. 1A and 1B. The imaging device 10 includes the necessary numbers of the circuits 16A, 16B, 17A, and 17B for j banks (j is a natural number).

Note that j can be 4, 8, or 16, for example.

A bank is a group of the circuits 16A, 16B, 17A, and 17B as illustrated as a region 80.

Each bank includes one circuit 17A and one circuit 17B; the imaging device 10 includes j circuits 17A and j circuits 17B. Each of the circuits 17A is electrically connected to all of the circuits 16A in one bank by n wirings 55 (WL). Each of the circuits 17B is electrically connected to all of the circuits 16B in one bank by n wirings 55 (WL).

The circuits 16A and 16B in each column are electrically connected to one another by the wiring 61a (WBL), the wiring 61b (WBLB), the wiring 62a (RBL), and the wiring 62b (RBLB). Furthermore, j circuits 17A are electrically connected to one another by one wiring 81A (Wsw_enA) and one wiring 82A (Rsw_enA), and j circuits 17B are electrically connected to one another by one wiring 81B (Wsw_enB) and one wiring 82B (Rsw_enB).

Each of the circuits 17A and 17B is electrically connected to one wiring 83 (BS), one wiring 84 (BS+), and n wirings 85 (BW).

Note that the circuits 16A, the circuits 16B, the circuits 17A, the circuits 17B, the wirings 83 (BS), and the wirings 84 (BS+) in j banks are distinguished from one another by symbols such as "_0," "_1," and "_j−1," and n wirings 85 (BW) are distinguished from one another by symbols such as "[0]," "[1]," and "[n−1]."

Since each circuit 16A in one bank is electrically connected to the corresponding circuit 17A by n wirings 55 (WL), the total number of the wirings 55 (WL) is n×j. The wirings 55 (WL) are distinguished from one another by symbols such as "_0[0]," "_0[n−1]," "_j−1[0]," and "_j−1[n−1]." Note that the wirings 55 (WL) electrically connecting the circuits 16B and the circuits 17B are distinguished from one another by similar symbols.

The wiring 81A (Wsw_enA) has a function of controlling the writing operation of image data to the circuits 30 included in the circuits 16A, and the wiring 81B (Wsw_enB) has a function of controlling the writing operation of image data to the circuits 30 included in the circuits 16B. The wiring 82A (Rsw_enA) has a function of controlling the reading operation of image data to the circuits 30 included in the circuits 16A, and the wiring 82B (Rsw_enB) has a function of controlling the reading operation of image data to the circuits 30 included in the circuits 16B. In the case of writing image data to the circuits 30 included in the circuits 16A, for example, the potential of the wiring 81A (Wsw_enA) is set at an H level and the potential of the wiring 82A (Rsw_enA) is set at an L level. In the case of reading image data transferred to the circuits 30 included in the circuits 16A, the potential of the wiring 81A (Wsw_enA) is set at an L level and the potential of the wiring 82A (Rsw_enA) is set at an H level.

The wiring 81B (Wsw_enB) and the wiring 82B (Rsw_enB) have functions of controlling the writing operation and reading operation of image data to the circuits 30 included in the circuits 16B with the logics similar to those of the wiring 81A (Wsw_enA) and the wiring 82A (Rsw_enA).

Each of the wirings 83 (BS) has a function of controlling the gate potentials of the transistors in the circuit 20 included in the corresponding circuit 16A or 16B.

When the potential of the wiring 83_0 (BS_0) is set at an H level and the potential of the wiring 81A (Wsw_enA) is set at an H level, for example, the potential of the wiring 27 (Wsw) included in the circuit 16A_0 becomes an H level. Accordingly, the transistor 21 and the transistor 24 included in the circuit 16A_0 are turned on and the circuit 16A_0 can perform writing operation. When the potential of the wiring 83_0 (BS_0) is set at an H level and the potential of the wiring 82A (Rsw_enA) is set at an H level, for example, the potential of the wiring 28 (Rsw) included in the circuit 16A_0 becomes an H level. Accordingly, the transistor 22 and the transistor 25 included in the circuit 16A_0 are turned on and the circuit 16A_0 can perform reading operation.

The wirings 84 (BS+) and the wirings 85 (BW) have a function of selecting one of the wirings 55 (WL). The wirings 84 (BS+) select a bank, and the wirings 85 (BW) select one wiring 55 (WL) from the wirings 55 (WL) in the bank selected by the wirings 84 (BS+).

When the potentials of the wiring 84_0 (BS+_0) and the wiring 85[0] (BW[0]) are set at an H level, for example, the potential of the wiring 55_0[0] (WL_0[0]) becomes an H level. When the potentials of the wiring 84_j−1 (BS+_j−1) and the wiring 85[n−1] (BW[n−1]) are set at an H level, for example, the potential of the wiring 55_j−1[n−1] (WL_j−1[n−1]) becomes an H level.

Note that the logics of the wiring 81A (Wsw_enA), the wiring 81B (Wsw_enB), the wiring 82A (Rsw_enA), the wiring 82B (Rsw_enB), the wirings 83 (BS), the wirings 84 (BS+), and the wirings 85 (BW) can be inverted as necessary and as appropriate.

Operation Examples

Next, the operation of the system illustrated in FIG. 13 will be described in detail with reference to timing charts in FIG. 14 and FIG. 15.

In general, a circuit like the circuit 51 has low writing and reading speeds and a latch circuit like the circuit 30 has high writing and reading speeds. Thus, when image data writing to the circuit 30 and the circuit 51 included in the circuit 16A is started after image data writing to the circuit 51 included in the circuit 16A in the prior bank is completed, the writing speed of the circuit 51 becomes a bottleneck. In addition, when image data reading from the circuit 51 included in the circuit 16A is started after image data reading from the circuit 30 included in the circuit 16A in the prior bank is completed, the reading speed of the circuit 51 becomes a bottleneck. According to the above, performing image data writing to the circuit 51 included in the circuit 16A in parallel with image data writing to the circuit 30 and the circuit 51 included in the circuit 16A in the next bank can increase the writing speed of the system illustrated in FIG. 13 as a whole. In addition, performing image data reading from the circuit 51 included in the circuit 16A in parallel with image data reading from the circuit 30 included in the circuit 16A in the prior bank can increase the reading speed of the system illustrated in FIG. 13 as a whole.

The timing charts illustrated in FIG. 14 and FIG. 15 show the potentials of the wiring 81A (Wsw_enA), the wiring 82A (Rsw_enA), the wiring 83_0 (BS_0), the wiring 84_0 (BS+_0), the wiring 83_1 (BS_1), the wiring 84_1 (BS+_1), the wiring 83_j−1 (BS_j−1), the wiring 84_j−1 (BS+_j−1), the wiring 85[0] (BW[0]), the wiring 85[n−1] (BW[n−1]), the wiring 55_0[0] (WL_0[0]), and the wiring 55_j−1[n−1] (WL_j−1[n−1]).

Each of the circuits 16A and 16B includes the circuit 20, the circuit 30, the circuit 40, and the circuit 50. One wiring 35 (VLL), one wiring 36 (VHH), and one wiring 44 (PC) are provided for the circuits 16A in one bank and for the circuits 16B in one bank. One wiring 63a (LBL) and one wiring 63b (LBLB) are provided in each of the circuits 16A and 16B.

Accordingly, when the necessary numbers of the circuits 16A and 16B for j banks are provided, the necessary numbers of the circuits 20, 30, 40, and 50 and the wirings 35 (VLL), 36 (VHH), 44 (PC), 63a (LBL), and 63b (LBLB) for j banks are provided. The circuits 20, 30, 40, and 50 and the wirings 35 (VLL), 36 (VHH), 44 (PC), 63a (LBL), and 63b (LBLB) in j banks are distinguished from one another by symbols such as "_0," "_1," and "_j−1," as in the case of the circuits 16A and 16B.

FIG. 14 is a timing chart showing the potentials of wirings electrically connected to the circuits 17A in the writing operation of the circuits 16A illustrated in FIG. 13. From Time T01 to Time T06, image data are written to the circuit 51_0[0], the circuit 51_1[0], and the circuit 51_2[0].

The number of the wirings 55 (WL) is the same as that of the circuits 51. That is, when n×j wirings 55 (WL) are provided, n×j circuits 51 are provided. Note that n×j circuits 51 are distinguished from one another by symbols such as "_0[0]," "_0[n−1]," "_j−1[0]," and "_j−1[n−1]," as in the case of the wirings 55 (WL).

At Time T01, the potentials of the wiring 84_0 (BS+_0) and the wiring 85[0] (BW[0]) are set at an H level. Accordingly, the potential of the wiring 55_0[0] (WL_0[0]) becomes an H level. Although not shown in FIG. 14, the potential of the wiring 35_0 (VLL_0) is set at an L level and the potential of the wiring 36_0 (VHH_0) is set at an H level to make the circuit 30_0 active.

The potential of the wiring 83_0 (BS_0) is set at an H level at Time T01 and the potential of the wiring 81A (Wsw_enA) is set at an H level at Time T02, whereby the transistor 21 and the transistor 24 included in the circuit 20_0 are turned on. As a result, image data are written to the circuit 30_0 through the wiring 61a (WBL) and the wiring 61b (WBLB) and the writing of the image data to the circuit 51_0[0] is started.

At Time T03, the potentials of the wiring 81A (Wsw_enA) and the wiring 83_0 (BS_0) are set at an L level. Since the transistor 21 and the transistor 24 included in the circuit 20_0 are turned on only when both of the potentials of the wiring 81A (Wsw_enA) and the wiring 83_0 (BS_0) are at an H level, the transistor 21 and the transistor 24 included in the circuit 20_0 are off at this time. Accordingly, image data writing to the circuit 30_0 through the wiring 61a (WBL) and the wiring 61b (WBLB) is completed.

Note that the potentials of the wiring 84_0 (BS+_0) and the wiring 85[0] (BW[0]) each remain at an H level at Time T03. Thus, image data written to the circuit 30_0 from Time T02 to Time T03 are continuously written to the circuit 51_0[0].

In addition, the potential of the wiring 84_1 (BS+_1) is set at an H level at Time T03. Since the potential of the wiring 85[0] (BW[0]) is at an H level at this time, the potential of the wiring 55_1[0] (WL_1[0]) becomes an H level. Note that the potential of the wiring 55_1[0](WL_1[0]) is not shown in FIG. 14.

Although not shown in FIG. 14, the potential of the wiring 35_1 (VLL_1) is set at an L level and the potential of the wiring 36_1 (VHH_1) is set at an H level at Time T03 to make the circuit 30_1 active.

The potential of the wiring 83_1 (BS_1) is set at an H level at Time T03 and the potential of the wiring 81A (Wsw_enA) is set at an H level at Time T04, whereby the transistor 21 and the transistor 24 included in the circuit 20_1 are turned on. As a result, image data are written to the circuit 30_1 through the wiring 61a (WBL) and the wiring 61b (WBLB) and the writing of the image data to the circuit 51_1[0] is started.

At Time T05, the potentials of the wiring 81A (Wsw_enA) and the wiring 83_1 (BS_1) are set at an L level. Since the transistor 21 and the transistor 24 included in the circuit 20_1 are turned on only when both of the potentials of the wiring 81A (Wsw_enA) and the wiring 83_1 (BS_1) are at an H level, the transistor 21 and the transistor 24 included in the circuit 20_1 are off at this time. Accordingly, image data writing to the circuit 30_1 through the wiring 61a (WBL) and the wiring 61b (WBLB) is completed.

In addition, the potential of the wiring 84_0 (BS+_0) is set at an L level at Time T05. Accordingly, the potential of the wiring 55_0[0] (WL_0[0]) becomes an L level and image data writing to the circuit 51_0[0] is completed. After the potential of the wiring 55_0[0](WL_0[0]) is set at an L level, the potentials of the wiring 35_0 (VLL_0) and the wiring 36_0 (VHH_0) are set to "VDD/2" to make the circuit 30_0 inactive, which leads to a reduction in power consumption.

Note that the potentials of the wiring 84_1 (BS+_1) and the wiring 85[0] (BW[0]) each remain at an H level at Time T05. Thus, image data written to the circuit 30_1 from Time T04 to Time T05 are continuously written to the circuit 51_1[0].

In addition, the potential of the wiring 84_2 (BS+_2) is set at an H level at Time T05. Since the potential of the wiring 85[0] (BW[0]) is at an H level at this time, the potential of the wiring 55_2[0] (WL_2[0]) becomes an H level. Note that the potentials of the wiring 84_2 (BS+_2) and the wiring 55_2[0] (WL_2[0]) are not shown in FIG. 14.

Although not shown in FIG. 14, the potential of the wiring 35_2 (VLL_2) is set at an L level and the potential of the wiring 362 (VHH_2) is set at an H level at Time T05 to make the circuit 30_2 active.

The potential of the wiring 83_2 (BS_2) is set at an H level at Time T05 and the potential of the wiring 81A (Wsw_enA) is set at an H level at Time T06, whereby the circuit 20_2 becomes active. As a result, image data are written to the circuit 30_2 through the wiring 61a (WBL) and the wiring 61b (WBLB) and the writing of the image data to the circuit 51_2[0] is started.

From Time T11 to Time T16, image data are written to the circuit 51_j−2[0], the circuit 51_j−1[0], and the circuit 51_0[1]. From Time T21 to Time T25, image data are written to the circuit 51_j−2[n−1] and the circuit 51_j−1[n−1]. In this manner, in the operation illustrated in FIG. 14, image data are written to the circuits 51_0[0] to 51_j−1[0], to the circuits 51_0[1] to 51_j−1[1], and to the circuits 51_0[n−1] to 51_j−1[n−1], sequentially. The above is the writing operation of the circuits 16A illustrated in FIG. 13.

Note that in FIG. 14, image data writing from the circuit 30 to the circuit 51 continues even after image data writing to the circuit 30 is completed. Furthermore, at this time, image data writing to the circuit 30 and the circuit 51 included in the circuit 16A in another bank is performed in parallel. For example, from Time T04 to Time T05, image data writing to the circuit 30_0 is not performed, but image data writing from the circuit 30_0 to the circuit 51_0[0] and image data writing to the circuit 30_1 and the circuit 51_1 are performed in parallel. In other words, writing operations of the circuits 16A in a plurality of banks are performed in parallel.

In general, a circuit like the circuit 51 has a low writing speed and a latch circuit like the circuit 30 has a high writing speed. Thus, when image data writing to the circuit 30 and the circuit 51 included in the circuit 16A is started after image data writing to the circuit 51 included in the circuit 16A in the prior bank is completed, the writing speed of the circuit 51 becomes a bottleneck. Accordingly, performing image data writing to the circuit 51 included in the circuit 16A in parallel with image data writing to the circuit 30 and the circuit 51 included in the circuit 16A in the next bank as illustrated in FIG. 14 can increase the writing speed of the system illustrated in FIG. 13 as a whole.

In FIG. 14, image data writing to the circuit 51 included in the circuit 16A is performed until image data writing to the circuit 30 included in the circuit 16A in the next bank is completed; however, image data writing to the circuit 51 can be performed until any time before the next image data writing to the circuit 30 included in the circuit 16A in the same bank is started. For example, image data writing to the circuit 51_0[0] can be performed until image data writing to the circuit 30_2 is completed or until image data writing to the circuit 30_*j*−1 is completed. Image data writing to the circuit 51_1[1] can be performed until image data writing to the circuit 30_3 is completed or until image data writing to the circuit 30_0 is completed, for example.

Note that image data writing to the circuit 51_0[0] can be completed after image data writing to the circuit 30_0 is completed before image data writing to the circuit 30_1 is started, for example. Image data writing to the circuit 51_0[0] can be completed at the same time as image data writing to the circuit 30_0, for example.

FIG. 15 is a timing chart showing the potentials of wirings electrically connected to the circuit 17A in the reading operation of the circuits 16A illustrated in FIG. 13. From Time T01 to Time T06, image data retained in the circuit 51_0[0] and the circuit 51_1[0] are read out.

At Time T01, the potentials of the wiring 84_0 (BS+_0) and the wiring 85[0] (BW[0]) are set at an H level. Accordingly, the potential of the wiring 55_0[0] (WL_0[0]) becomes an H level.

Although not shown in FIG. 15, at Time T01, the potential of the wiring 44_0 (PC_0) is set at an H level and then the potential of the wiring 44_0 (PC_0) is set at an L level before the potential of the wiring 84_0 (BS+_0) is set at an H level, whereby the wiring 63*a*_0 (LBL_0) and the wiring 63*b*_0 (LBLB_0) can be precharged. Accordingly, image data retained in the circuit 51_0[0] can be correctly transferred to the circuit 30_0.

Although not shown in FIG. 15, at Time T01, the potential of the wiring 35_0 (VLL_0) is set at an L level and the potential of the wiring 36_0 (VHH_0) is set at an H level after the potential of the wiring 55_0[0] (WL_0[0]) is set at an H level, whereby the circuit 30_0 becomes active and image data retained in the circuit 51_0[0] are transferred to the circuit 30_0. Then, the image data transferred to the circuit 30_0 are amplified. Since the potential of the wiring 55_0[0] (WL_0[0]) is at an H level, the amplified image data are rewritten to the circuit 51_0[0].

At Time T02, the potential of the wiring 83_0 (BS_0) is set at an H level. At Time T03, the potential of the wiring 82A (Rsw_enA) is set at an H level. Accordingly, the transistor 22 and the transistor 25 included in the circuit 20_0 are turned on, and image data transferred from the circuit 51_0[0] to the circuit 30_0 are read out through the circuit 20_0.

In addition, the potential of the wiring 84_1 (BS+_1) is set at an H level at Time T03. Since the potential of the wiring 85[0] (BW[0]) is at an H level at this time, the potential of the wiring 55_1[0] (WL_1[0]) becomes an H level. Note that the potential of the wiring 55_1[0] (WL_1[0]) is not shown in FIG. 15.

Although not shown in FIG. 15, at Time T03, the potential of the wiring 44_1 (PC_1) is set at an H level and then the potential of the wiring 44_1 (PC_1) is set at an L level before the potential of the wiring 84_1 (BS+_1) is set at an H level, whereby the wiring 63*a*_1 (LBL_1) and the wiring 63*b*_1 (LBLB_1) can be precharged. Accordingly, image data retained in the circuit 51_1[0] can be correctly transferred to the circuit 30_1.

Although not shown in FIG. 15, at Time T03, the potential of the wiring 35_1 (VLL_1) is set at an L level and the potential of the wiring 36_1 (VHH_1) is set at an H level after the potential of the wiring 55_1[0] (WL_1[0]) is set at an H level, whereby the circuit 30_1 becomes active and image data retained in the circuit 51_1[0] are transferred to the circuit 30_1. Then, the image data transferred to the circuit 30_1 are amplified. Since the potential of the wiring 55_1[0] (WL_1[0]) is at an H level, the amplified image data are rewritten to the circuit 51_1[0].

At Time T04, the potentials of the wiring 82A (Rsw_enA) and the wiring 83_0 (BS_0) are set at an L level. Since the circuit 20_0 becomes active only when both of the potentials of the wiring 82A (Rsw_enA) and the wiring 83_0 (BS_0) are at an H level, the transistor 22 and the transistor 25 included in the circuit 20_0 are off at this time. Accordingly, image data reading from the circuit 30_0 is completed.

At Time T04, the potential of the wiring 84_0 (BS+_0) is set at an L level, so that the potential of the wiring 55_0[0] (WL_0[0]) becomes an L level. Accordingly, rewriting from the circuit 30_0 to the circuit 51_0[0] is completed.

Note that at Time T04, after the potential of the wiring 55_0[0] (WL_0[0]) is set at an L level, the potentials of the wiring 35_0 (VLL_0) and the wiring 36_0 (VHH_0) are set to "VDD/2" to make the circuit 30_0 inactive, which leads to a reduction in power consumption.

The potential of the wiring 83_1 (BS_1) is set at an H level at Time T04 and the potential of the wiring 82A (Rsw_enA) is set at an H level at Time T05, whereby the transistor 22 and the transistor 25 included in the circuit 20_1 are turned on. As a result, the image data transferred from the circuit 51_1[0] to the circuit 30_1 are read out through the circuit 20_1.

In addition, the potential of the wiring 84_2 (BS+_2) is set at an H level at Time T05. Since the potential of the wiring 85[0] (BW[0]) is at an H level at this time, the potential of the wiring 55_2[0] (WL_2[0]) becomes an H level. Note that the potentials of the wiring 84_2 (BS+_2) and the wiring 55_2[0] (WL_2[0]) are not shown in FIG. 15.

Although not shown in FIG. 15, at Time T05, the potential of the wiring 44_2 (PC_2) is set at an H level and then the potential of the wiring 44_2 (PC_2) is set at an L level before the potential of the wiring 84_2 (BS+_2) is set at an H level, whereby the wiring 63*a*_2 (LBL_2) and the wiring 63*b*_2 (LBLB_2) can be precharged. Accordingly, image data retained in the circuit 51_2[0] can be correctly transferred to the circuit 30_2.

Although not shown in FIG. 15, at Time T05, the potential of the wiring 35_2 (VLL_2) is set at an L level and the potential of the wiring 36_2 (VHH_2) is set at an H level after the potential of the wiring 55_2[0] (WL_2[0]) is set at an H level, whereby the circuit 30_2 becomes active and image data retained in the circuit 51_2[0] are transferred to the circuit 30_2. Then, the image data transferred to the circuit 30_2 are amplified. Since the potential of the wiring 55_2[0] (WL_2[0]) is at an H level, the amplified image data are rewritten to the circuit 51_2[0].

At Time T06, the potentials of the wiring 82A (Rsw_enA) and the wiring 83_1 (BS_1) are set at an L level. Since the circuit 20_1 becomes active only when both of the potentials of the wiring 82A (Rsw_enA) and the wiring 83_1 (BS_1) are at an H level, the transistor 22 and the transistor 25 included in the circuit 20_1 are off at this time. Accordingly, image data reading from the circuit 30_1 is completed.

At Time T06, the potential of the wiring 84_1 (BS+_1) is set at an L level, so that the potential of the wiring 55_1[0] (WL_1[0]) becomes an L level. Accordingly, rewriting from the circuit 30_1 to the circuit 51_1[0] is completed.

Note that at Time T06, after the potential of the wiring 55_1[0] (WL_1[0]) is set at an L level, the potentials of the wiring 35_1 (VLL_1) and the wiring 36_1 (VHH_1) are set to "VDD/2" to make the circuit 30_1 inactive, which leads to a reduction in power consumption.

From Time T11 to Time T16, image data retained in the circuit 51_$j$–2[0], the circuit 51_$j$–1[0], and the circuit 51_0[1] are read out. From Time T21 to Time T24, image data retained in the circuit 51_$j$–2[n–1] and the circuit 51_$j$–1[n–1] are read out.

In this manner, in the operation illustrated in FIG. 15, image data are read out from the circuits 51_0[0] to 51_$j$–1[0], from the circuits 51_0[1] to 51_$j$–1[1], and from the circuits 51_0[$n$–1] to 51_$j$–1[n–1], sequentially. The above is the reading operation of the circuits 16A illustrated in FIG. 13.

Note that in FIG. 15, during image data reading of the circuit 30 included in the circuit 16A, image data reading of the circuit 51 included in the circuit 16A in another bank is performed. For example, from Time T03 to Time T04, reading of image data transferred from the circuit 51_0[0] to the circuit 30_0 and transfer of image data retained in the circuit 51_1[0] to the circuit 30_1 are performed in parallel. In other words, reading operations of the circuits 16A in a plurality of banks are performed in parallel.

In general, a circuit like the circuit 51 has a low reading speed and a latch circuit like the circuit 30 has a high reading speed. Thus, when image data reading from the circuit 51 included in the circuit 16A is started after image data reading from the circuit 30 included in the circuit 16A in the prior bank is completed, the reading speed of the circuit 51 becomes a bottleneck. Accordingly, performing image data reading from the circuit 51 included in the circuit 16A in parallel with image data reading from the circuit 30 included in the circuit 16A in the next bank as illustrated in FIG. 15 can increase the reading speed of the system illustrated in FIG. 13 as a whole.

In FIG. 15, image data reading from the circuit 51 included in the circuit 16A is started after image data reading from the circuit 30 included in the circuit 16A in the prior bank is started; however, image data can be read from the circuit 51 any time after the circuit 30 included in the circuit 16A in the same bank performs the prior image data reading. For example, image data reading from the circuit 51_$j$–1[0] can be started at the same time as image data reading from the circuit 30_$j$–3 or image data reading from the circuit 30_0. Image data reading from the circuit 51_1[1] can be started at the same time as image data reading from the circuit 30_$j$–1 or image data reading from the circuit 30_2, for example.

Image data reading from the circuit 51_1[0] can be started after image data reading from the circuit 30_0, for example. Specifically, image data reading from the circuit 51_1[0] can be started at the same time as image data reading from the circuit 30_1.

In the writing operation illustrated in FIG. 14 and the reading operation illustrated in FIG. 15, the potentials of the wiring 35_$k$ (VLL_$k$) and the wiring 36_$k$ (VHH_$k$) can be set to "VDD/2" in a period during which the potentials of the wirings 55_$k$[0] (WL_$k$[0]) to 55_$k$[n–1] (WL_$k$[n–1]) are at an L level. Note that k is an integer greater than or equal to 0 and less than or equal to j–1. Accordingly, the circuit 30_$k$ performing neither writing operation nor reading operation can be made inactive, leading to a reduction in power consumption.

Note that in the writing operation and reading operation of the circuits 16B, the potential of the wiring 81B (Wsw_enB) is changed in a manner similar to that of the potential of the wiring 81A (Wsw_enA), and the potential of the wiring 82B (Rsw_enB) is changed in a manner similar to that of the potential of the wiring 82A (Rsw_enA). The potentials of the wirings 83 (BS), 84 (BS+), 85 (BW), and 55 (WL) electrically connected to the circuits 17B are changed as illustrated in FIG. 14 and FIG. 15. The other parts are similar to those of the writing operation of the circuits 16A illustrated in FIG. 14 and the reading operation of the circuits 16A illustrated in FIG. 15.

This embodiment can be applied not only to imaging devices but also to other semiconductor devices. For example, this embodiment can be applied to memory devices.

This embodiment can be implemented in an appropriate combination with any of the structures described in the other embodiments.

Embodiment 4

In this embodiment, a transistor containing an oxide semiconductor that can be used in one embodiment of the present invention will be described with reference to drawings. In the drawings in this embodiment, some components are enlarged, reduced in size, or omitted for easy understanding.

Figure 16A:
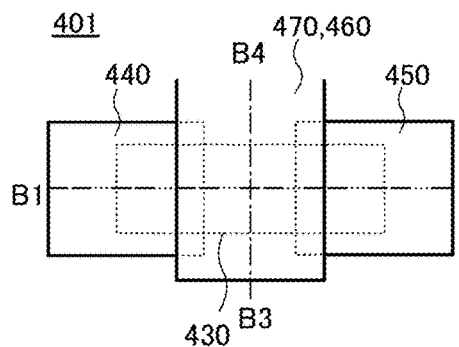
FIGS. 16A to 16F are top views and cross-sectional views illustrating transistors.
Figure 16B:
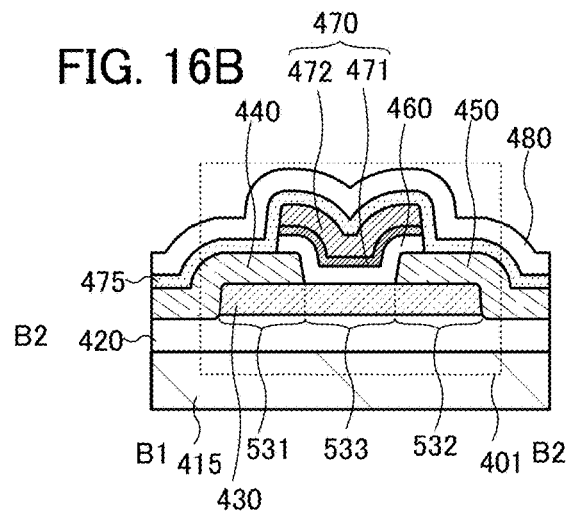
Figure 18A:
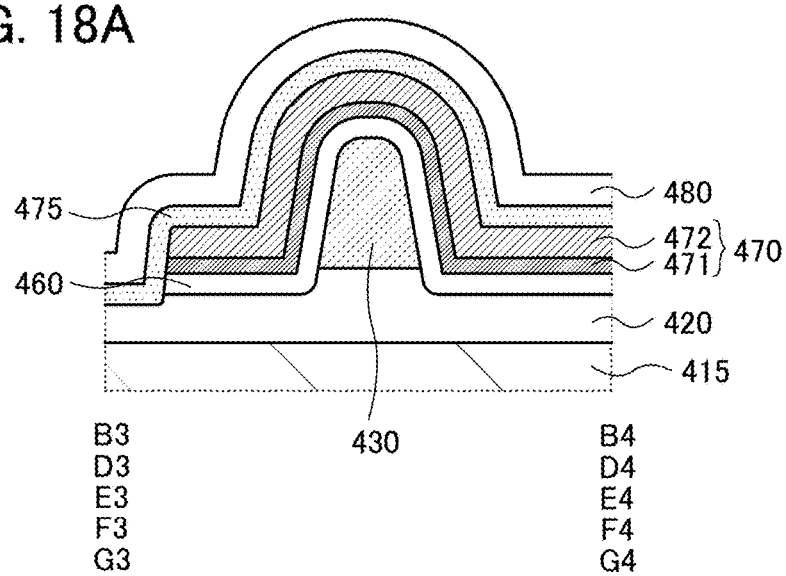
FIGS. 18A to 18D illustrate cross sections of transistors in the channel width direction.

FIG. 16A is a top view illustrating a transistor 401 in one embodiment of the present invention. A cross section in the direction of dashed-dotted line B1-B2 in FIG. 16A is illustrated in FIG. 16B. A cross section in the direction of dashed-dotted line B3-B4 in FIG. 16A is illustrated in FIG. 18A. Note that the direction of dashed-dotted line B1-B2 is referred to as a channel length direction, and the direction of dashed-dotted line B3-B4 is referred to as a channel width direction, in some cases.

The transistor 401 includes a substrate 415, an insulating film 420, an oxide semiconductor film 430, a conductive film 440, a conductive film 450, an insulating film 460, a conductive film 470, an insulating film 475, and an insulating film 480.

The insulating film 420 is in contact with the substrate 415. The oxide semiconductor film 430 is in contact with the insulating film 420. The conductive film 440 and the conductive film 450 are in contact with the insulating film 420 and the oxide semiconductor film 430. The insulating film 460 is in contact with the insulating film 420, the oxide semiconductor film 430, the conductive film 440, and the conductive film 450. The conductive film 470 is in contact with the insulating film 460. The insulating film 475 is in contact with the insulating film 420, the conductive film 440, the conductive film 450, and the conductive film 470. The insulating film 480 is in contact with the insulating film 475.

Here, in the oxide semiconductor film 430, a region in contact with the conductive film 440, a region in contact with the conductive film 450, and a region in contact with the insulating film 460 are referred to as a region 531, a region 532, and a region 533, respectively.

Furthermore, the conductive films 440 and 450 are electrically connected to the oxide semiconductor film 430.

The conductive film 440, the conductive film 450, the insulating film 460, and the conductive film 470 function as a source electrode, a drain electrode, a gate insulating film, and a gate electrode, respectively.

The region 531, the region 532, and the region 533 that are illustrated in FIG. 16B function as a source region, a drain region, and a channel formation region, respectively.

Each of the conductive films 440 and 450 is a single layer in the drawing, but also may be a stack including two or more layers. The conductive film 470 includes two layers, a conductive film 471 and a conductive film 472, in the drawing, but also may be a single layer or a stack including three or more layers. The same applies to other transistors described in this embodiment.

The insulating film 480 may function as a planarization film as necessary.

Figure 16C:
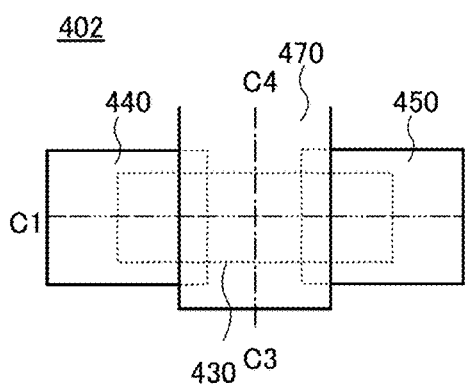
Figure 16D:
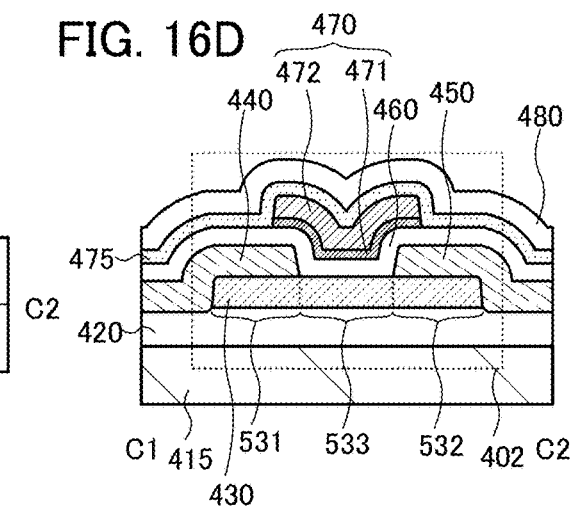
Figure 18B:
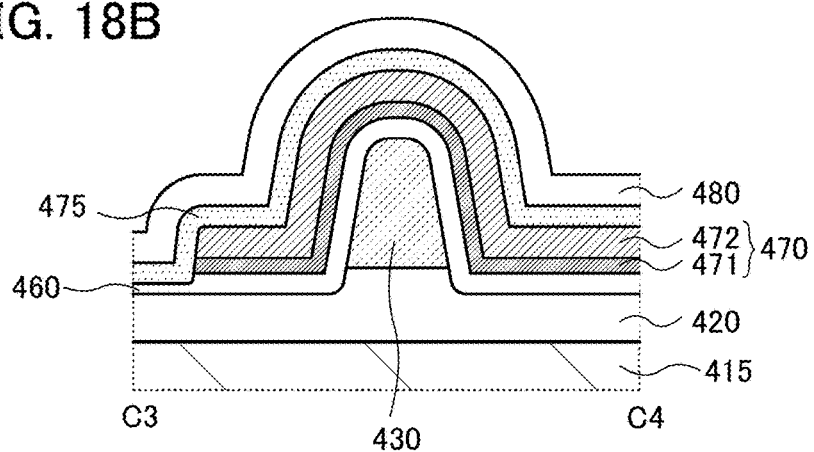

The transistor in one embodiment of the present invention may have a structure illustrated in FIGS. 16C and 16D. FIG. 16C is a top view of a transistor 402. A cross section in the direction of dashed-dotted line C1-C2 in FIG. 16C is illustrated in FIG. 16D. A cross section in the direction of dashed-dotted line C3-C4 in FIG. 16C is illustrated in FIG. 18B. The direction of dashed-dotted line C1-C2 is referred to as a channel length direction, and the direction of dashed-dotted line C3-C4 is referred to as a channel width direction in some cases.

The transistor 402 is different from the transistor 401 in that an end portion of the insulating film 460 is not aligned with an end portion of the conductive film 470. In the transistor 402, wide areas of the conductive films 440 and 450 are covered with the insulating film 460 and accordingly the electric resistance between the conductive film 470 and the conductive films 440 and 450 is high; therefore, the transistor 402 has a feature of a low gate leakage current.

The transistors 401 and 402 each have a top-gate structure including regions where the conductive film 470 overlaps with the conductive films 440 and 450. To reduce parasitic capacitance, the width of each of the regions in the channel length direction is preferably greater than or equal to 3 nm and less than 300 nm. Since an offset region is not formed in the oxide semiconductor film 430 in this structure, a transistor with a high on-state current can be easily formed.

Figure 16E:
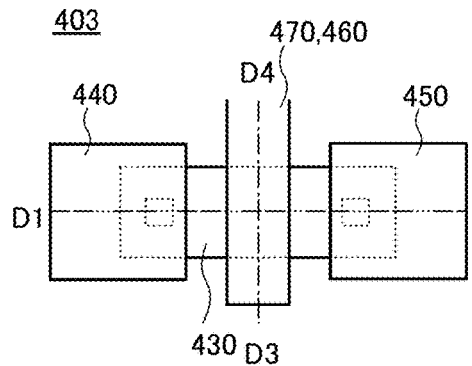
Figure 16F:
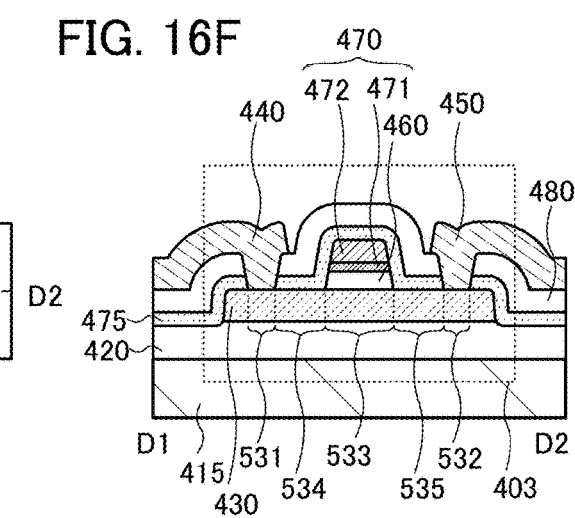

The transistor in one embodiment of the present invention may have a structure illustrated in FIGS. 16E and 16F. FIG. 16E is a top view of a transistor 403. A cross section in the direction of dashed-dotted line D1-D2 in FIG. 16E is illustrated in FIG. 16F. A cross section in the direction of dashed-dotted line D3-D4 in FIG. 16E is illustrated in FIG. 18A. The direction of dashed-dotted line D1-D2 is referred to as a channel length direction, and the direction of dashed-dotted line D3-D4 is referred to as a channel width direction.

In the transistor 403, the insulating film 420 is in contact with the substrate 415; the oxide semiconductor film 430 is in contact with the insulating film 420; the insulating film 460 is in contact with the insulating film 420 and the oxide semiconductor film 430; the conductive film 470 is in contact with the insulating film 460; the insulating film 475 is in contact with the insulating film 420, the oxide semiconductor film 430, and the conductive film 470; the insulating film 480 is in contact with the insulating film 475; and the conductive film 440 and the conductive film 450 are in contact with the oxide semiconductor film 430 and the insulating film 480.

Openings are formed in the insulating films 475 and 480, and the conductive films 440 and 450 are electrically connected to the oxide semiconductor film 430 through the openings.

The transistor 403 may further include, for example, an insulating film (planarization film) in contact with the conductive films 440 and 450 and the insulating film 480 as necessary.

In the oxide semiconductor film 430, a region that is in contact with the insulating film 475 and is sandwiched between the region 531 and the region 533 is referred to as a region 534, and a region that is in contact with the insulating film 475 and is sandwiched between the region 532 and the region 533 is referred to as a region 535.

Figure 17A:
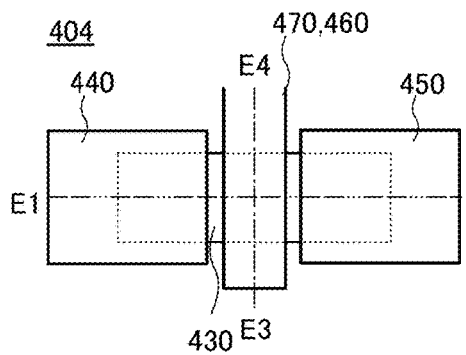
FIGS. 17A to 17F are top views and cross-sectional views illustrating transistors.
Figure 17B:
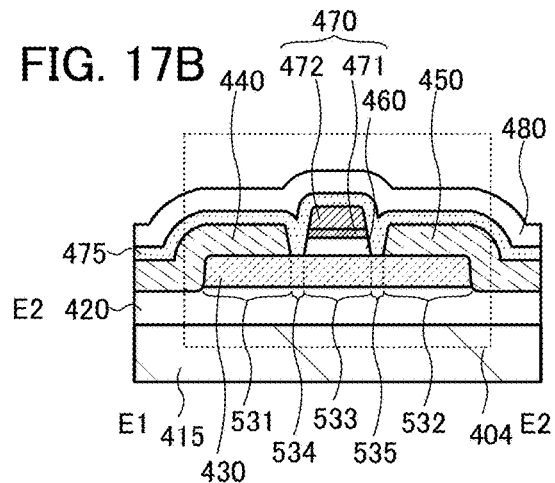

The transistor in one embodiment of the present invention may have a structure illustrated in FIGS. 17A and 17B. FIG. 17A is a top view of a transistor 404. A cross section in the direction of dashed-dotted line E1-E2 in FIG. 17A is illustrated in FIG. 17B. A cross section in the direction of dashed-dotted line E3-E4 in FIG. 17A is illustrated in FIG. 18A. The direction of dashed-dotted line E1-E2 is referred to as a channel length direction, and the direction of dashed-dotted line E3-E4 is referred to as a channel width direction in some cases.

In the transistor 404, the insulating film 420 is in contact with the substrate 415; the oxide semiconductor film 430 is in contact with the insulating film 420; the conductive films 440 and 450 are in contact with the insulating film 420 and the oxide semiconductor film 430; the insulating film 460 is in contact with the insulating film 420 and the oxide semiconductor film 430; the conductive film 470 is in contact with the insulating film 460; the insulating film 475 is in contact with the insulating film 420, the oxide semiconductor film 430, the conductive film 440, the conductive film 450, and the conductive film 470; and the insulating film 480 is in contact with the insulating film 475.

The transistor 404 is different from the transistor 403 in that the conductive films 440 and 450 in contact with the oxide semiconductor film 430 cover end portions of the oxide semiconductor film 430.

The transistors 403 and 404 each have a self-aligned structure that does not include regions where the conductive film 470 overlaps with the conductive films 440 and 450. A transistor with a self-aligned structure, which has extremely low parasitic capacitance between a gate and a source and between the gate and a drain, is suitable for applications that require high-speed operation.

Figure 17C:
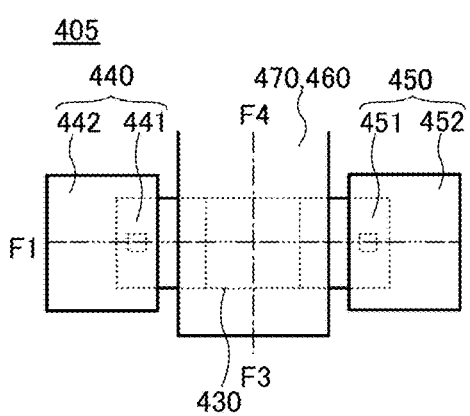
Figure 17D:
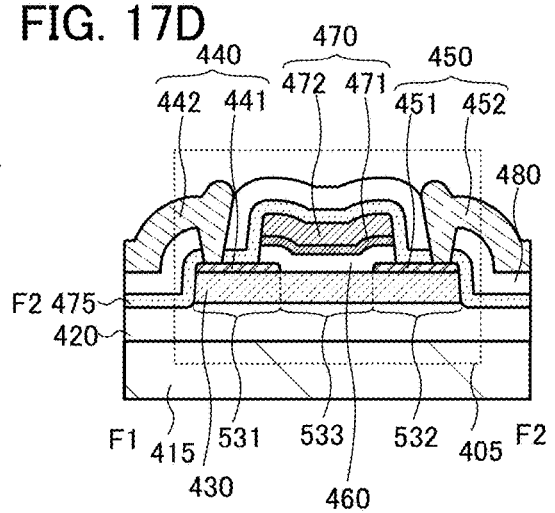

The transistor in one embodiment of the present invention may have a structure illustrated in FIGS. 17C and 17D. FIG. 17C is a top view of a transistor 405. A cross section in the direction of dashed-dotted line F1-F2 in FIG. 17C is illustrated in FIG. 17D. A cross section in the direction of dashed-dotted line F3-F4 in FIG. 17C is illustrated in FIG. 18A. The direction of dashed-dotted line F1-F2 is referred to as a channel length direction, and the direction of dashed-dotted line F3-F4 is referred to as a channel width direction in some cases.

In the transistor 405, the conductive film 440 includes two layers, a conductive film 441 and a conductive film 442, and the conductive film 450 includes two layers, a conductive film 451 and a conductive film 452. The insulating film 420 is in contact with the substrate 415. The oxide semiconductor film 430 is in contact with the insulating film 420. The conductive film 441 and the conductive film 451 are in contact with the oxide semiconductor film 430. The insulating film 460 is in contact with the insulating film 420, the oxide semiconductor film 430, the conductive film 441, and the conductive film 451. The conductive film 470 is in contact with the insulating film 460. The insulating film 475 is in contact with the insulating film 420, the conductive film 441, the conductive film 451, and the conductive film 470.

The insulating film 480 is in contact with the insulating film 475. The conductive film 442 is in contact with the conductive film 441 and the insulating film 480. The conductive film 452 is in contact with the conductive film 451 and the insulating film 480.

The conductive films 441 and 451 are in contact with the top surface of the oxide semiconductor film 430 and are not in contact with a side surface of the oxide semiconductor film 430.

The transistor 405 may further include, for example, an insulating film in contact with the conductive films 442 and 452 and the insulating film 480 as necessary.

The conductive film 441 and the conductive film 451 are electrically connected to the oxide semiconductor film 430. Furthermore, the conductive film 442 is electrically connected to the conductive film 441, and the conductive film 452 is electrically connected to the conductive film 451.

In the oxide semiconductor film 430, a region overlapping with the conductive film 441 is the region 531 that can function as a source region, and a region overlapping with the conductive film 451 is the region 532 that can function as a drain region.

Figure 17E:
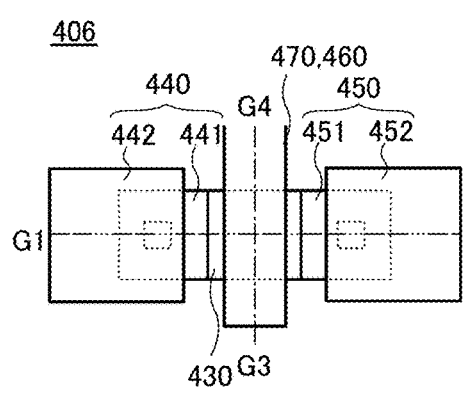
Figure 17F:
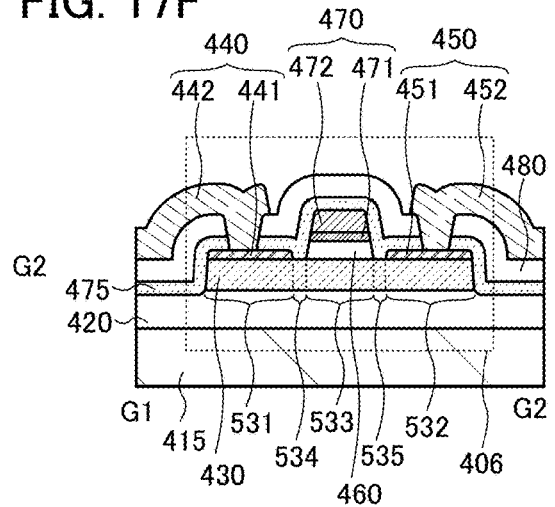

The transistor in one embodiment of the present invention may have a structure illustrated in FIGS. 17E and 17F. FIG. 17E is a top view of a transistor 406. A cross section in the direction of dashed-dotted line G1-G2 in FIG. 17E is illustrated in FIG. 17F. A cross section in the direction of dashed-dotted line G3-G4 in FIG. 17E is illustrated in FIG. 18A. The direction of dashed-dotted line G1-G2 is referred to as a channel length direction, and the direction of dashed-dotted line G3-G4 is referred to as a channel width direction in some cases.

The transistor 406 is different from the transistor 403 in that the conductive film 440 includes two layers, the conductive films 441 and 442, and the conductive film 450 includes two layers, the conductive films 451 and 452.

In the structures of the transistors 405 and 406, the conductive films 440 and 450 are not in contact with the insulating film 420. These structures make the insulating film 420 less likely to be deprived of oxygen by the conductive films 440 and 450 and facilitate oxygen supply from the insulating film 420 to the oxide semiconductor film 430.

An impurity for forming an oxygen vacancy to increase conductivity may be added to the regions 534 and 535 in the transistor 403, the transistor 404, and the transistor 406. As an impurity for forming an oxygen vacancy in an oxide semiconductor film, for example, one or more of the following can be used: phosphorus, arsenic, antimony, boron, aluminum, silicon, nitrogen, helium, neon, argon, krypton, xenon, indium, fluorine, chlorine, titanium, zinc, and carbon. As a method for adding the impurity, plasma treatment, ion implantation, ion doping, plasma immersion ion implantation, or the like can be used.

When the above element is added as an impurity element to the oxide semiconductor film, a bond between a metal element and oxygen in the oxide semiconductor film is cut, so that an oxygen vacancy is formed. Interaction between an oxygen vacancy in the oxide semiconductor film and hydrogen that remains in the oxide semiconductor film or is added to the oxide semiconductor film later can increase the conductivity of the oxide semiconductor film.

When hydrogen is added to an oxide semiconductor in which an oxygen vacancy is formed by addition of an impurity element, hydrogen enters an oxygen vacant site and forms a donor level in the vicinity of the conduction band. Consequently, an oxide conductor can be formed. Here, an oxide conductor refers to an oxide semiconductor having become a conductor. Note that the oxide conductor has a light-transmitting property like the oxide semiconductor.

The oxide conductor is a degenerated semiconductor and it is suggested that the conduction band edge equals or substantially equals the Fermi level. For that reason, an ohmic contact is made between an oxide conductor film and conductive films that function as a source and a drain; thus, contact resistance between the oxide conductor film and the conductive films that function as a source and a drain can be reduced.

Although the transistors 401 to 406 in FIGS. 16A to 16F, FIGS. 17A to 17F, and FIGS. 18A to 18D are examples in which the oxide semiconductor film 430 is a single layer, the oxide semiconductor film 430 may be a stacked layer. FIG. 19A is a top view of the oxide semiconductor film 430, and FIGS. 19B and 19C are cross-sectional views of the oxide semiconductor film 430 having a two-layer structure of an oxide semiconductor film 430a and an oxide semiconductor film 430b. FIGS. 19D and 19E are cross-sectional views of the oxide semiconductor film 430 having a three-layer structure of the oxide semiconductor film 430a, the oxide semiconductor film 430b, and an oxide semiconductor film 430c.

The oxide semiconductor films 430a and 430c can also be referred to as insulating films because no channel region is formed therein.

Oxide semiconductor films with different compositions, for example, can be used as the oxide semiconductor films 430a, 430b, and 430c.

The oxide semiconductor film 430 in the transistors 401 to 406 can be replaced by the oxide semiconductor film 430 in FIGS. 19B and 19C or FIGS. 19D and 19E.

Figure 20A:
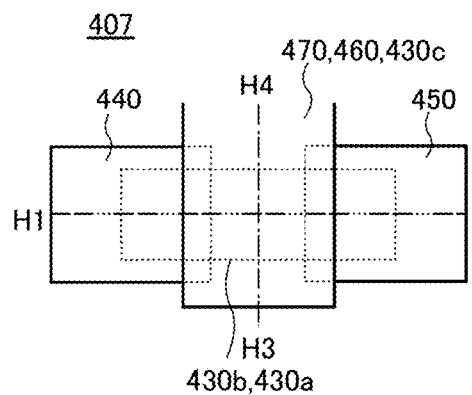
FIGS. 20A to 20F are top views and cross-sectional views illustrating transistors.
Figure 20B:
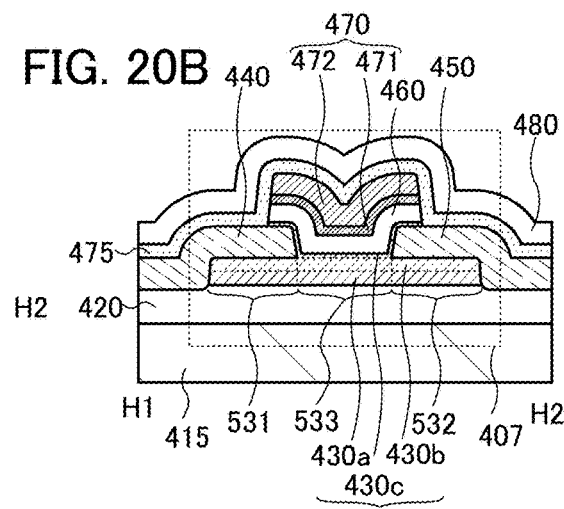
Figure 20C:
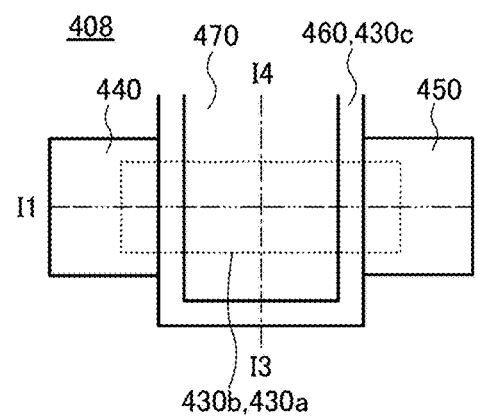
Figure 20D:
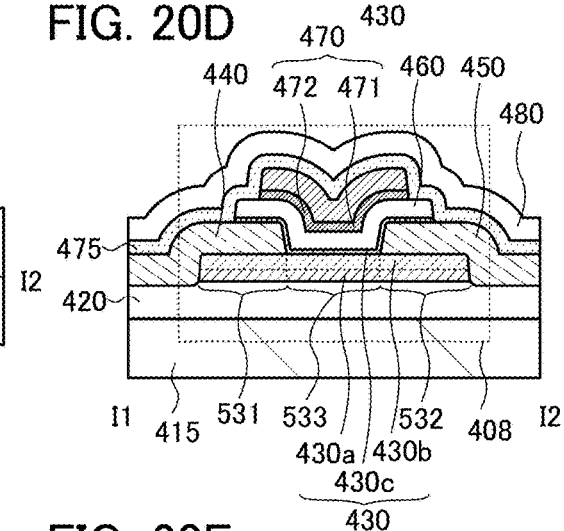
Figure 20E:
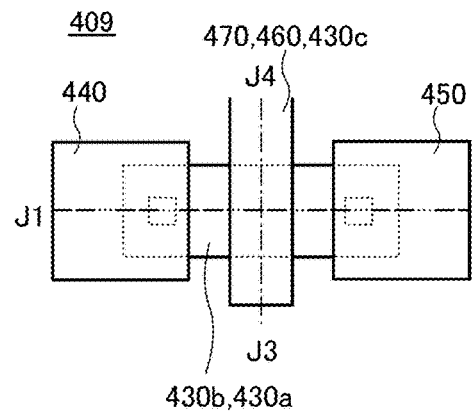
Figure 20F:
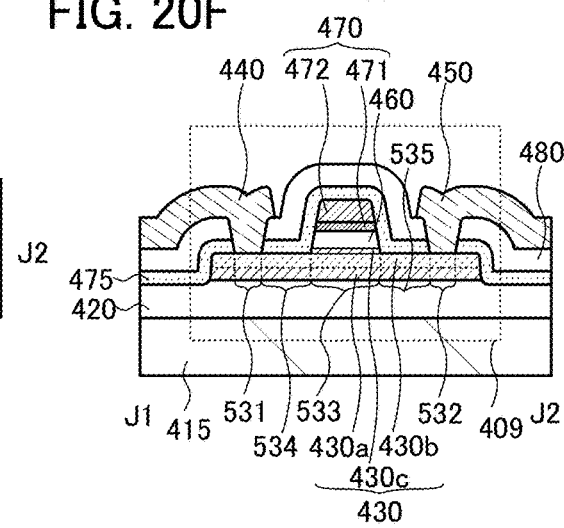
Figure 22A:
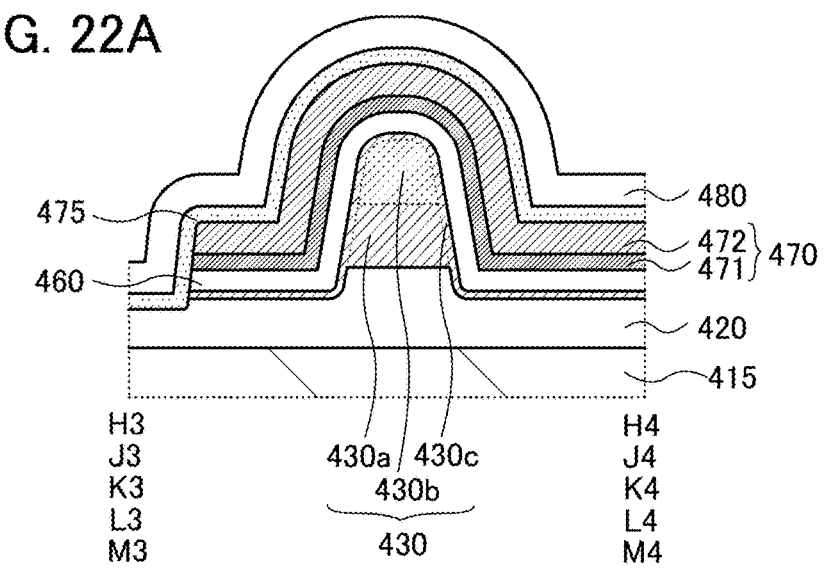
FIGS. 22A to 22D illustrate cross sections of transistors in the channel width direction.
Figure 22B:
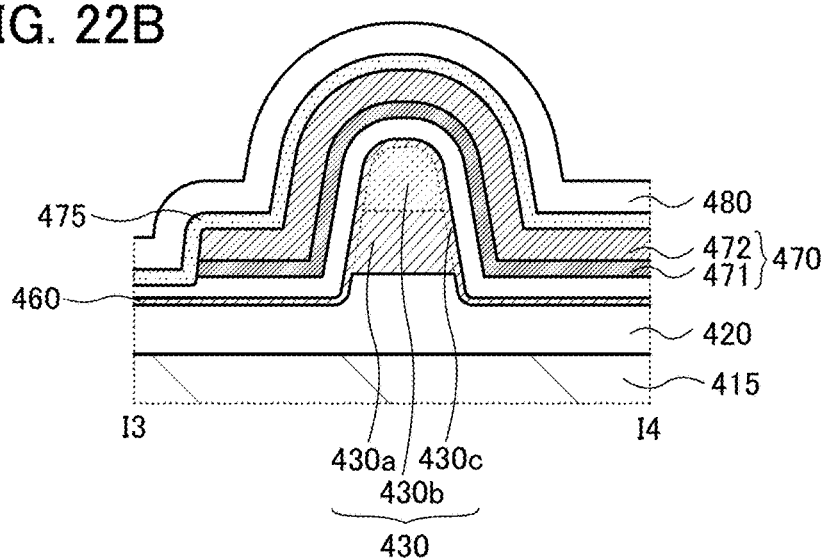

The transistor in one embodiment of the present invention may have a structure illustrated in FIGS. 20A to 20F, FIGS. 21A to 21F, and FIGS. 22A to 22D. FIGS. 20A, 20C, and 20E and FIGS. 21A, 21C, and 21E are top views of transistors 407, 408, 409, 410, 411, and 412, respectively. FIG. 20B is a cross section in the direction of dashed-dotted line H1-H2 in FIG. 20A. FIG. 20D is a cross section in the direction of dashed-dotted line I1-I2 in FIG. 20C. FIG. 20F is a cross section in the direction of dashed-dotted line J1-J2 in FIG. 20E. FIG. 21B is a cross section in the direction of dashed-dotted line K1-K2 in FIG. 21A. FIG. 21D is a cross section in the direction of dashed-dotted line L1-L2 in FIG. 21C. FIG. 21F is a cross section in the direction of dashed-dotted line M1-M2 in FIG. 21E. FIG. 22A illustrates each of cross sections in the directions of dashed-dotted lines H3-H4 in FIG. 20A, J3-J4 in FIG. 20E, K3-K4 in FIG. 21A, L3-L4 in FIG. 22C, and M3-M4 in FIG. 21E. FIG. 22B is a cross section in the direction of dashed-dotted line I3-I4 in FIG. 20C. The directions of dashed-dotted lines H1-H2, I1-I2, J1-J2, K1-K2, L1-L2, and M1-M2 may be each referred to as a channel length direction, and the directions of dashed-dotted lines H3-H4, I3-I4, J3-J4, K3-K4, L3-L4, and M3-M4 may be each referred to as a channel width direction.

The transistors 407 and 408 each have the same structure as the transistors 401 and 402 except that the oxide semiconductor film 430 includes two layers (the oxide semiconductor films 430a and 430b) in the regions 531 and 532, that the oxide semiconductor film 430 includes three layers (the oxide semiconductor films 430a to 430c) in the region 533, and that part of the oxide semiconductor film (the oxide semiconductor film 430c) exists between the insulating film 460 and the conductive films 440 and 450.

The transistors 409, 410, and 412 each have the same structure as the transistors 403, 404, and 406 except that the oxide semiconductor film 430 includes two layers (the oxide semiconductor films 430a and 430b) in the regions 531, 532, 534, and 535 and that the oxide semiconductor film 430 includes three layers (the oxide semiconductor films 430a to 430c) in the region 533.

The transistor 411 has the same structure as the transistor 405 except that the oxide semiconductor film 430 includes two layers (the oxide semiconductor films 430a and 430b) in the regions 531 and 532, that the oxide semiconductor film 430 includes three layers (the oxide semiconductor films 430a to 430c) in the region 533, and that part of the oxide semiconductor film (the oxide semiconductor film 430c) exists between the insulating film 460 and the conductive films 441 and 451.

Figure 18C:
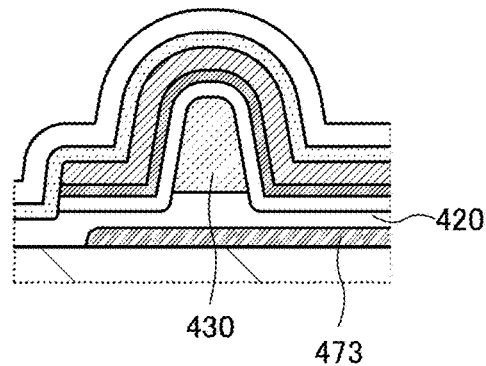
Figure 19A:
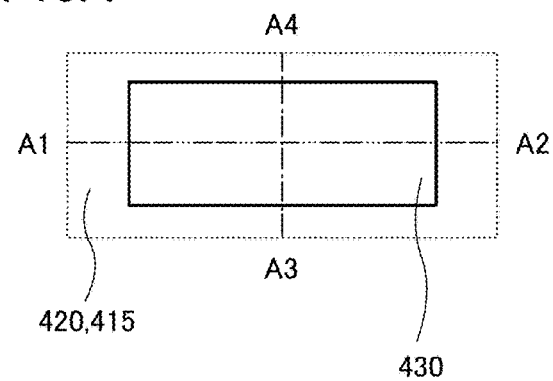
FIGS. 19A to 19E are a top view and cross-sectional views illustrating semiconductor layers.
Figure 19B:
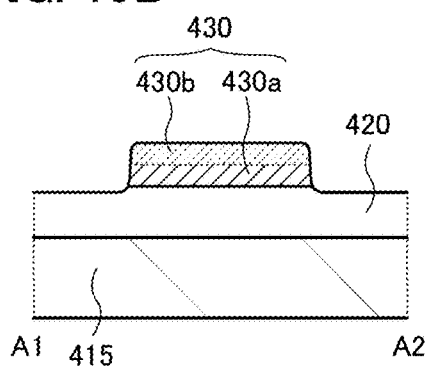
Figure 19D:
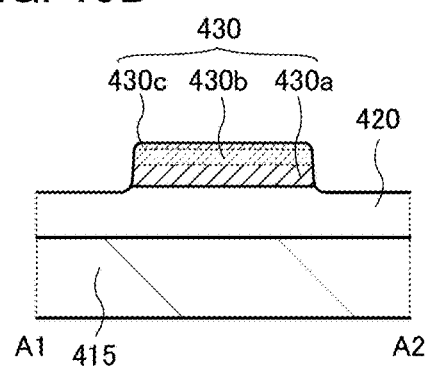
Figure 19C:
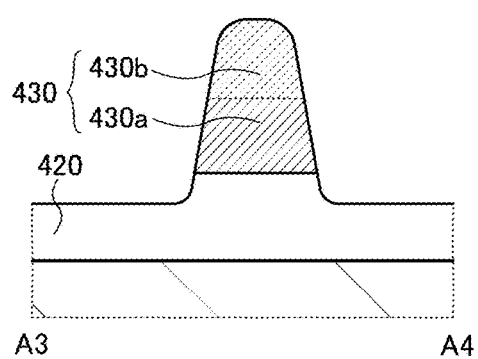
Figure 19E:
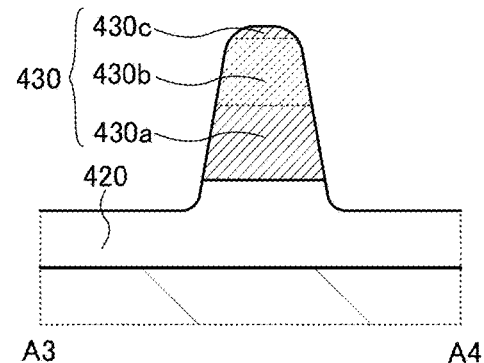
Figure 22C:
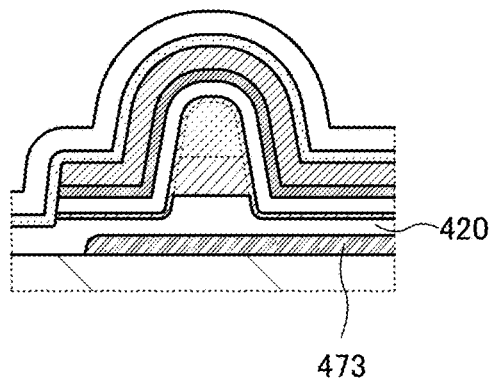

The transistor in one embodiment of the present invention may include a conductive film 473 between the oxide semiconductor film 430 and the substrate 415 as illustrated in cross-sectional views in the channel length directions of the transistors 401 to 412 illustrated in FIGS. 23A to 23F and FIGS. 24A to 24F, the cross-sectional view in the channel width direction of each of the transistors 401 to 406 illustrated in FIG. 18C, and the cross-sectional view in the channel width direction of each of the transistors 407 to 412 illustrated in FIG. 22C. The conductive film 473 is used as a second gate electrode (also referred to as a back gate electrode), whereby the channel formation region in the oxide semiconductor film 430 is electrically surrounded by the conductive films 470 and 473. Such a transistor structure is referred to as a surrounded channel (s-channel) structure. Such a structure can increase the on-state current, and can control the threshold voltage. In the cross-sectional views in FIGS. 23A to 23F and FIGS. 24A to 24F, the width of the conductive film 473 may be smaller than that of the oxide semiconductor film 430. Moreover, the width of the conductive film 473 may be shorter than that of the conductive film 470.

Figure 18D:
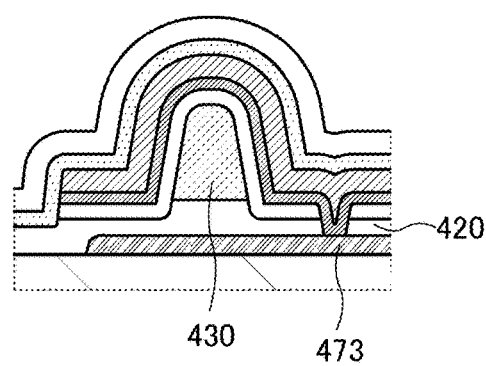
Figure 22D:
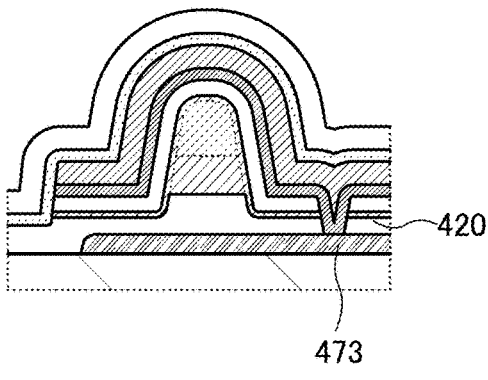
Figure 23A:
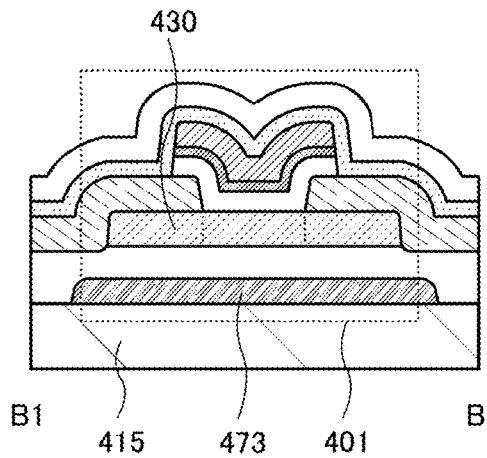
FIGS. 23A to 23F each illustrate a cross section of a transistor in the channel length direction.
Figure 23B:
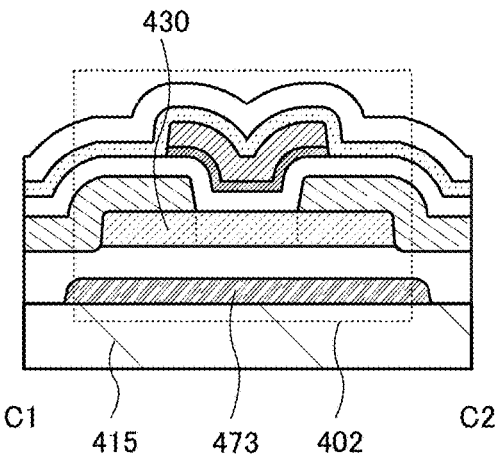
Figure 23C:
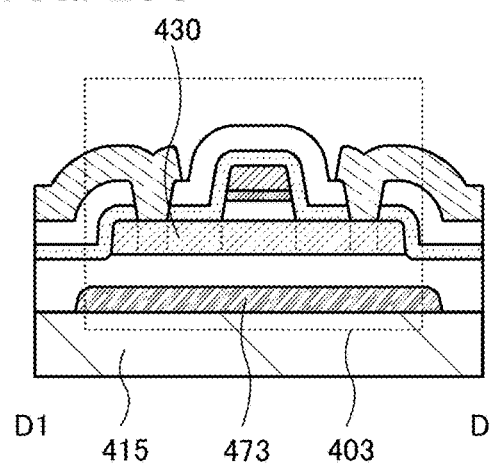
Figure 23D:
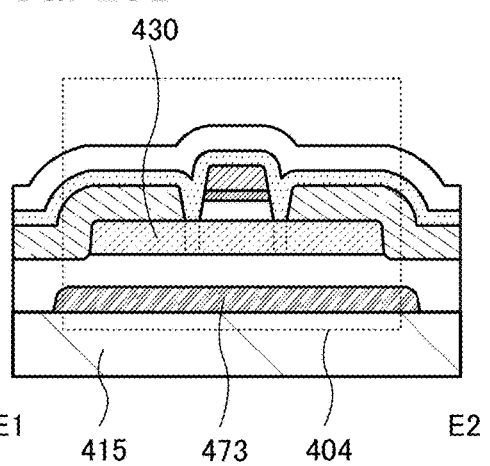
Figure 23E:
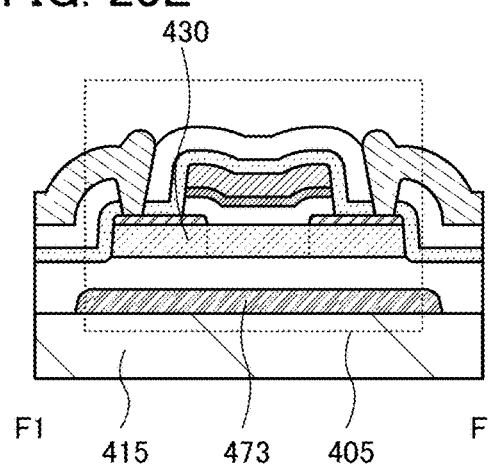
Figure 23F:
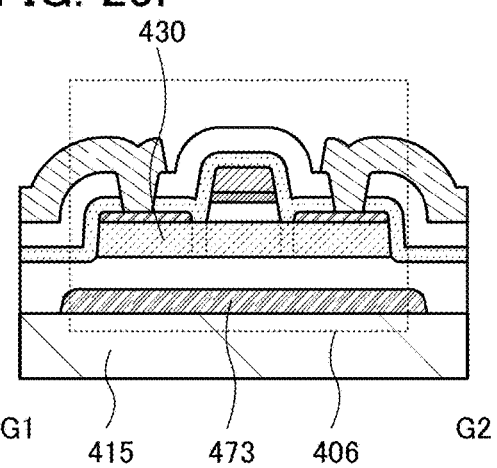
Figure 24A:
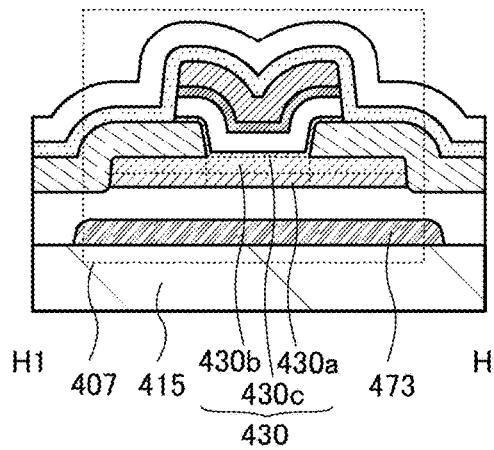
FIGS. 24A to 24F each illustrate a cross section of a transistor in the channel length direction.
Figure 24B:
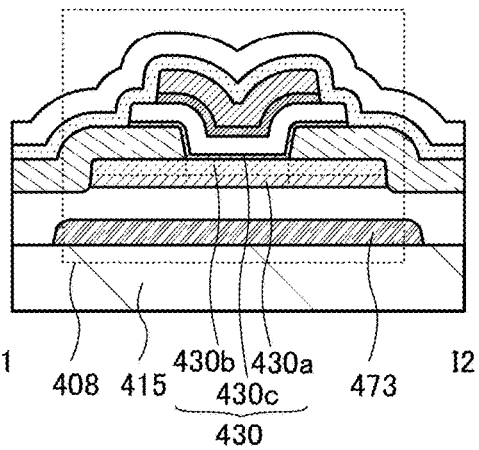
Figure 24C:
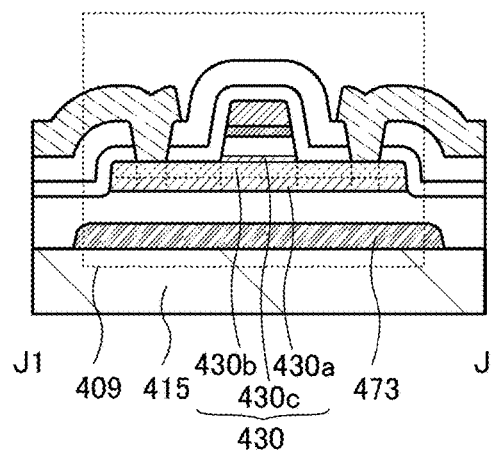
Figure 24D:
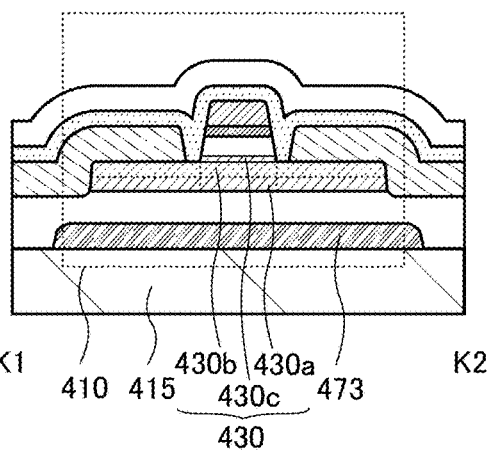
Figure 24E:
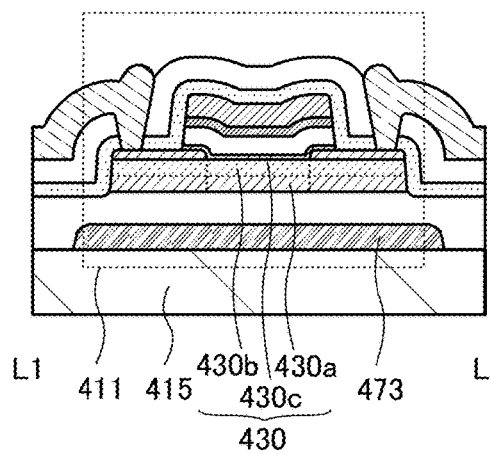
Figure 24F:
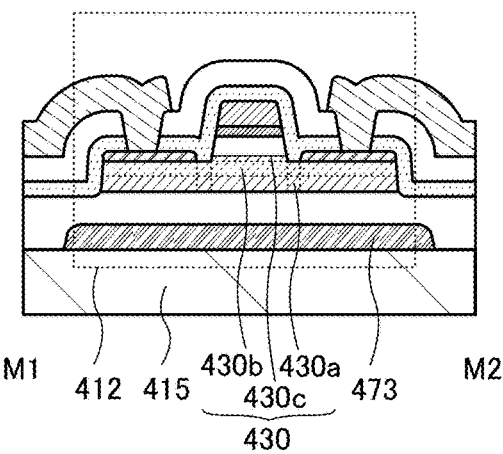

To increase the on-state current, for example, the conductive films 470 and 473 are made to have the same potential, and the transistor is driven as a double-gate transistor. Furthermore, to control the threshold voltage, a fixed potential that is different from the potential of the conductive film 470 is applied to the conductive film 473. To set the conductive films 470 and 473 at the same potential, for example, as illustrated in FIG. 18D and FIG. 22D, the conductive films 470 and 473 may be electrically connected to each other through a contact hole.

Figure 25A:
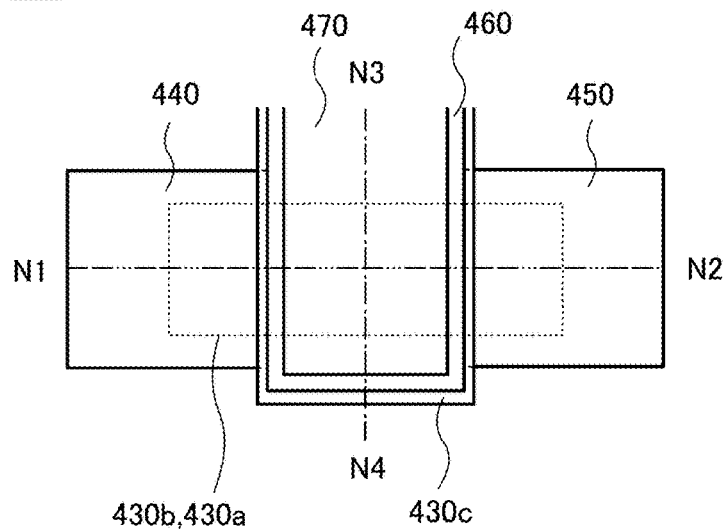
FIGS. 25A to 25C are a top view and cross-sectional views illustrating a transistor.
Figures 25B, 25C:
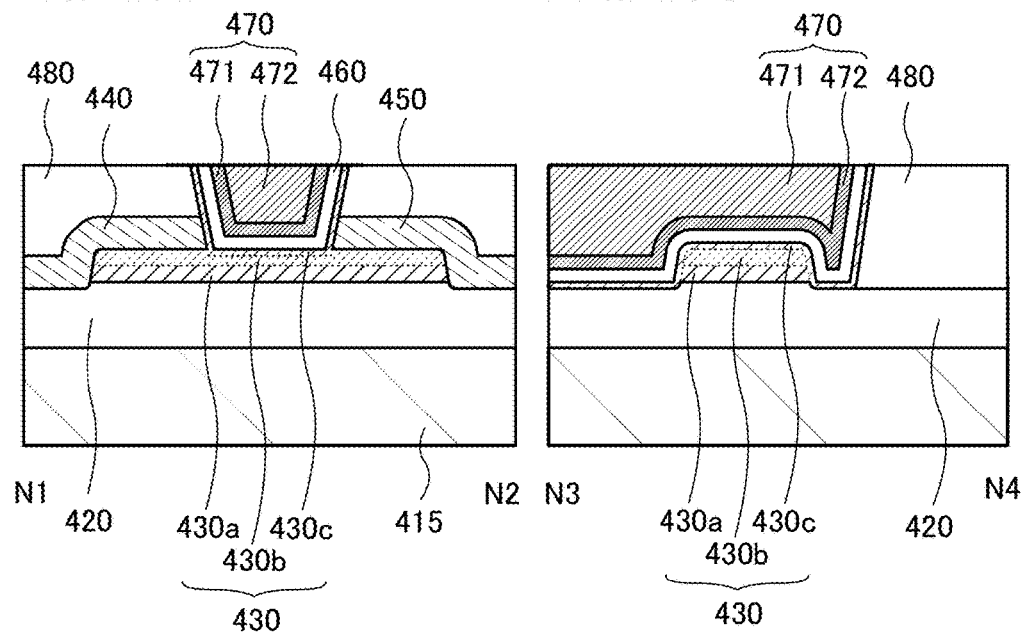

The transistor in one embodiment of the present invention may have a structure illustrated in FIGS. 25A to 25C. FIG. 25A is a top view. FIG. 25B illustrates a cross-sectional view taken along dashed-dotted line N1-N2 in FIG. 25A. FIG. 25C illustrates a cross-sectional view taken along dashed-dotted line N3-N4 in FIG. 25A. Note that for simplification of the drawing, some components are not illustrated in the top view in FIG. 25A.

In a transistor 413, the insulating film 420 is in contact with the substrate 415; the oxide semiconductor film 430 (the oxide semiconductor films 430a to 430c) is in contact with the insulating film 420; the conductive film 440 and the conductive film 450 are in contact with the oxide semiconductor film 430b; the insulating film 460 is in contact with the oxide semiconductor film 430c; the conductive film 470 is in contact with the insulating film 460; and the insulating film 480 is in contact with the insulating film 420, the conductive film 440, and the conductive film 450. Note that the oxide semiconductor film 430c, the insulating film 460, and the conductive film 470 are provided in an opening reaching the oxide semiconductor film 430b in the insulating film 480.

In the transistor 413, a region where the conductive film 470 overlaps with the conductive film 440 or the conductive film 450 is smaller than that in any other transistors described above; thus, the parasitic capacitance in the transistor 413 can be reduced. Accordingly, the transistor 413 is suitable for a component of a circuit that requires high-speed operation. As illustrated in FIGS. 25B and 25C, the transistor 413 is preferably subjected to a chemical mechanical polishing (CMP) method or the like to have a flat top surface, although not necessarily.

Figure 26A:
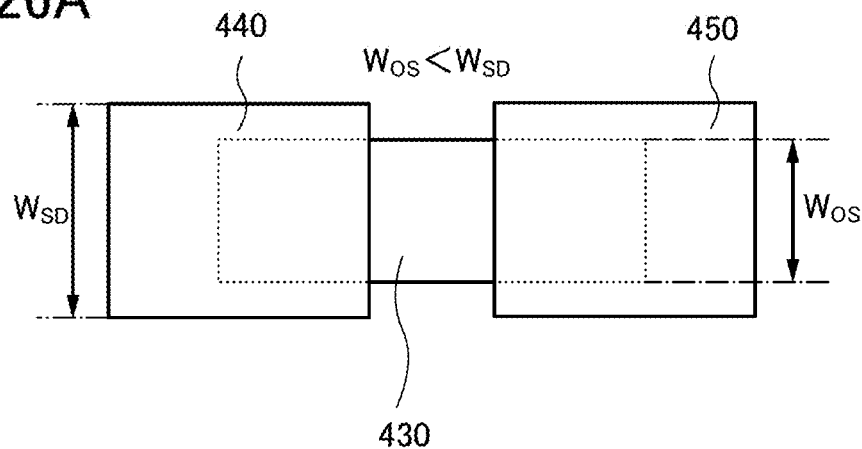
FIGS. 26A to 26C are top views each illustrating a transistor.
Figure 26B:
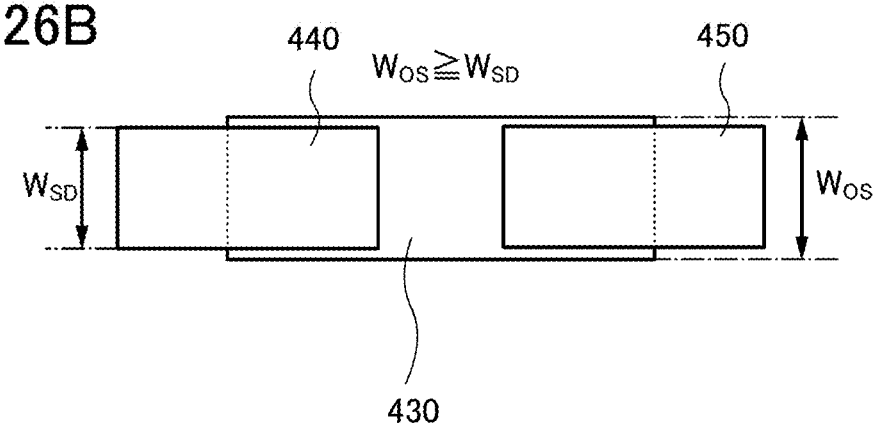
Figure 26C:
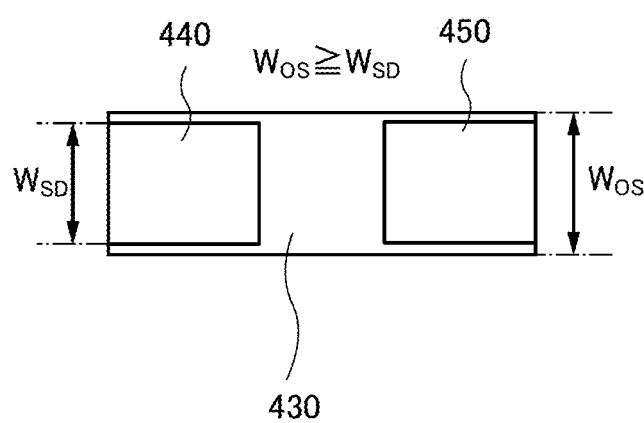

The conductive film 440 and the conductive film 450 in the transistor in one embodiment of the present invention may each have a width ($W_{SD}$) longer than the width ($W_{OS}$) of the oxide semiconductor film as illustrated in the top view in FIG. 26A or shorter as illustrated in the top view in FIG. 26B. When $W_{OS} \geq W_{SD}$ ($W_{SD}$ is less than or equal to $W_{OS}$) is satisfied, a gate electric field is easily applied to the entire oxide semiconductor film 430, so that electrical characteristics of the transistor can be particularly improved. As illustrated in FIG. 26C, the conductive films 440 and 450 may be formed only in regions overlapping with the oxide semiconductor film 430.

Note that FIGS. 26A to 26C only illustrate the oxide semiconductor film 430, the conductive film 440, and the conductive film 450.

In the transistor including the oxide semiconductor films 430a and 430b and the transistor including the oxide semiconductor films 430a to 430c, selecting appropriate materials for the two or three layers forming the oxide semiconductor film 430 makes current flow to the oxide semiconductor film 430b. Since current flows to the oxide semiconductor film 430b, the current is hardly influenced by interface scattering, leading to a high on-state current. Thus, increasing the thickness of the oxide semiconductor film 430b improves the on-state current in some cases.

A semiconductor device including a transistor with any of the above structures can have favorable electrical characteristics.

The structures described in this embodiment can be used in appropriate combination with any of the structures described in the other embodiments.

Embodiment 5

In this embodiment, components of the transistors described in Embodiment 4 will be described in detail.
<Substrate>

As the substrate 415, a glass substrate, a quartz substrate, a semiconductor substrate, a ceramic substrate, a metal substrate with an insulated surface, or the like can be used. Alternatively, a silicon substrate provided with a transistor, a photodiode, or the like can be used, and an insulating film, a wiring, a conductor functioning as a contact plug, and the like may be provided over the silicon substrate. Note that when p-ch transistors are formed using the silicon substrate, a silicon substrate with n⁻-type conductivity is preferably used. Alternatively, an SOI substrate including an n⁻-type or i-type silicon layer may be used. In the case where a p-ch transistor is formed on the silicon substrate, it is preferable to use a silicon substrate in which a plane where the transistor is formed is a (110) plane orientation. Forming a p-ch transistor with the (110) plane can increase mobility.

<Base Insulating Film>

The insulating film 420 functioning as a base insulating film can have a function of supplying oxygen to the oxide semiconductor film 430 in addition to a function of preventing diffusion of impurities from a component included in the substrate 415. For this reason, the insulating film 420 is preferably an insulating film containing oxygen and further preferably, the insulating film 420 is an insulating film containing oxygen in which the oxygen content is higher than that in the stoichiometric composition. For example, the insulating film 420 is a film of which the amount of released oxygen when converted into oxygen atoms is $1.0 \times 10^{19}$ atoms/cm$^3$ or more in thermal desorption spectroscopy (TDS) analysis performed such that the surface temperature of the film is higher than or equal to 100° C. and lower than or equal to 700° C., and preferably higher than or equal to 100° C. and lower than or equal to 500° C. In the case where the substrate 415 is provided with another device, the insulating film 420 also functions as an interlayer insulating film. In that case, the insulating film 420 is preferably subjected to planarization treatment such as CMP treatment so as to have a flat surface.

For example, the insulating film 420 can be formed using an oxide insulating film including aluminum oxide, magnesium oxide, silicon oxide, silicon oxynitride, gallium oxide, germanium oxide, yttrium oxide, zirconium oxide, lanthanum oxide, neodymium oxide, hafnium oxide, tantalum oxide, or the like; a nitride insulating film including silicon nitride, silicon nitride oxide, aluminum nitride, aluminum nitride oxide, or the like; or a mixed material of any of these. The insulating film 420 may be a stack including any of the above materials.

<Oxide Semiconductor Film>

The oxide semiconductor film 430 can have a three-layer structure in which the oxide semiconductor film 430a, the oxide semiconductor film 430b, and the oxide semiconductor film 430c are stacked in this order from the insulating film 420 side.

Note that in the case where the oxide semiconductor film 430 is a single layer, a layer corresponding to the oxide semiconductor film 430b described in this embodiment is used.

In the case where the oxide semiconductor film 430 has a two-layer structure, a stack in which layers corresponding to the oxide semiconductor film 430a and the oxide semiconductor film 430b are sequentially stacked from the insulating film 420 side is used. In such a case, the oxide semiconductor films 430a and 430b can be replaced with each other.

For the oxide semiconductor film 430b, for example, an oxide semiconductor whose electron affinity (an energy difference between a vacuum level and the conduction band minimum) is higher than those of the oxide semiconductor films 430a and 430c is used.

In such a structure, when an electric field is applied to the conductive film 470, a channel is formed in the oxide semiconductor film 430b whose conduction band minimum is the lowest in the oxide semiconductor film 430. Therefore, the oxide semiconductor film 430b can be regarded as having a region serving as a semiconductor, while the oxide semiconductor film 430a and the oxide semiconductor film 430c can be regarded as having a region serving as an insulator or a semi-insulator.

An oxide semiconductor that can be used for each of the oxide semiconductor films 430a to 430c preferably contains at least In or Zn. Both In and Zn are preferably contained. To reduce variations in electrical characteristics of the transistor including the oxide semiconductor, the oxide semiconductor preferably contains a stabilizer in addition to In and Zn.

Examples of a stabilizer include Ga, Sn, Hf, Al, and Zr. Other examples of the stabilizer include lanthanoids such as La, Ce, Pr, Nd, Sm, Eu, Gd, Tb, Dy, Ho, Er, Tm, Yb, and Lu.

The oxide semiconductor films 430a to 430c preferably include crystal parts. In particular, when crystals with c-axis alignment are used, the transistor can have stable electrical characteristics. Moreover, crystals with c-axis alignment are resistant to bending; therefore, using such crystals can improve the reliability of a semiconductor device using a flexible substrate.

<Source Electrode and Drain Electrode>

As the conductive film 440 functioning as a source electrode and the conductive film 450 functioning as a drain electrode, for example, a single layer or a stacked layer formed using a material selected from Al, Cr, Cu, Ta, Ti, Mo, W, Ni, Mn, Nd, and Sc and alloys of any of these metal materials can be used. Typically, it is preferable to use Ti, which is particularly easily bonded to oxygen, or W, which has a high melting point and thus allows subsequent processes to be performed at relatively high temperatures. It is also possible to use a stack including any of the above materials and Cu or an alloy such as Cu—Mn, which has low resistance. In the transistors 405, 406, 411, and 412, for example, it is possible to use W for the conductive films 441 and 451 and use a stacked film of Ti and Al for the conductive films 442 and 452.

The above materials are capable of extracting oxygen from an oxide semiconductor film. Therefore, in a region of the oxide semiconductor film that is in contact with any of the above materials, oxygen is released from the oxide semiconductor film and an oxygen vacancy is formed. Hydrogen slightly contained in the film and the oxygen vacancy are bonded to each other, so that the region is markedly changed to an n-type region. Accordingly, the n-type region can serve as a source or a drain of the transistor.

In the case where W is used for the conductive films 440 and 450, the conductive films 440 and 450 may be doped with nitrogen. Doping with nitrogen can appropriately lower the capability of extracting oxygen and prevent the n-type region from spreading to a channel region. It is possible to prevent the n-type region from spreading to a channel region also by using a stack including W and an n-type semiconductor layer as the conductive films 440 and 450 and putting the n-type semiconductor layer in contact with the oxide semiconductor film. As the n-type semiconductor layer, an In—Ga—Zn oxide, zinc oxide, indium oxide, tin oxide, indium tin oxide, or the like to which nitrogen is added can be used.

<Gate Insulating Film>

The insulating film 460 functioning as a gate insulating film can be formed using an insulating film containing one or more of aluminum oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, and tantalum oxide. The insulating film 460 may be a stack including any of the above materials. The insulating film 460 may contain La, N, Zr, or the like as an impurity.

An example of a layered structure of the insulating film 460 is described. The insulating film 460 includes, for example, oxygen, nitrogen, silicon, or hafnium. Specifically, the insulating film 460 preferably includes hafnium oxide and silicon oxide or silicon oxynitride.

Hafnium oxide and aluminum oxide have higher dielectric constants than those of silicon oxide and silicon oxynitride. Therefore, the insulating film 460 using hafnium oxide or aluminum oxide can have larger thickness than that of the insulating film 460 using silicon oxide, so that leakage current due to tunnel current can be reduced. That is, a transistor with a low off-state current can be provided. Moreover, hafnium oxide with a crystalline structure has a higher dielectric constant than that of hafnium oxide with an amorphous structure. Therefore, it is preferable to use hafnium oxide with a crystalline structure in order to provide a transistor with a low off-state current. Examples of the crystalline structure include a monoclinic crystal structure and a cubic crystal structure. Note that one embodiment of the present invention is not limited to these examples.

For the insulating films 420 and 460 in contact with the oxide semiconductor film 430, a film that releases less nitrogen oxide is preferably used. In the case where the oxide semiconductor is in contact with an insulating film that releases a large amount of nitrogen oxide, the density of states due to nitrogen oxide increases in some cases. For the insulating films 420 and 460, for example, an oxide insulating film such as a silicon oxynitride film or an aluminum oxynitride film that releases less nitrogen oxide can be used.

A silicon oxynitride film that releases less nitrogen oxide is a film of which the amount of released ammonia is larger than the amount of released nitrogen oxide in TDS; the amount of released ammonia is typically greater than or equal to $1\times10^{18}/cm^3$ and less than or equal to $5\times10^{19}/cm^3$. Note that the amount of released ammonia is the amount of ammonia released by heat treatment with which the surface temperature of the film becomes higher than or equal to 50° C. and lower than or equal to 650° C., preferably higher than or equal to 50° C. and lower than or equal to 550° C.

By using the above oxide insulating film for the insulating films 420 and 460, a shift in the threshold voltage of the transistor can be reduced, which leads to reduced fluctuations in the electrical characteristics of the transistor.

<Gate Electrode>

For the conductive film 470 functioning as a gate electrode, for example, a conductive film formed using Al, Ti, Cr, Co, Ni, Cu, Y, Zr, Mo, Ru, Ag, Mn, Nd, Sc, Ta, or W can be used. Alternatively, an alloy or a conductive nitride of any of these materials may be used. Alternatively, a stack including a plurality of materials selected from these materials, alloys of these materials, and conductive nitrides of these materials may be used. As a typical example, tungsten, a stack including tungsten and titanium nitride, or a stack including tungsten and tantalum nitride can be used. Alternatively, Cu or an alloy such as Cu—Mn, which has low resistance, or a stack including any of the above materials and Cu or an alloy such as Cu—Mn may be used. In this embodiment, tantalum nitride is used for the conductive film 471 and tungsten is used for the conductive film 472 to form the conductive film 470.

<Protective Insulating Film>

As the insulating film 475 functioning as a protective insulating film, a silicon nitride film, an aluminum nitride film, or the like containing hydrogen can be used. In the transistors 403, 404, 406, 409, 410, and 412 described in Embodiment 4, when an insulating film containing hydrogen is used as the insulating film 475, part of the oxide semiconductor film can have n-type conductivity. In addition, a nitride insulating film functions as a blocking film against moisture and the like and can improve the reliability of the transistor.

An aluminum oxide film can also be used as the insulating film 475. It is particularly preferable to use an aluminum oxide film as the insulating film 475 in the transistors 401, 402, 405, 407, 408, and 411 described in Embodiment 4. The aluminum oxide film has a significant effect of blocking both oxygen and impurities such as hydrogen and moisture. Accordingly, during and after the manufacturing process of the transistor, the aluminum oxide film can suitably function as a protective film that has effects of preventing entry of impurities such as hydrogen and moisture into the oxide semiconductor film 430, preventing release of oxygen from the oxide semiconductor film, and preventing unnecessary release of oxygen from the insulating film 420. Furthermore, oxygen contained in the aluminum oxide film can be diffused into the oxide semiconductor film.

Furthermore, the insulating film 480 is preferably formed over the insulating film 475. The insulating film 480 can be formed using an insulating film containing one or more of magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, and tantalum oxide. The insulating film 480 may be a stack including any of the above materials.

Here, like the insulating film 420, the insulating film 480 preferably contains oxygen more than that in the stoichiometric composition. Oxygen released from the insulating film 480 can be diffused into the channel formation region in the oxide semiconductor film 430 through the insulating film 460, so that oxygen vacancies formed in the channel formation region can be filled with oxygen. In this manner, stable electrical characteristics of the transistor can be achieved.

High integration of a semiconductor device requires miniaturization of a transistor. However, it is known that miniaturization of a transistor causes deterioration of electrical characteristics of the transistor. In particular, a decrease in channel width causes a reduction in on-state current.

In the transistors 407 to 412 in one embodiment of the present invention, the oxide semiconductor film 430c is formed to cover the oxide semiconductor film 430b where a channel is formed; thus, a channel formation layer is not in contact with the gate insulating film. Accordingly, scattering of carriers at the interface between the channel formation layer and the gate insulating film can be reduced and the on-state current of the transistor can be increased.

In the transistor in one embodiment of the present invention, as described above, the gate electrode (the conductive film 470) is formed to electrically surround the oxide semiconductor film 430 in the channel width direction; accordingly, a gate electric field is applied to the oxide semiconductor film 430 in a direction perpendicular to its side surface in addition to a direction perpendicular to its top surface. In other words, a gate electric field is applied to the entire channel formation layer and an effective channel width is increased, leading to a further increase in on-state current.

<Deposition Method>

Although the variety of films such as the metal films, the semiconductor films, and the inorganic insulating films that are described in this embodiment typically can be formed by sputtering or plasma-enhanced CVD, such films may be formed by another method such as thermal CVD. Examples of the thermal CVD include metal organic chemical vapor deposition (MOCVD) and atomic layer deposition (ALD).

Since plasma is not used for deposition, thermal CVD has an advantage that no defect due to plasma damage is generated.

Deposition by thermal CVD may be performed in such a manner that a source gas and an oxidizer are supplied to the chamber at the same time, the pressure in the chamber is set to an atmospheric pressure or a reduced pressure, and reaction is caused in the vicinity of the substrate or over the substrate.

Deposition by ALD is performed in such a manner that the pressure in a chamber is set to an atmospheric pressure or a reduced pressure, source gases for reaction are introduced into the chamber and reacted, and then the sequence of gas introduction is repeated. An inert gas (e.g., argon or nitrogen) may be introduced as a carrier gas with the source gases. For example, two or more kinds of source gases may be sequentially supplied to the chamber. In that case, after reaction of a first source gas, an inert gas is introduced, and then a second source gas is introduced so that the source gases are not mixed. Alternatively, the first source gas may be exhausted by vacuum evacuation instead of introduction of the inert gas, and then the second source gas may be introduced. The first source gas is adsorbed on the surface of the substrate and reacted to form a first layer, and then, the second source gas introduced is adsorbed on the first layer and reacted. As a result, a second layer is stacked over the first layer, so that a thin film is formed. The sequence of gas introduction is controlled and repeated more than once until desired thickness is obtained, so that a thin film with excellent step coverage can be formed. The thickness of the thin film can be adjusted by the number of repetition times of the sequence of gas introduction; therefore, ALD makes it possible to accurately adjust thickness and thus is suitable for manufacturing a minute FET.

The variety of films such as the metal film, the semiconductor film, and the inorganic insulating film that have been disclosed in the above embodiments can be formed by thermal CVD such as MOCVD or ALD. For example, in the case where an In—Ga—Zn—O layer is formed, trimethylindium ($In(CH_3)_3$), trimethylgallium ($Ga(CH_3)_3$), and dimethylzinc ($Zn(CH_3)_2$) can be used. Without limitation to the above combination, triethylgallium ($Ga(C_2H_5)_3$) can be used instead of trimethylgallium and diethylzinc ($Zn(C_2H_5)_2$) can be used instead of dimethylzinc.

For example, in the case where a hafnium oxide film is formed by a deposition apparatus using ALD, two kinds of gases, i.e., ozone ($O_3$) as an oxidizer and a source material gas which is obtained by vaporizing liquid containing a solvent and a hafnium precursor (hafnium alkoxide and a hafnium amide such as tetrakis(dimethylamide)hafnium (TDMAH, $Hf[N(CH_3)_2]_4$) and tetrakis(ethylmethylamide) hafnium) are used.

For example, in the case where an aluminum oxide film is formed by a deposition apparatus using ALD, two kinds of gases, i.e., $H_2O$ as an oxidizer and a source gas which is obtained by vaporizing liquid containing a solvent and an aluminum precursor (e.g., trimethylaluminum (TMA, $Al(CH_3)_3$)) are used. Examples of another material include tris(dimethylamide)aluminum, triisobutylaluminum, and aluminum tris(2,2,6,6-tetramethyl-3,5-heptanedionate).

For example, in the case where a silicon oxide film is formed by a deposition apparatus using ALD, hexachlorodisilane is adsorbed on a surface where a film is to be formed, and radicals of an oxidizing gas (e.g., $O_2$ or dinitrogen monoxide) are supplied to react with an adsorbate.

For example, in the case where a tungsten film is formed by a deposition apparatus using ALD, a $WF_6$ gas and a $B_2H_6$ gas are sequentially introduced to form an initial tungsten film, and then a $WF_6$ gas and an $H_2$ gas are sequentially introduced to form a tungsten film. Note that an $SiH_4$ gas may be used instead of a $B_2H_6$ gas.

For example, in the case where an oxide semiconductor film, e.g., an In—Ga—Zn—O layer is formed by a deposition apparatus using ALD, an $In(CH_3)_3$ gas and an $O_3$ gas are sequentially introduced to form an In—O layer, a $Ga(CH_3)_3$ gas and an $O_3$ gas are sequentially introduced to form a Ga—O layer, and then a $Zn(CH_3)_2$ gas and an $O_3$ gas are sequentially introduced to form a Zn—O layer. Note that the order of these layers is not limited to this example. A mixed compound layer such as an In—Ga—O layer, an In—Zn—O layer, or a Ga—Zn—O layer may be formed by using these gases. Although an $H_2O$ gas which is obtained by bubbling with an inert gas such as Ar may be used instead of an $O_3$ gas, it is preferable to use an $O_3$ gas, which does not contain H.

A facing-target-type sputtering apparatus can be used for deposition of an oxide semiconductor film. Deposition using the facing-target-type sputtering apparatus can also be referred to as vapor deposition sputtering (VDSP).

When an oxide semiconductor film is deposited using a facing-target-type sputtering apparatus, plasma damage to the oxide semiconductor film at the time of deposition can be reduced. Thus, oxygen vacancies in the film can be reduced. In addition, the use of the facing-target-type sputtering apparatus enables low-pressure deposition. Accordingly, the concentration of impurities (e.g., hydrogen, a rare gas (e.g., argon), and water) in a deposited oxide semiconductor film can be lowered.

The structures described in this embodiment can be used in appropriate combination with any of the structures described in the other embodiments.

Embodiment 6

In this embodiment, the material of an oxide semiconductor that can be used for one embodiment of the present invention will be described.

An oxide semiconductor preferably contains at least indium or zinc. In particular, indium and zinc are preferably contained. In addition, aluminum, gallium, yttrium, tin, or the like is preferably contained. Furthermore, one or more elements selected from boron, silicon, titanium, iron, nickel, germanium, zirconium, molybdenum, lanthanum, cerium, neodymium, hafnium, tantalum, tungsten, magnesium, or the like may be contained.

Here, the case where an oxide semiconductor contains indium, an element M, and zinc is considered. The element M is aluminum, gallium, yttrium, tin, or the like. Alternatively, the element M can be boron, silicon, titanium, iron, nickel, germanium, zirconium, molybdenum, lanthanum, cerium, neodymium, hafnium, tantalum, tungsten, magnesium, or the like. Note that two or more of the above elements may be used in combination as the element M.

First, preferred ranges of the atomic ratio of indium, the element M, and zinc contained in an oxide semiconductor according to the present invention are described with reference to FIGS. 27A to 27C. Note that the proportion of oxygen atoms is not illustrated in FIGS. 27A to 27C. The terms of the atomic ratio of indium, the element M, and zinc contained in the oxide semiconductor are denoted by [In], [M], and [Zn], respectively.

Figure 27A:
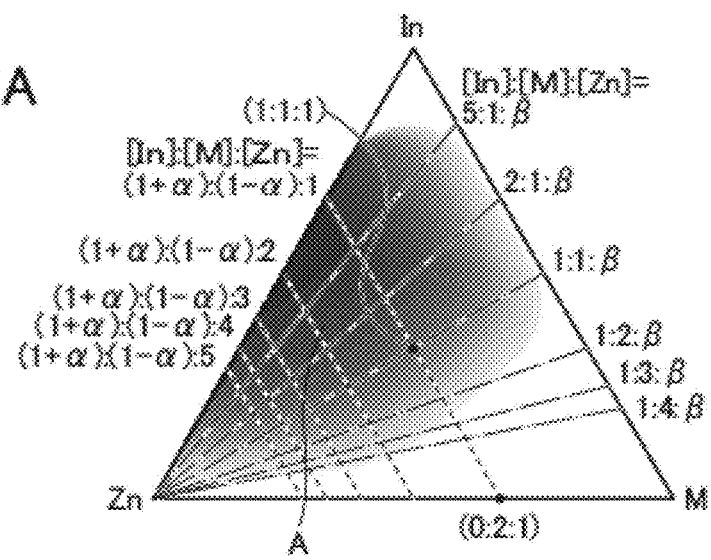
FIGS. 27A to 27C each illustrate an atomic ratio range of an oxide of one embodiment of the present invention.
Figure 27B:
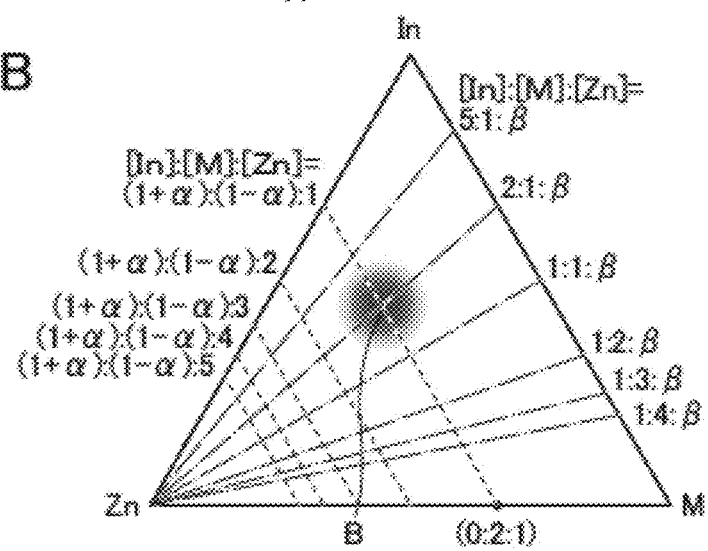
Figure 27C:
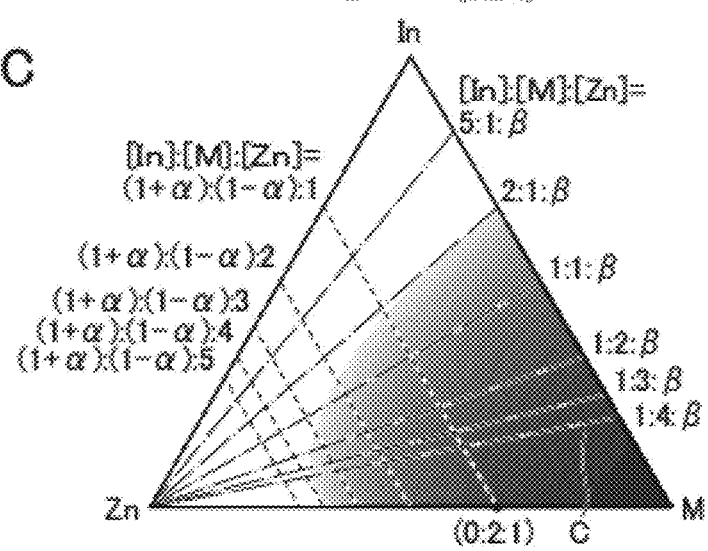

In FIGS. 27A to 27C, broken lines indicate a line where the atomic ratio [In]:[M]: [Zn] is $(1+\alpha):(1-\alpha):1$, where $-1 \leq \alpha \leq 1$, a line where the atomic ratio [In]:[M]:[Zn] is $(1+\alpha):(1-\alpha):2$, a line where the atomic ratio [In]:[M]:[Zn] is $(1+\alpha):(1-\alpha):3$, a line where the atomic ratio [In]:[M]:[Zn] is $(1+\alpha):(1-\alpha):4$, and a line where the atomic ratio [In]:[M]:[Zn] is $(1+\alpha):(1-\alpha):5$.

Dashed-dotted lines indicate a line where the atomic ratio [In]:[M]:[Zn] is $1:1:\beta$, where $\beta \geq 0$, a line where the atomic ratio [In]:[M]:[Zn] is $1:2:\beta$, a line where the atomic ratio [In]:[M]:[Zn] is $1:3:\beta$, a line where the atomic ratio [In]:[M]:[Zn] is $1:4:\beta$, a line where the atomic ratio [In]:[M]:[Zn] is $2:1:\beta$, and a line where the atomic ratio [In]:[M]:[Zn] is $5:1:\beta$.

FIGS. 27A and 27B illustrate examples of the preferred ranges of the atomic ratio of indium, the element M, and zinc contained in an oxide semiconductor in one embodiment of the present invention.

Figure 28:
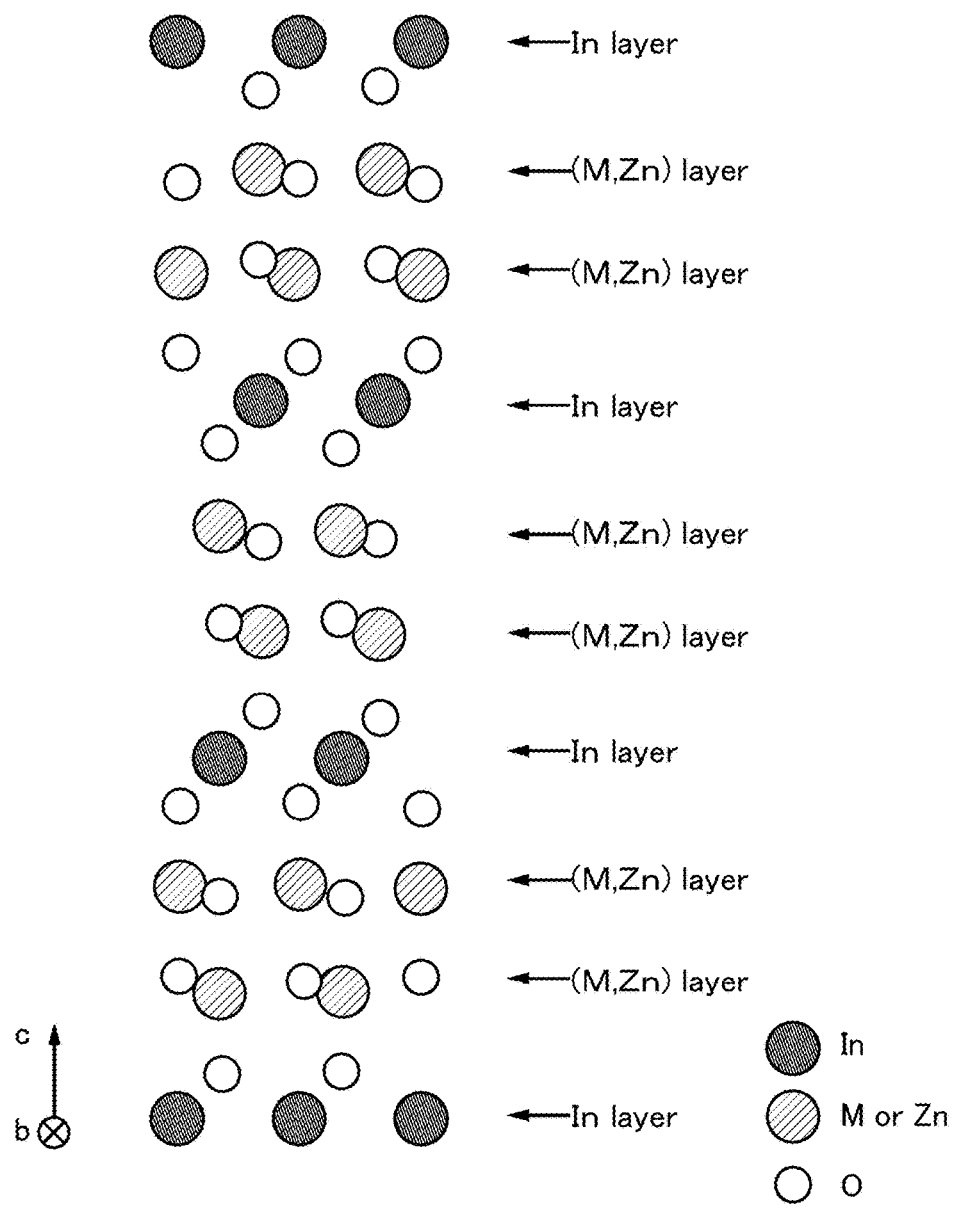
FIG. 28 illustrates a crystal structure of $InMZnO_4$.

FIG. 28 illustrates an example of the crystal structure of InMZnO$_4$ whose atomic ratio [In]:[M]:[Zn] is 1:1:1. The crystal structure illustrated in FIG. 28 is InMZnO$_4$ observed from a direction parallel to a b-axis. Note that a metal element in a layer that contains M, Zn, and oxygen (hereinafter, this layer is referred to as an "(M,Zn) layer") in FIG. 28 represents the element M or zinc. In that case, the proportion of the element M is the same as the proportion of zinc. The element M and zinc can be replaced with each other, and their arrangement is random.

Note that InMZnO$_4$ has a layered crystal structure (also referred to as a layered structure) and includes one layer that contains indium and oxygen (hereinafter referred to as an In layer) for every two (M,Zn) layers that contain the element M, zinc, and oxygen, as illustrated in FIG. 28.

Indium and the element M can be replaced with each other. Therefore, when the element M in the (M,Zn) layer is replaced by indium, the layer can also be referred to as an (In,M,Zn) layer. In that case, a layered structure that includes one In layer for every two (In,M,Zn) layers is obtained.

An oxide semiconductor whose atomic ratio [In]:[M]:[Zn] is 1:1:2 has a layered structure that includes one In layer for every three (M,Zn) layers. In other words, if [Zn] is larger than [In] and [M], the proportion of the (M,Zn) layer to the In layer becomes higher when the oxide semiconductor is crystallized.

Note that in the case where the number of (M,Zn) layers for every In layer is not an integer in the oxide semiconductor, the oxide semiconductor might have plural kinds of layered structures where the number of (M,Zn) layers for every In layer is an integer. For example, in the case of [In]:[M]:[Zn]=1:1:1.5, the oxide semiconductor might have the following layered structures: a layered structure that includes one In layer for every two (M,Zn) layers and a layered structure that includes one In layer for every three (M,Zn) layers.

For example, in the case where the oxide semiconductor is deposited with a sputtering apparatus, a film having an atomic ratio deviated from the atomic ratio of a target is formed. In particular, [Zn] in the film might be smaller than [Zn] in the target depending on the substrate temperature in deposition.

A plurality of phases (e.g., two phases or three phases) exist in the oxide semiconductor in some cases. For example, with an atomic ratio [In]:[M]:[Zn] that is close to 0:2:1, two phases of a spinel crystal structure and a layered crystal structure are likely to exist. In addition, with an atomic ratio [In]:[M]:[Zn] that is close to 1:0:0, two phases of a bixbyite crystal structure and a layered crystal structure are likely to exist. In the case where a plurality of phases exist in the oxide semiconductor, a grain boundary might be formed between different crystal structures.

In addition, the oxide semiconductor containing indium in a higher proportion can have high carrier mobility (electron mobility). This is because in an oxide semiconductor containing indium, the element M, and zinc, the s orbital of heavy metal mainly contributes to carrier transfer, and when the indium content in the oxide semiconductor is increased, overlaps of the s orbitals of indium atoms are increased; therefore, an oxide semiconductor having a high content of indium has higher carrier mobility than that of an oxide semiconductor having a low content of indium.

In contrast, when the indium content and the zinc content in an oxide semiconductor become lower, carrier mobility becomes lower. Thus, with an atomic ratio of [In]:[M]:[Zn]=0:1:0 and the vicinity thereof (e.g., a region C in FIG. 27C), insulation performance becomes better.

Accordingly, an oxide semiconductor in one embodiment of the present invention preferably has an atomic ratio represented by a region A in FIG. 27A. With the atomic ratio, a layered structure with high carrier mobility and a few grain boundaries is easily obtained.

A region B in FIG. 27B represents an atomic ratio of [In]:[M]:[Zn]=4:2:3 to 4:2:4.1 and the vicinity thereof. The vicinity includes an atomic ratio of [In]: [M]:[Zn]=5:3:4. An oxide semiconductor with an atomic ratio represented by the region B is an excellent oxide semiconductor that has particularly high crystallinity and high carrier mobility.

Note that a condition where an oxide semiconductor has a layered structure is not uniquely determined by an atomic ratio. The atomic ratio affects difficulty in forming a layered structure. Even with the same atomic ratio, whether a layered structure is formed or not depends on a formation condition. Therefore, the illustrated regions each represent an atomic ratio with which an oxide semiconductor has a layered structure, and boundaries of the regions A to C are not clear.

Next, the case where the oxide semiconductor is used for a transistor will be described.

Note that when the oxide semiconductor is used for a transistor, carrier scattering or the like at a grain boundary can be reduced; thus, the transistor can have high field-effect mobility. In addition, the transistor can have high reliability.

An oxide semiconductor with low carrier density is preferably used for the transistor. For example, an oxide semiconductor whose carrier density is lower than $8 \times 10^{11}/cm^3$, preferably lower than $1 \times 10^{11}/cm^3$, further preferably lower than $1 \times 10^{10}/cm^3$, and greater than or equal to $1 \times 10^{-9}/cm^3$ is used.

A highly purified intrinsic or substantially highly purified intrinsic oxide semiconductor has few carrier generation sources and thus can have a low carrier density. The highly purified intrinsic or substantially highly purified intrinsic oxide semiconductor has a low density of defect states and accordingly has a low density of trap states in some cases.

Charge trapped by the trap states in the oxide semiconductor takes a long time to be released and may behave like fixed charge. Thus, a transistor whose channel region is formed in an oxide semiconductor having a high density of trap states has unstable electrical characteristics in some cases.

To obtain stable electrical characteristics of the transistor, it is effective to reduce the concentration of impurities in the oxide semiconductor. In addition, to reduce the concentration of impurities in the oxide semiconductor, the concentration of impurities in a film that is adjacent to the oxide semiconductor is preferably reduced. Examples of impurities include hydrogen, nitrogen, alkali metal, alkaline earth metal, iron, nickel, and silicon.

Here, the influence of impurities in the oxide semiconductor will be described.

When silicon or carbon that is one of Group 14 elements is contained in the oxide semiconductor, defect states are formed. Thus, the concentration of silicon or carbon in the oxide semiconductor and around an interface with the oxide semiconductor (measured by secondary ion mass spectrometry (SIMS)) is set lower than or equal to $2 \times 10^{18}$ atoms/cm$^3$, and preferably lower than or equal to $2 \times 10^{17}$ atoms/cm$^3$.

When the oxide semiconductor contains alkali metal or alkaline earth metal, defect states are formed and carriers are generated, in some cases. Thus, a transistor including an oxide semiconductor that contains alkali metal or alkaline earth metal is likely to be normally-on. Therefore, it is preferable to reduce the concentration of alkali metal or alkaline earth metal in the oxide semiconductor. Specifically, the concentration of alkali metal or alkaline earth metal in the oxide semiconductor measured by SIMS is set lower than or equal to $1 \times 10^{18}$ atoms/cm$^3$, and preferably lower than or equal to $2 \times 10^{16}$ atoms/cm$^3$.

When the oxide semiconductor contains nitrogen, the oxide semiconductor easily becomes n-type by generation of electrons serving as carriers and an increase of carrier density. Thus, a transistor whose semiconductor includes nitrogen is likely to be normally-on. For this reason, nitrogen in the oxide semiconductor is preferably reduced as much as possible; the nitrogen concentration measured by SIMS is set, for example, lower than $5 \times 10^{19}$ atoms/cm$^3$, preferably lower than or equal to $5 \times 10^{18}$ atoms/cm$^3$, further preferably lower than or equal to $1 \times 10^{18}$ atoms/cm$^3$, and still further preferably lower than or equal to $5 \times 10^{17}$ atoms/cm$^3$.

Hydrogen contained in an oxide semiconductor reacts with oxygen bonded to a metal atom to be water, and thus causes an oxygen vacancy, in some cases. Due to entry of hydrogen into the oxygen vacancy, an electron serving as a carrier is generated in some cases. Furthermore, in some cases, bonding of part of hydrogen to oxygen bonded to a metal atom causes generation of an electron serving as a carrier. Thus, a transistor including an oxide semiconductor that contains hydrogen is likely to be normally-on. Accordingly, it is preferable that hydrogen in the oxide semiconductor be reduced as much as possible. Specifically, the hydrogen concentration measured by SIMS is set lower than $1 \times 10^{20}$ atoms/cm$^3$, preferably lower than $1 \times 10^{19}$ atoms/cm$^3$, further preferably lower than $5 \times 10^{18}$ atoms/cm$^3$, and still further preferably lower than $1 \times 10^{18}$ atoms/cm$^3$.

When an oxide semiconductor with sufficiently reduced impurity concentration is used for a channel formation region in a transistor, the transistor can have stable electrical characteristics.

Next, the case where the oxide semiconductor has a two-layer structure or a three-layer structure is described. A band diagram of insulators that are in contact with a layered structure of an oxide semiconductor S1, an oxide semiconductor S2, and an oxide semiconductor S3 and a band diagram of insulators that are in contact with a layered structure of the oxide semiconductor S2 and the oxide semiconductor S3 are described with reference to FIGS. 29A and 29B.

Figure 29A:
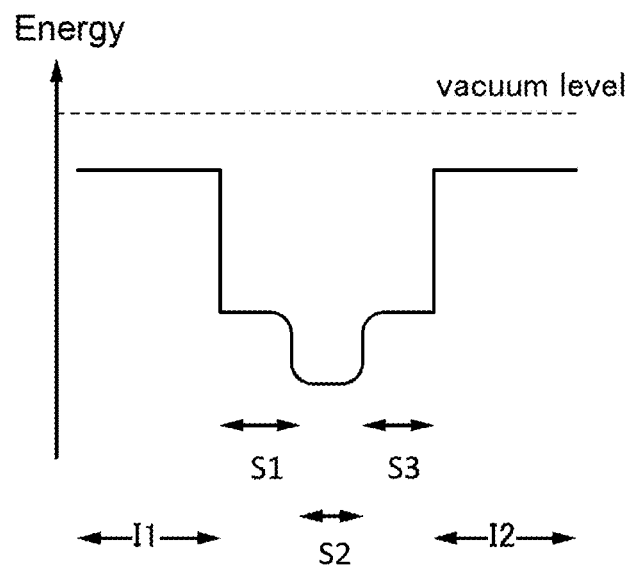
FIGS. 29A and 29B are each a band diagram of a layered structure of oxides.
Figure 29B:
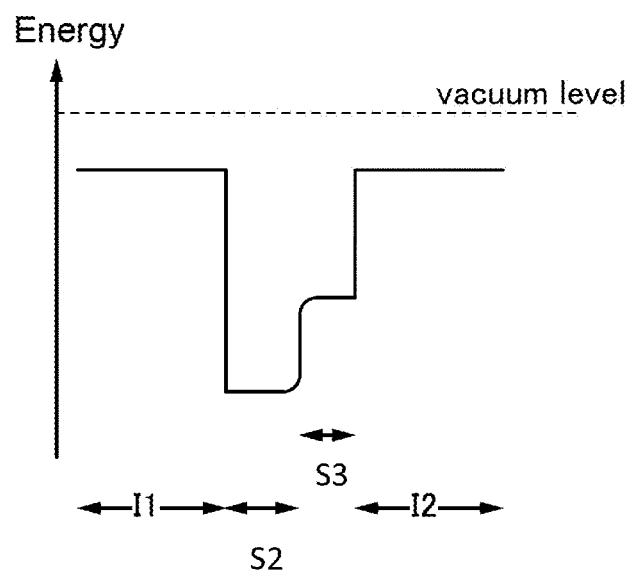

FIG. 29A is an example of a band diagram of a layered structure including an insulator I1, the oxide semiconductor S1, the oxide semiconductor S2, the oxide semiconductor S3, and an insulator I2 in a thickness direction. FIG. 29B is an example of a band diagram of a layered structure including the insulator I1, the oxide semiconductor S2, the oxide semiconductor S3, and the insulator I2 in a thickness direction. Note that for easy understanding, the band diagrams show the conduction band minimum (Ec) of each of the insulator I1, the oxide semiconductor S1, the oxide semiconductor S2, the oxide semiconductor S3, and the insulator I2.

The conduction band minimum of each of the oxide semiconductors S1 and S3 is closer to the vacuum level than that of the oxide semiconductor S2. Typically, a difference between the conduction band minimum of the oxide semiconductor S2 and the conduction band minimum of each of the oxide semiconductors S1 and S3 is preferably greater than or equal to 0.15 eV or greater than or equal to 0.5 eV, and less than or equal to 2 eV or less than or equal to 1 eV. That is, the electron affinity of the oxide semiconductor S2 is higher than the electron affinity of each of the oxide semiconductors S1 and S3, and the difference between the electron affinity of each of the oxide semiconductors S1 and S3 and the electron affinity of the oxide semiconductor S2 is greater than or equal to 0.15 eV or greater than or equal to 0.5 eV, and less than or equal to 2 eV or less than or equal to 1 eV.

As illustrated in FIGS. 29A and 29B, the conduction band minimum of each of the oxide semiconductors S1 to S3 is gradually varied. In other words, the conduction band minimum is continuously varied or continuously connected. To obtain such a band diagram, the density of defect states in a mixed layer formed at an interface between the oxide semiconductors S1 and S2 or an interface between the oxide semiconductors S2 and S3 is preferably made low.

Specifically, when the oxide semiconductors S1 and S2 or the oxide semiconductors S2 and S3 contain the same element (as a main component) in addition to oxygen, a mixed layer with a low density of defect states can be formed. For example, in the case where the oxide semiconductor S2 is an In—Ga—Zn oxide semiconductor, it is preferable to use an In—Ga—Zn oxide semiconductor, a Ga—Zn oxide semiconductor, gallium oxide, or the like as each of the oxide semiconductors S1 and S3.

At this time, the oxide semiconductor S2 serves as a main carrier path. Since the density of defect states at the interface between the oxide semiconductors S1 and S2 and the interface between the oxide semiconductors S2 and S3 can be made low, the influence of interface scattering on carrier conduction is small, and a high on-state current can be obtained.

When an electron is trapped in a trap state, the trapped electron behaves like fixed charge; thus, the threshold voltage of the transistor is shifted in a positive direction. The oxide semiconductors S1 and S3 can make the trap state apart from the oxide semiconductor S2. This structure can prevent the positive shift of the threshold voltage of the transistor.

A material whose conductivity is sufficiently lower than that of the oxide semiconductor S2 is used for the oxide semiconductors S1 and S3. In that case, the oxide semiconductor S2, the interface between the oxide semiconductors S1 and S2, and the interface between the oxide semiconductors S2 and S3 mainly function as a channel region. For example, an oxide semiconductor with high insulation performance and the atomic ratio represented by the region C in FIG. 27C can be used as the oxide semiconductors S1 and S3. Note that the region C in FIG. 27C represents the atomic ratio of [In]:[M]:[Zn]=0:1:0 or the vicinity thereof.

In the case where an oxide semiconductor with the atomic ratio represented by the region A is used as the oxide semiconductor S2, it is particularly preferable to use an oxide semiconductor with [M]/[In] of greater than or equal to 1, preferably greater than or equal to 2, as each of the oxide semiconductors S1 and S3. In addition, it is suitable to use an oxide semiconductor with sufficiently high insulation performance and [M]/([Zn]+[In]) of greater than or equal to 1 as the oxide semiconductor S3.

The structure described above in this embodiment can be combined with any of the structures described in the other embodiments as appropriate.

Embodiment 7

In this embodiment, the material of an oxide semiconductor that can be used for one embodiment of the present invention will be described.

In this specification, the term "parallel" indicates that the angle formed between two straight lines is greater than or equal to −10° and less than or equal to 10°, and accordingly also includes the case where the angle is greater than or equal to −5° and less than or equal to 50. The term "substantially parallel" indicates that the angle formed between two straight lines is greater than or equal to −30° and less than or equal to 30°. The term "perpendicular" indicates that the angle formed between two straight lines is greater than or equal to 80° and less than or equal to 100°, and accordingly includes the case where the angle is greater than or equal to 85° and less than or equal to 95°. The term "substantially perpendicular" indicates that the angle formed between two straight lines is greater than or equal to 60° and less than or equal to 120°.

In this specification, trigonal and rhombohedral crystal systems are included in a hexagonal crystal system.

An oxide semiconductor is classified into a single crystal oxide semiconductor and a non-single-crystal oxide semiconductor. Examples of a non-single-crystal oxide semiconductor include a c-axis aligned crystalline oxide semiconductor (CAAC-OS), a polycrystalline oxide semiconductor, a nanocrystalline oxide semiconductor (nc-OS), an amorphous-like oxide semiconductor (a-like OS), and an amorphous oxide semiconductor.

From another perspective, an oxide semiconductor is classified into an amorphous oxide semiconductor and a crystalline oxide semiconductor. Examples of a crystalline oxide semiconductor include a single crystal oxide semiconductor, a CAAC-OS, a polycrystalline oxide semiconductor, and an nc-OS.

An amorphous structure is generally thought to be isotropic and have no non-uniform structure, to be metastable and have no fixed positions of atoms, to have a flexible bond angle, and to have a short-range order but have no long-range order, for example.

In other words, a stable oxide semiconductor cannot be regarded as a completely amorphous oxide semiconductor. Moreover, an oxide semiconductor that is not isotropic (e.g., an oxide semiconductor that has a periodic structure in a microscopic region) cannot be regarded as a completely amorphous oxide semiconductor. In contrast, an a-like OS, which is not isotropic, has an unstable structure that contains a void. Because of its instability, an a-like OS is close to an amorphous oxide semiconductor in terms of physical properties.

<CAAC-OS>

First, a CAAC-OS will be described.

A CAAC-OS is one of oxide semiconductors having a plurality of c-axis aligned crystal parts (also referred to as pellets).

Figure 30A:
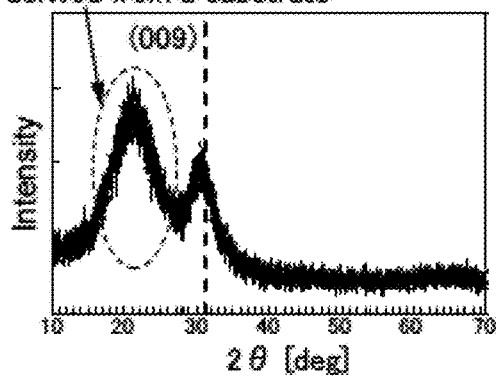
FIGS. 30A to 30E show structural analysis of a CAAC-OS and a single crystal oxide semiconductor by XRD and selected-area electron diffraction patterns of a CAAC-OS.

Analysis of a CAAC-OS by X-ray diffraction (XRD) is described. For example, when the structure of a CAAC-OS including an InGaZnO$_4$ crystal that is classified into the space group R−3 m is analyzed by an out-of-plane method, a peak appears at a diffraction angle (2θ) of around 31° as shown in FIG. 30A. This peak is derived from the (009) plane of the InGaZnO$_4$ crystal, which indicates that crystals in the CAAC-OS have c-axis alignment, and that the c-axes are aligned in a direction substantially perpendicular to a surface over which the CAAC-OS film is formed (also referred to as a formation surface) or the top surface of the CAAC-OS film. Note that a peak sometimes appears at a 2θ of around 36° in addition to the peak at a 2θ of around 31°. The peak at a 2θ of around 36° is derived from a crystal structure that is classified into the space group Fd−3 m; thus, this peak is preferably not exhibited in a CAAC-OS.

Figure 30B:
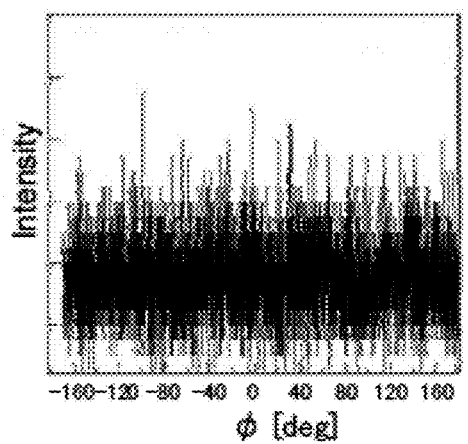
Figure 30C:
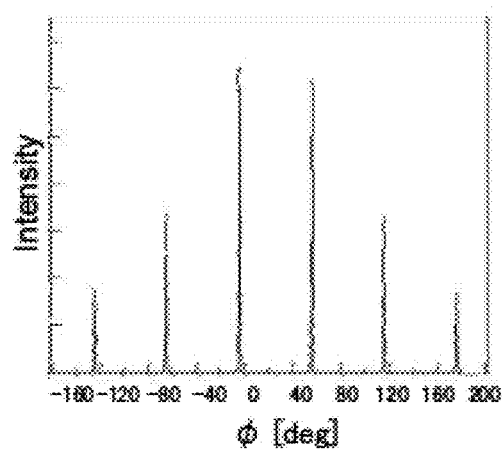

On the other hand, in structural analysis of the CAAC-OS by an in-plane method in which an X-ray is incident on the CAAC-OS in a direction parallel to the formation surface, a peak appears at a 2θ of around 56°. This peak is attributed to the (110) plane of the InGaZnO$_4$ crystal. When analysis (φ scan) is performed with 2θ fixed at around 56° and with the sample rotated using a normal vector to the sample surface as an axis (φ axis), as shown in FIG. 30B, a peak is not clearly observed. In contrast, in the case where single crystal InGaZnO$_4$ is subjected to φ scan with 2θ fixed at around 56°, as shown in FIG. 30C, six peaks that are derived from crystal planes equivalent to the (110) plane are observed. Accordingly, the structural analysis using XRD shows that the directions of a-axes and b-axes are irregularly oriented in the CAAC-OS.

Figure 30D:
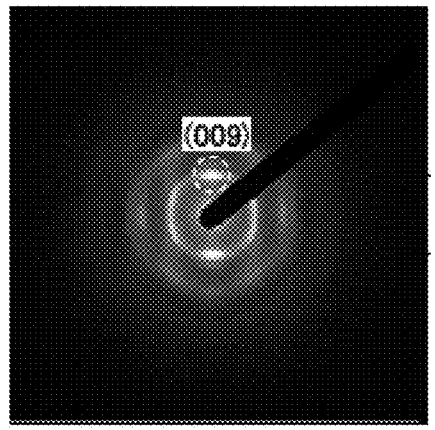
Figure 30E:
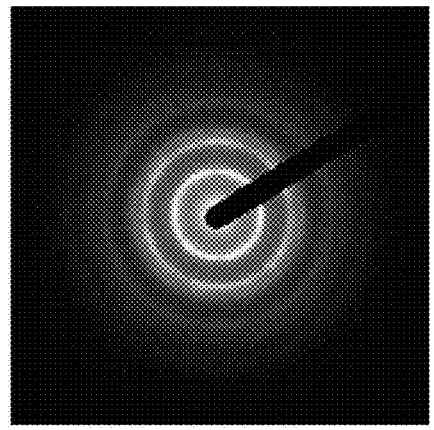

Next, a CAAC-OS analyzed by electron diffraction is described. For example, when an electron beam with a probe diameter of 300 nm is incident on a CAAC-OS including an InGaZnO$_4$ crystal in a direction parallel to the formation surface of the CAAC-OS, a diffraction pattern (also referred to as a selected-area electron diffraction pattern) shown in FIG. 30D can be obtained. In this diffraction pattern, spots derived from the (009) plane of an InGaZnO$_4$ crystal are included. Thus, the electron diffraction also indicates that pellets included in the CAAC-OS have c-axis alignment and that the c-axes are aligned in a direction substantially perpendicular to the formation surface or the top surface of the CAAC-OS. Meanwhile, FIG. 30E shows a diffraction pattern obtained in such a manner that an electron beam with a probe diameter of 300 nm is incident on the same sample in a direction perpendicular to the sample surface. As shown in FIG. 30E, a ring-like diffraction pattern is observed. Thus, the electron diffraction using an electron beam with a probe diameter of 300 nm also indicates that the a-axes and b-axes of the pellets included in the CAAC-OS do not have regular orientation. The first ring in FIG. 30E is considered to be derived from the (010) plane, the (100) plane, and the like of the InGaZnO$_4$ crystal. The second ring in FIG. 30E is considered to be derived from the (110) plane and the like.

In a combined analysis image (also referred to as a high-resolution TEM image) of a bright-field image and a diffraction pattern of a CAAC-OS, which is obtained using a transmission electron microscope (TEM), a plurality of pellets can be observed. However, in the high-resolution TEM image, a boundary between pellets, that is, a grain boundary is not clearly observed in some cases. Thus, in the CAAC-OS, a reduction in electron mobility due to the grain boundary is less likely to occur.

Figure 31A:
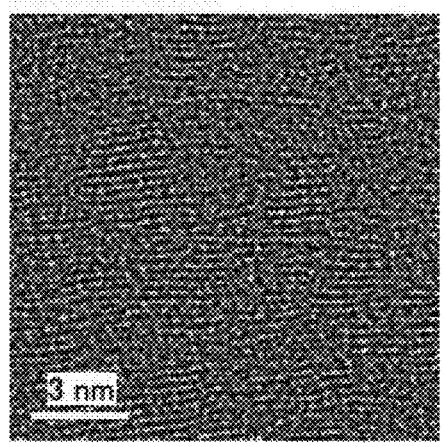
FIGS. 31A to 31E show a cross-sectional TEM image and plan-view TEM images of a CAAC-OS and images obtained through analysis thereof.

FIG. 31A shows a high-resolution TEM image of a cross section of the CAAC-OS that is observed from a direction substantially parallel to the sample surface. The high-resolution TEM image is obtained with a spherical aberration corrector function. The high-resolution TEM image obtained with a spherical aberration corrector function is particularly referred to as a Cs-corrected high-resolution TEM image. The Cs-corrected high-resolution TEM image can be observed with, for example, an atomic resolution analytical electron microscope JEM-ARM200F manufactured by JEOL Ltd.

FIG. 31A shows pellets in which metal atoms are arranged in a layered manner. FIG. 31A proves that the size of a pellet is greater than or equal to 1 nm or greater than or equal to 3 nm. Therefore, the pellet can also be referred to as a nanocrystal (nc). Furthermore, the CAAC-OS can also be referred to as an oxide semiconductor including c-axis aligned nanocrystals (CANC). A pellet reflects unevenness of a formation surface or a top surface of the CAAC-OS, and is parallel to the formation surface or the top surface of the CAAC-OS.

Figure 31B:
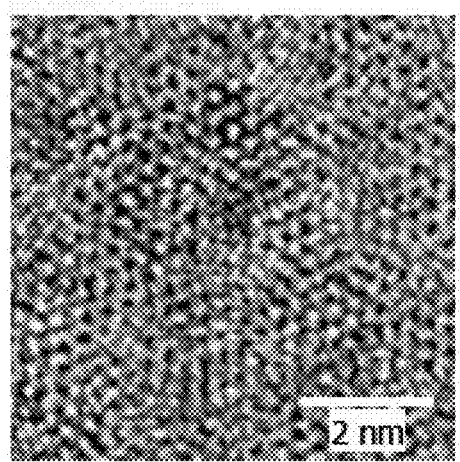
Figure 31C:
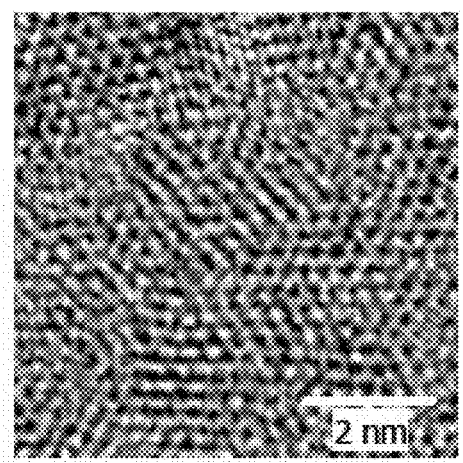
Figure 31D:
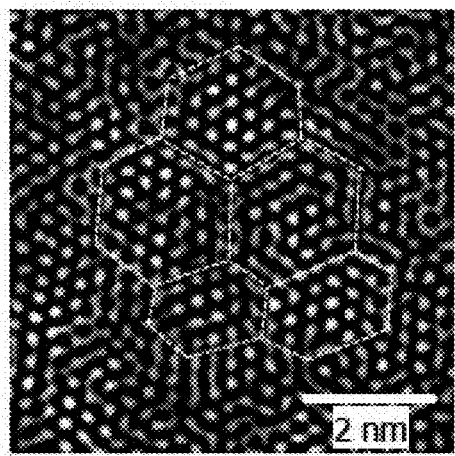
Figure 31E:
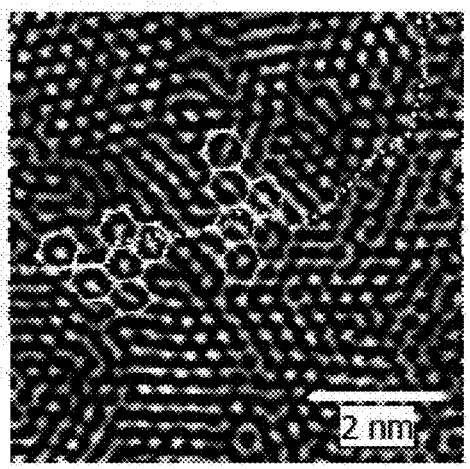

FIGS. 31B and 31C show Cs-corrected high-resolution TEM images of a plane of the CAAC-OS observed from a direction substantially perpendicular to the sample surface. FIGS. 31D and 31E are images obtained through image processing of FIGS. 31B and 31C. The method of image processing is as follows. The image in FIG. 31B is subjected to fast Fourier transform (FFT), so that an FFT image is obtained. Then, mask processing is performed such that a range of from 2.8 $nm^{-1}$ to 5.0 $nm^{-1}$ from the origin in the obtained FFT image remains. After the mask processing, the FFT image is processed by inverse fast Fourier transform (IFFT) to obtain a processed image. The image obtained in this manner is called an FFT filtering image. The FFT filtering image is a Cs-corrected high-resolution TEM image from which a periodic component is extracted, and shows a lattice arrangement.

In FIG. 31D, a portion where a lattice arrangement is broken is denoted with a dashed line. A region surrounded by a dashed line is one pellet. The portion denoted with the dashed line is a junction of pellets. The dashed line draws a hexagon, which means that the pellet has a hexagonal shape. Note that the shape of the pellet is not always a regular hexagon but is a non-regular hexagon in many cases.

In FIG. 31E, a dotted line denotes a portion where the direction of a lattice arrangement changes between a region with a regular lattice arrangement and another region with a regular lattice arrangement. A clear crystal grain boundary cannot be observed even in the vicinity of the dotted line. When a lattice point in the vicinity of the dotted line is regarded as a center and surrounding lattice points are joined, a distorted hexagon, pentagon, and/or heptagon can be formed, for example. That is, a lattice arrangement is distorted so that formation of a crystal grain boundary is inhibited. This is probably because the CAAC-OS can tolerate distortion owing to a low density of the atomic arrangement in an a-b plane direction, an interatomic bond distance changed by substitution of a metal element, and the like.

As described above, the CAAC-OS has c-axis alignment, its pellets (nanocrystals) are connected in an a-b plane direction, and the crystal structure has distortion. For this reason, the CAAC-OS can also be referred to as an oxide semiconductor including a c-axis-aligned a-b-plane-anchored (CAA) crystal.

The CAAC-OS is an oxide semiconductor with high crystallinity. Entry of impurities, formation of defects, or the like might decrease the crystallinity of an oxide semiconductor. This means that the CAAC-OS has small amounts of impurities and defects (e.g., oxygen vacancies).

Note that the impurity means an element other than the main components of the oxide semiconductor, such as hydrogen, carbon, silicon, or a transition metal element. For example, an element (specifically, silicon or the like) having higher strength of bonding to oxygen than a metal element included in an oxide semiconductor extracts oxygen from the oxide semiconductor, which results in disorder of the atomic arrangement and reduced crystallinity of the oxide semiconductor. A heavy metal such as iron or nickel, argon, carbon dioxide, or the like has a large atomic radius (or molecular radius), and thus disturbs the atomic arrangement of the oxide semiconductor and decreases crystallinity.

<nc-OS>

Next, an nc-OS will be described.

Analysis of an nc-OS by XRD is described. When the structure of an nc-OS is analyzed by an out-of-plane method, a peak indicating orientation does not appear. That is, a crystal of an nc-OS does not have orientation.

Figure 32A:
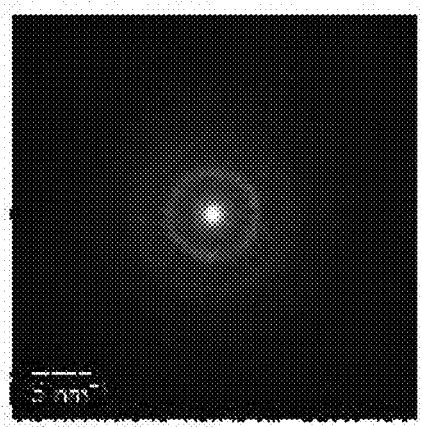
FIGS. 32A to 32D show electron diffraction patterns and a cross-sectional TEM image of an nc-OS.
Figure 32B:
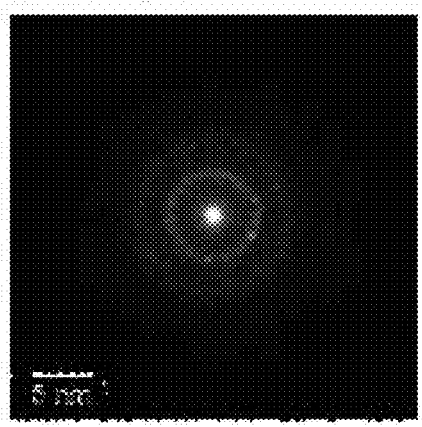

For example, when an electron beam with a probe diameter of 50 nm is incident on a 34-nm-thick region of thinned nc-OS including an $InGaZnO_4$ crystal in a direction parallel to the formation surface, a ring-shaped diffraction pattern (a nanobeam electron diffraction pattern) shown in FIG. 32A is observed. FIG. 32B shows a diffraction pattern obtained when an electron beam with a probe diameter of 1 nm is incident on the same sample. As shown in FIG. 32B, a plurality of spots are observed in a ring-like region. In other words, ordering in an nc-OS is not observed with an electron beam with a probe diameter of 50 nm but is observed with an electron beam with a probe diameter of 1 nm.

Figure 32C:
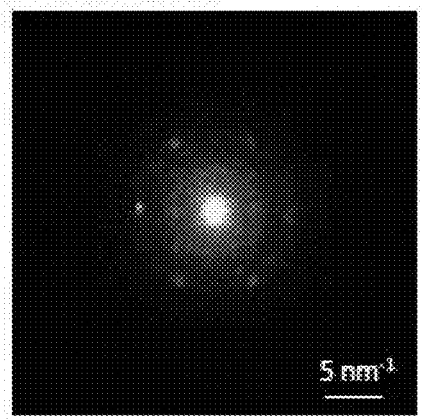

Furthermore, an electron diffraction pattern in which spots are arranged in an approximately regular hexagonal shape is observed in some cases as shown in FIG. 32C when an electron beam having a probe diameter of 1 nm is incident on a region with a thickness of less than 10 nm. This means that an nc-OS has a well-ordered region, i.e., a crystal, in the range of less than 10 nm in thickness. Note that an electron diffraction pattern having regularity is not observed in some regions because crystals are aligned in various directions.

Figure 32D:
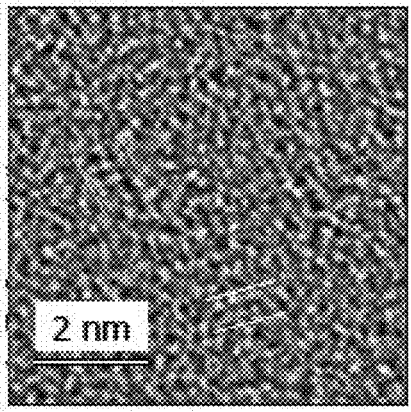

FIG. 32D shows a Cs-corrected high-resolution TEM image of a cross section of an nc-OS observed from the direction substantially parallel to the formation surface. In a high-resolution TEM image, an nc-OS has a region in which a crystal part is observed, such as the part indicated by additional lines in FIG. 32D, and a region in which a crystal part is not clearly observed. In most cases, the size of a crystal part included in the nc-OS is greater than or equal to 1 nm and less than or equal to 10 nm, or specifically, greater than or equal to 1 nm and less than or equal to 3 nm. Note that an oxide semiconductor including a crystal part whose size is greater than 10 nm and less than or equal to 100 nm is sometimes referred to as a microcrystalline oxide semiconductor. In a high-resolution TEM image of the nc-OS, for example, a grain boundary is not clearly observed in some cases. Note that there is a possibility that the origin of the nanocrystal is the same as that of a pellet in a CAAC-OS. Therefore, a crystal part of the nc-OS may be referred to as a pellet in the following description.

As described above, in the nc-OS, a microscopic region (for example, a region with a size greater than or equal to 1 nm and less than or equal to 10 nm, in particular, a region with a size greater than or equal to 1 nm and less than or equal to 3 nm) has a periodic atomic arrangement. There is no regularity of crystal orientation between different pellets in the nc-OS. Thus, the orientation of the whole film is not ordered. Accordingly, the nc-OS cannot be distinguished from an a-like OS or an amorphous oxide semiconductor, depending on an analysis method.

Since there is no regularity of crystal orientation between the pellets (nanocrystals) as mentioned above, the nc-OS can also be referred to as an oxide semiconductor including random aligned nanocrystals (RANC) or an oxide semiconductor including non-aligned nanocrystals (NANC).

The nc-OS is an oxide semiconductor that has high regularity as compared with an amorphous oxide semiconductor. Therefore, the nc-OS is likely to have a lower density of defect states than an a-like OS and an amorphous oxide semiconductor. Note that there is no regularity of crystal orientation between different pellets in the nc-OS. Therefore, the nc-OS has a higher density of defect states than the CAAC-OS.

<a-Like OS>

An a-like OS has a structure intermediate between those of the nc-OS and the amorphous oxide semiconductor.

Figure 33A:
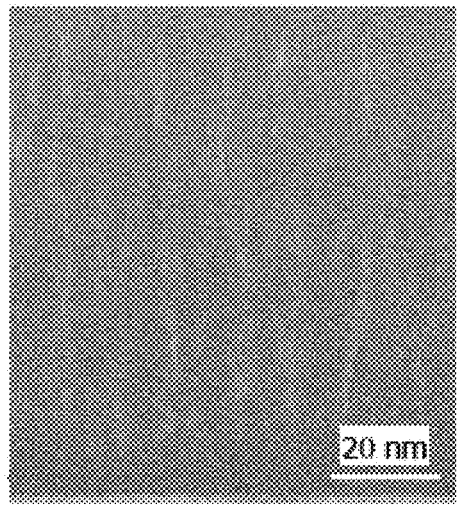
FIGS. 33A and 33B are cross-sectional TEM images of an a-like OS.
Figure 33B:
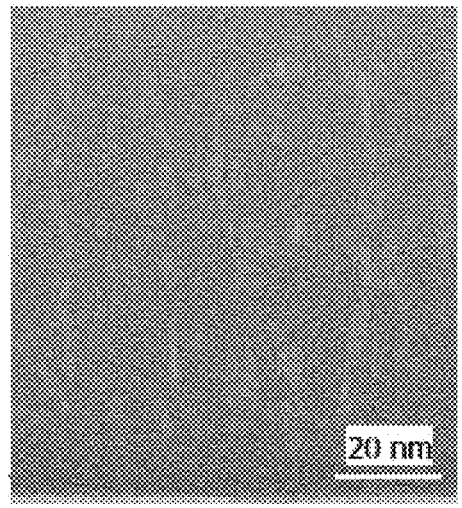

FIGS. 33A and 33B are high-resolution cross-sectional TEM images of an a-like OS. FIG. 33A is the high-resolution cross-sectional TEM image of the a-like OS at the start of the electron irradiation. FIG. 33B is the high-resolution cross-sectional TEM image of the a-like OS after the electron (e) irradiation at $4.3 \times 10^8$ e$^-$/nm$^2$. FIGS. 33A and 33B show that stripe-like bright regions extending vertically are observed in the a-like OS from the start of the electron irradiation. It can be also found that the shape of the bright region changes after the electron irradiation. Note that the bright region is presumably a void or a low-density region.

The a-like OS has an unstable structure because it contains a void. To verify that an a-like OS has an unstable structure as compared with a CAAC-OS and an nc-OS, a change in structure caused by electron irradiation is described below.

An a-like OS, an nc-OS, and a CAAC-OS are prepared as samples. Each of the samples is an In—Ga—Zn oxide.

First, a high-resolution cross-sectional TEM image of each sample is obtained. The high-resolution cross-sectional TEM images show that all the samples have crystal parts.

It is known that a unit cell of an InGaZnO$_4$ crystal has a structure in which nine layers including three In—O layers and six Ga—Zn—O layers are stacked in the c-axis direction. The distance between the adjacent layers is equivalent to the lattice spacing on the (009) plane (also referred to as d value). The value is calculated to be 0.29 nm from crystal structural analysis. Accordingly, a portion where the spacing between lattice fringes is greater than or equal to 0.28 nm and less than or equal to 0.30 nm is regarded as a crystal part of InGaZnO$_4$ in the following description. Each of lattice fringes corresponds to the a-b plane of the InGaZnO$_4$ crystal.

Figure 34:
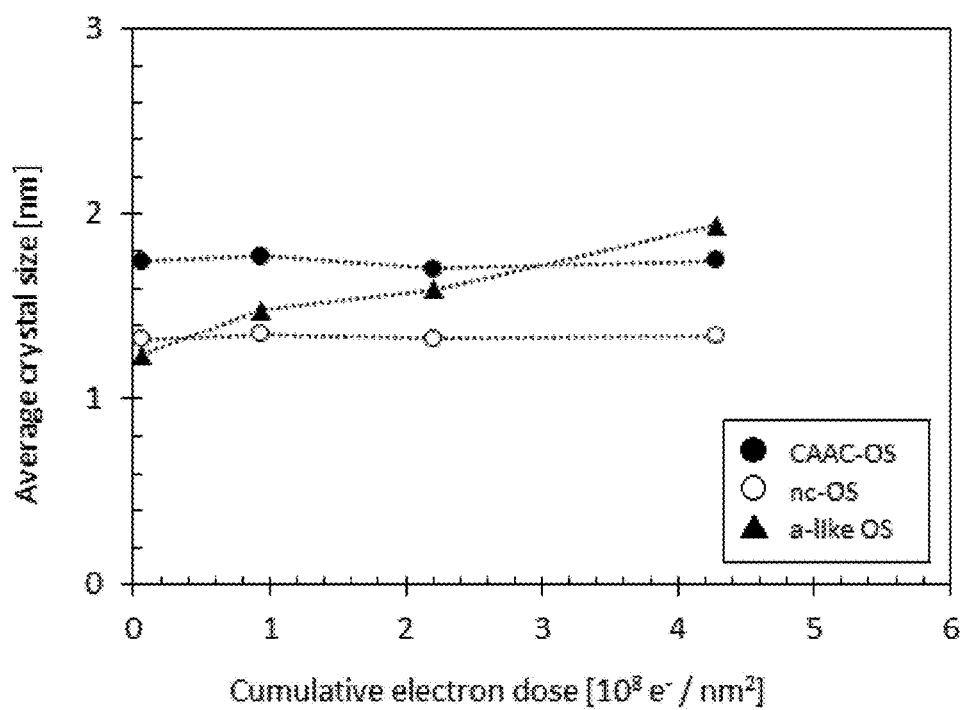
FIG. 34 shows a change of crystal parts of an In—Ga—Zn oxide owing to electron irradiation.

FIG. 34 shows change in the average size of crystal parts (at 22 points to 30 points) in each sample. Note that the crystal part size corresponds to the length of a lattice fringe. FIG. 34 indicates that the crystal part size in the a-like OS increases with an increase in the cumulative electron dose in obtaining TEM images, for example. As shown in FIG. 34, a crystal part of approximately 1.2 nm (also referred to as an initial nucleus) at the start of TEM observation grows to a size of approximately 1.9 nm at a cumulative electron (e$^-$) dose of $4.2 \times 10^8$ e$^-$/nm$^2$. In contrast, the crystal part size in the nc-OS and the CAAC-OS shows little change from the start of electron irradiation to a cumulative electron dose of $4.2 \times 10^8$ e$^-$/nm$^2$. As shown in FIG. 34, the crystal part sizes in an nc-OS and a CAAC-OS are approximately 1.3 nm and approximately 1.8 nm, respectively, regardless of the cumulative electron dose. For the electron beam irradiation and TEM observation, a Hitachi H-9000NAR transmission electron microscope was used. The conditions of electron beam irradiation were as follows: the accelerating voltage was 300 kV; the current density was $6.7 \times 10^5$ e$^-$/(nm$^2 \cdot$s); and the diameter of irradiation region was 230 nm.

In this manner, growth of the crystal part in the a-like OS is sometimes induced by electron irradiation. In contrast, in the nc-OS and the CAAC-OS, growth of the crystal part is hardly induced by electron irradiation. Therefore, the a-like OS has an unstable structure as compared with the nc-OS and the CAAC-OS.

The a-like OS has a lower density than the nc-OS and the CAAC-OS because it contains a void. Specifically, the density of the a-like OS is higher than or equal to 78.6% and lower than 92.3% of the density of the single crystal oxide semiconductor having the same composition. The density of each of the nc-OS and the CAAC-OS is higher than or equal to 92.3% and lower than 100% of the density of the single crystal oxide semiconductor having the same composition. Note that it is difficult to deposit an oxide semiconductor having a density of lower than 78% of the density of the single crystal oxide semiconductor.

For example, in the case of an oxide semiconductor having an atomic ratio of In:Ga:Zn=1:1:1, the density of single crystal InGaZnO$_4$ with a rhombohedral crystal structure is 6.357 g/cm$^3$. Accordingly, in the case of the oxide semiconductor having an atomic ratio of In:Ga:Zn=1:1:1, the density of the a-like OS is higher than or equal to 5.0 g/cm$^3$ and lower than 5.9 g/cm$^3$. For example, in the case of the oxide semiconductor having an atomic ratio of In:Ga:Zn=1:1:1, the density of each of the nc-OS and the CAAC-OS is higher than or equal to 5.9 g/cm$^3$ and lower than 6.3 g/cm$^3$.

Note that in the case where an oxide semiconductor having a certain composition does not exist in a single crystal structure, single crystal oxide semiconductors with different compositions are combined at an adequate ratio, which makes it possible to calculate density equivalent to that of a single crystal oxide semiconductor with the desired composition. The density of a single crystal oxide semiconductor having the desired composition can be calculated using a weighted average according to the combination ratio of the single crystal oxide semiconductors with different compositions. Note that it is preferable to use as few kinds of single crystal oxide semiconductors as possible to calculate the density.

As described above, oxide semiconductors have various structures and various properties. Note that an oxide semiconductor may be a stacked layer including two or more films of an amorphous oxide semiconductor, an a-like OS, an nc-OS, and a CAAC-OS, for example.

<Carrier Density of Oxide Semiconductor>

Next, the carrier density of an oxide semiconductor will be described below.

Examples of a factor affecting the carrier density of an oxide semiconductor include oxygen vacancy (V$_O$) and impurities in the oxide semiconductor.

As the amount of oxygen vacancy in the oxide semiconductor increases, the density of defect states increases when hydrogen is bonded to the oxygen vacancy (this state is also referred to as V$_O$H). The density of defect states also increases with an increase in the amount of impurity in the oxide semiconductor. Hence, the carrier density of an oxide semiconductor can be controlled by controlling the density of defect states in the oxide semiconductor.

A transistor using the oxide semiconductor in a channel region will be described below.

The carrier density of the oxide semiconductor is preferably reduced in order to inhibit the negative shift of the threshold voltage of the transistor or reduce the off-state current of the transistor. In order to reduce the carrier density of the oxide semiconductor, the impurity concentration in the oxide semiconductor is reduced so that the density of defect states can be reduced. In this specification and the like, a state with a low impurity concentration and a low density of defect states is referred to as a highly purified intrinsic or substantially highly purified intrinsic state. The carrier density of a highly purified intrinsic oxide semiconductor is lower than $8\times10^{15}$ cm$^{-3}$, preferably lower than $1\times10^{11}$ cm$^{-3}$, and further preferably lower than $1\times10^{10}$ cm$^{-3}$ and is higher than or equal to $1\times10^{-9}$ cm$^{-3}$.

In contrast, the carrier density of the oxide semiconductor is preferably increased in order to improve the on-state current of the transistor or improve the field-effect mobility of the transistor. In order to increase the carrier density of the oxide semiconductor, the impurity concentration or the density of defect states in the oxide semiconductor is slightly increased. Alternatively, the bandgap of the oxide semiconductor is preferably narrowed. For example, an oxide semiconductor that has a slightly high impurity concentration or a slightly high density of defect states in the range where a favorable on/off ratio is obtained in the $I_d$-$V_g$ characteristics of the transistor can be regarded as substantially intrinsic. Furthermore, an oxide semiconductor that has a high electron affinity and thus has a narrow bandgap so as to increase the density of thermally excited electrons (carriers) can be regarded as substantially intrinsic. Note that a transistor using an oxide semiconductor with higher electron affinity has lower threshold voltage.

The aforementioned oxide semiconductor with an increased carrier density has somewhat n-type conductivity; thus, it can be referred to as a "slightly-n" oxide semiconductor.

The carrier density of a substantially intrinsic oxide semiconductor is preferably higher than or equal to $1\times10^5$ cm$^{-3}$ and lower than $1\times10^{18}$ cm$^{-3}$, further preferably higher than or equal to $1\times10^7$ cm$^{-3}$ and lower than or equal to $1\times10^{17}$ cm$^{-3}$, still further preferably higher than or equal to $1\times10^9$ cm$^{-3}$ and lower than or equal to $5\times10^{16}$ cm$^{-3}$, yet further preferably higher than or equal to $1\times10^{10}$ cm$^{-3}$ and lower than or equal to $1\times10^{16}$ cm$^{-3}$, and yet still preferably higher than or equal to $1\times10^{11}$ cm$^{-3}$ and lower than or equal to $1\times10^{15}$ cm$^{-3}$.

The structures described in this embodiment can be used in appropriate combination with any of the structures described in the other embodiments.

Embodiment 8

In this embodiment, examples of a package and a module each including an image sensor chip will be described. For the image sensor chip, the structure of an imaging device of one embodiment of the present invention can be used.

Figure 35A:
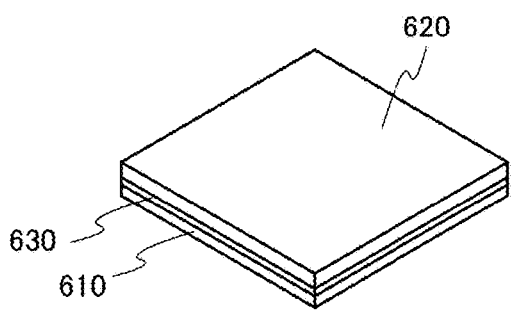
FIGS. 35A to 35D are perspective views and a cross-sectional view of a package including an imaging device.

FIG. 35A is an external perspective view showing the top surface side of a package including an image sensor chip. The package includes a package substrate 610 to which an image sensor chip 650 is fixed, a cover glass 620, an adhesive 630 for bonding the package substrate 610 and the cover glass 620 to each other, and the like.

Figure 35B:
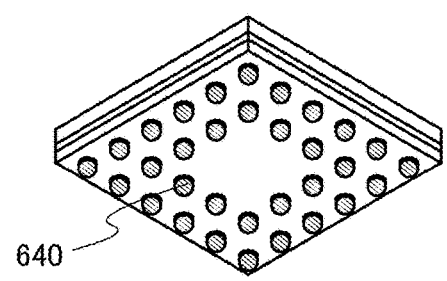

FIG. 35B is an external perspective view showing the bottom surface side of the package. On the bottom surface of the package, ball grid array (BGA) including solder balls as bumps 640 is formed. Although BGA is employed here, land grid array (LGA), pin grid array (PGA), or the like may be alternatively employed.

Figure 35C:
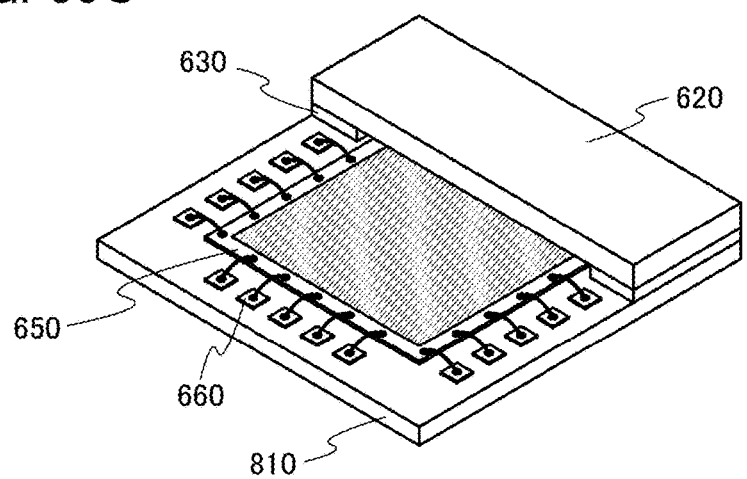
Figure 35D:
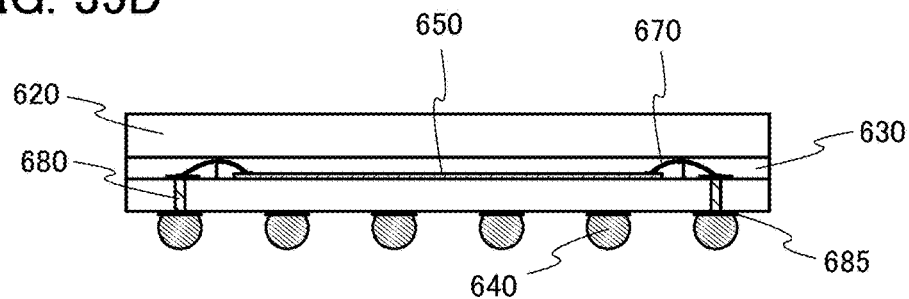

FIG. 35C is a perspective view of the package, in which the cover glass 620 and the adhesive 630 are partly illustrated. FIG. 35D is a cross-sectional view of the package. Electrode pads 660 are formed over the package substrate 610, and electrically connected to the bumps 640 via through-holes 680 and lands 685. The electrode pads 660 are electrically connected to electrodes of the image sensor chip 650 through wires 670.

Figure 36A:
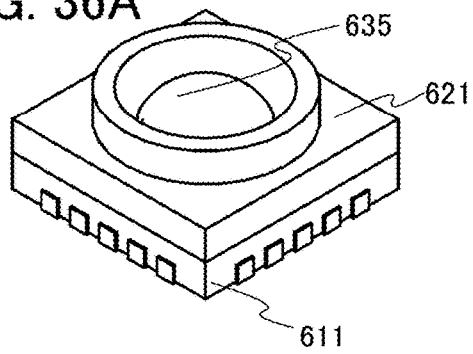
FIGS. 36A to 36D are perspective views and a cross-sectional view of a package including an imaging device.

FIG. 36A is an external perspective view showing the top surface side of a camera module in which an image sensor chip is mounted on a package with a built-in lens. The camera module includes a package substrate 611 to which an image sensor chip 651 is fixed, a lens cover 621, a lens 635, and the like. Furthermore, an IC chip 690 having functions of a driver circuit, a signal conversion circuit, and the like of an imaging device is provided between the package substrate 611 and the image sensor chip 651. Thus, the camera module is built as a system in package (SiP).

Figure 36B:
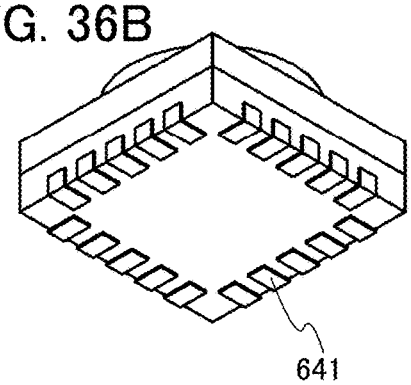

FIG. 36B is an external perspective view showing the bottom surface side of the camera module. On the bottom surface and four side surfaces of the package substrate 611, mounting lands 641 are provided; this structure can be called a quad flat no-lead package (QFN). Although QFN is employed here, quad flat package (QFP), the above BGA, or the like may be alternatively employed.

Figure 36C:
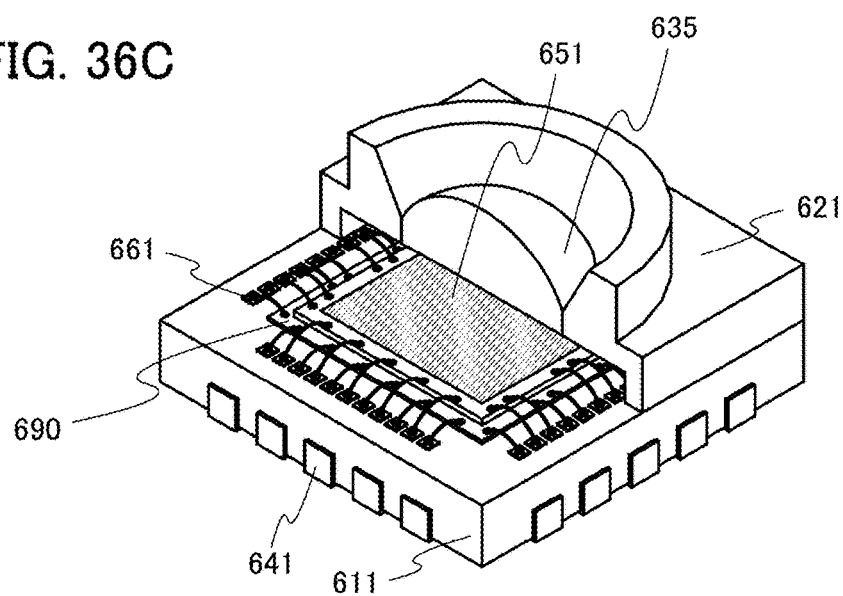
Figure 36D:
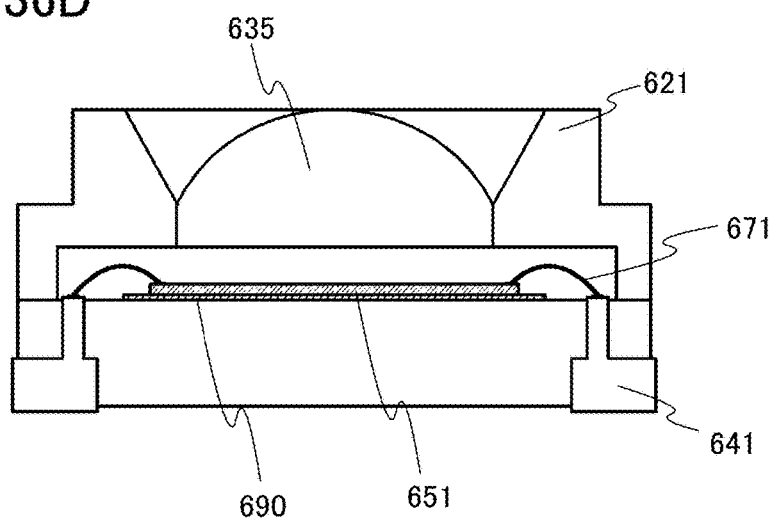

FIG. 36C is a perspective view of the module, in which the lens cover 621 and the lens 635 are partly illustrated. FIG. 36D is a cross-sectional view of the camera module. The lands 641 are partly used as the electrode pads 661. The electrode pads 661 are electrically connected to electrodes of the image sensor chip 651 and the IC chip 690 through wires 671.

The image sensor chip can be easily mounted on the package having the above structure, and can be incorporated into a variety of semiconductor devices or a variety of electronic devices.

This embodiment can be applied not only to imaging devices but also to other semiconductor devices. For example, this embodiment can be applied to memory devices.

The structures described in this embodiment can be used in appropriate combination with any of the structures described in the other embodiments.

Embodiment 9

This embodiment shows examples of electronic devices to which an imaging device of one embodiment of the present invention can be applied.

Examples of electronic devices that can use the imaging device of one embodiment of the present invention or a semiconductor device including the imaging device include display devices, personal computers, image memory devices or image reproducing devices provided with storage media, cellular phones, game machines (including portable game machines), portable information terminals, e-book readers, cameras such as video cameras and digital still cameras, goggle-type displays (head mounted displays), navigation systems, audio reproducing devices (e.g., car audio systems and digital audio players), copiers, facsimiles, printers, multifunction printers, automated teller machines (ATM), and vending machines. FIGS. 37A to 37F illustrate specific examples of these electronic devices.

Figure 37A:
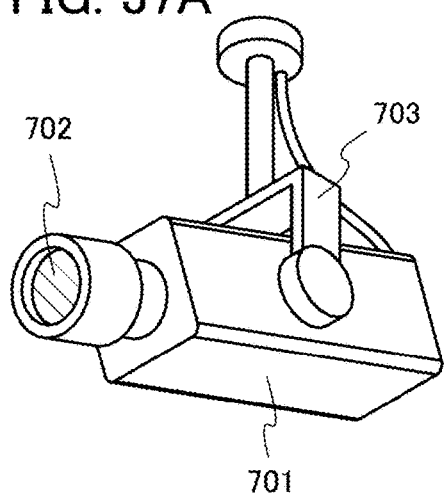
FIGS. 37A to 37F illustrate electronic devices.

FIG. 37A illustrates a monitoring camera, which includes a housing 701, a lens 702, a support portion 703, and the like. The imaging device of one embodiment of the present invention can be included as a component for obtaining an image in the monitoring camera. Note that a "monitoring camera" is a common name and does not limit the uses. For example, a device that has a function of a monitoring camera can also be called a camera or a video camera.

Figure 37B:
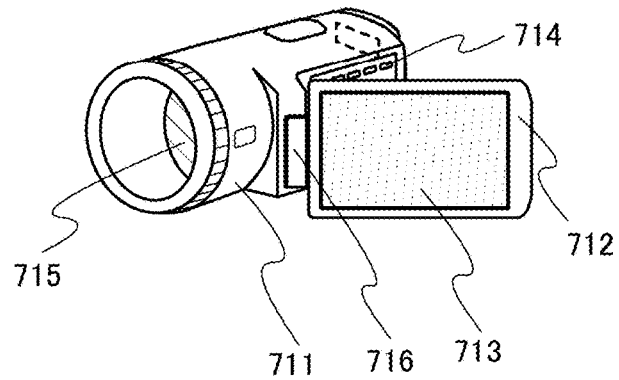

FIG. 37B illustrates a video camera, which includes a first housing 711, a second housing 712, a display portion 713, operation keys 714, a lens 715, a joint 716, and the like. The operation keys 714 and the lens 715 are provided for the first housing 711, and the display portion 713 is provided for the second housing 712. The imaging device of one embodiment of the present invention can be included as a component for obtaining an image in the video camera.

Figure 37C:
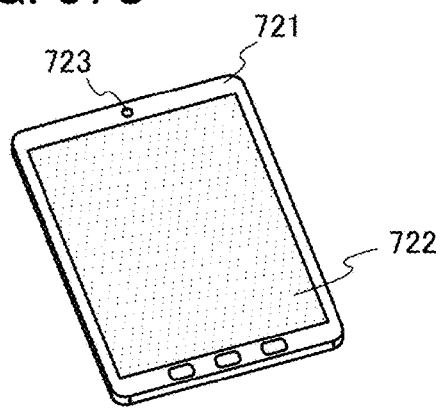

FIG. 37C illustrates a portable data terminal, which includes a housing 721, a display portion 722, a camera 723, and the like. The touch panel function of the display portion 722 enables input and output of information. The imaging device of one embodiment of the present invention can be included as one component for obtaining an image in the portable data terminal.

Figure 37D:
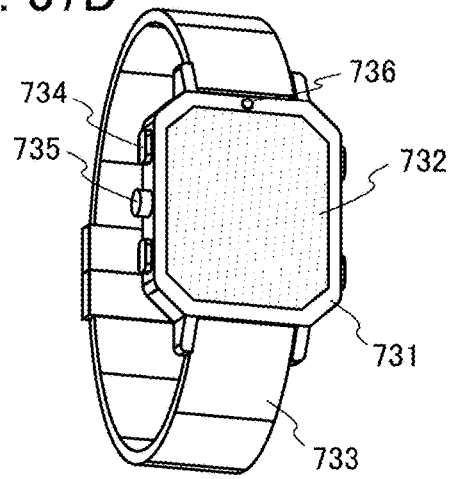

FIG. 37D illustrates a wrist-watch-type information terminal, which includes a housing 731, a display portion 732, a wristband 733, operation buttons 734, a winder 735, a camera 736, and the like. The display portion 732 may be a touch panel. The imaging device of one embodiment of the present invention can be included as a component for obtaining an image in the information terminal.

Figure 37E:
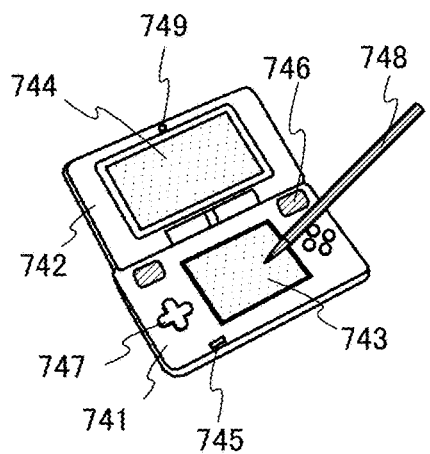

FIG. 37E illustrates a portable game machine, which includes housings 741 and 742, display portions 743 and 744, a microphone 745, speakers 746, an operation key 747, a stylus 748, a camera 749, and the like. Although the portable game machine in FIG. 37E has the two display portions 743 and 744, the number of display portions included in the portable game machine is not limited to two. The imaging device of one embodiment of the present invention can be included as one component for obtaining an image in the portable game machine.

Figure 37F:
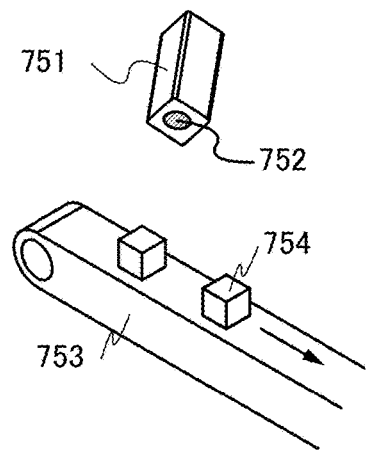

FIG. 37F is an inspection apparatus including a housing 751, a sensor 752, and the like. The inspection apparatus is configured to detect a fault in a product 754 on a conveyor belt 753, for example. The imaging device of one embodiment of the present invention can be used for the sensor 752.

Note that the examples are not limited to the above-described electronic devices as long as the imaging device of one embodiment of the present invention is included.

The electronic devices described in this embodiment do not necessarily include imaging devices of one embodiment of the present invention as long as semiconductor devices of one embodiment of the present invention are included. For example, the electronic devices described in this embodiment can include memory devices of one embodiment of the present invention. The examples are not particularly limited to the above-described electronic devices as long as a semiconductor device of one embodiment of the present invention is included.

This embodiment can be combined with any of the other embodiments in this specification as appropriate.

EXPLANATION OF REFERENCE

10: imaging device, 11: pixel, 12: pixel array, 13: circuit, 14: circuit, 15: circuit, 16: circuit, 16A: circuit, 16B: circuit, 17: circuit, 17A: circuit, 17B: circuit, 20: circuit, 21: transistor, 22: transistor, 23: transistor, 24: transistor, 25: transistor, 26: transistor, 27: wiring, 28: wiring, 29: wiring, 30: circuit, 31: transistor, 32: transistor, 33: transistor, 34: transistor, 35: wiring, 36: wiring, 40: circuit, 41: transistor, 42: transistor, 43: transistor, 44: wiring, 45: wiring, 50: circuit, 51: circuit, 52a: circuit, 52b: circuit, 53: transistor, 53a: transistor, 53b: transistor, 54: capacitor, 54a: capacitor, 54b: capacitor, 55: wiring, 56: wiring, 61a: wiring, 61b: wiring, 62a: wiring, 62b: wiring, 63a: wiring, 63b: wiring, 70: circuit, 71: transistor, 72: transistor, 73: transistor, 74: transistor, 75a: wiring, 75b: wiring, 76: wiring, 77: wiring, 78: wiring, 80: region, 81A: wiring, 81B: wiring, 82: wiring, 82A: wiring, 82B: wiring, 83: wiring, 84: wiring, 85: wiring, 401: transistor, 402: transistor, 403: transistor, 404: transistor, 405: transistor, 406: transistor, 407: transistor, 408: transistor, 409: transistor, 410: transistor, 411: transistor, 412: transistor, 413: transistor, 415: substrate, 420: insulating film, 430: oxide semiconductor film, 430a: oxide semiconductor film, 430b: oxide semiconductor film, 430c: oxide semiconductor film, 440: conductive film, 441: conductive film, 442: conductive film, 450: conductive film, 451: conductive film, 452: conductive film, 460: insulating film, 470: conductive film, 471: conductive film, 472: conductive film, 473: conductive film, 475: insulating film, 480: insulating film, 531: region, 532: region, 533: region, 534: region, 535: region, 610: package substrate, 611: package substrate, 620: cover glass, 621: lens cover, 630: adhesive, 635: lens, 640: bump, 641: land, 650: image sensor chip, 651: image sensor chip, 660: electrode pad, 661: electrode pad, 670: wire, 671: wire, 680: through-hole, 685: land, 690: IC chip, 701: housing, 702: lens, 703: support portion, 711: housing, 712: housing, 713: display portion, 714: operation key, 715: lens, 716: connection portion, 721: housing, 722: display portion, 723: camera, 731: housing, 732: display portion, 733: wristband, 734: button, 735: winder, 736: camera, 741: housing, 742: housing, 743: display portion, 744: display portion, 745: microphone, 746: speaker, 747: operation key, 748: stylus, 749: camera, 751: housing, 752: sensor, 753: conveyor belt, and 754: product.

This application is based on Japanese Patent Application serial no. 2015-192760 filed with Japan Patent Office on Sep. 30, 2015, the entire contents of which are hereby incorporated by reference.

The invention claimed is:

1. A semiconductor device implementing a circuit diagram comprising:
a first circuit;
a first wiring;
a second wiring;
a third wiring;
a fourth wiring;
a fifth wiring; and
a sixth wiring,
wherein the first circuit operates in a first mode or a second mode,
wherein the first circuit comprises a second circuit, a third circuit, a fourth circuit, and a fifth circuit,
wherein the fifth circuit includes n sixth circuits, where n is an integer of 2 or more,
wherein the second circuit is electrically connected to the third circuit by the fifth wiring and the sixth wiring,
wherein the third circuit is electrically connected to the fourth circuit by the fifth wiring and the sixth wiring,
wherein the fourth circuit is electrically connected to the fifth circuit by the fifth wiring and the sixth wiring, wherein the second circuit is configured to transfer data in the first wiring to the fifth wiring in the case where the first circuit operates in the first mode, wherein the second circuit is configured to transfer data in the second wiring to the sixth wiring in the case where the first circuit operates in the first mode, wherein the second circuit is configured to output a signal corresponding to data in the fifth wiring to the third wiring in the case where the first circuit operates in the second mode, wherein the second circuit is configured to output a signal corresponding to data in the sixth wiring to the fourth wiring in the case where the first circuit operates in the second mode, wherein the third circuit is configured to store 1-bit complementary data, wherein the third circuit is configured to write the 1-bit complementary data stored in the third circuit to the sixth circuits in the case where the first circuit operates in the first mode, wherein the third circuit is configured to amplify the 1-bit complementary data transferred from the sixth circuits in the case where the first circuit operates in the second mode, wherein the fourth circuit is configured to precharge the fifth wiring and the sixth wiring, wherein each of the sixth circuits is configured to retain the 1-bit complementary data written from the third circuit, wherein the second circuit comprises a first transistor, a second transistor, a third transistor, a fourth transistor, a fifth transistor, and a sixth transistor, wherein, in the circuit diagram, one of a source and a drain of the first transistor is directly connected to the first wiring, and wherein, in the circuit diagram, the other of the source and the drain of the first transistor is directly connected to the fifth wiring.

2. The semiconductor device according to claim 1, wherein the other of the source and the drain of the first transistor is electrically connected to a gate of the third transistor, wherein one of a source and a drain of the second transistor is electrically connected to the third wiring, wherein the other of the source and the drain of the second transistor is electrically connected to one of a source and a drain of the third transistor, wherein the other of the source and the drain of the third transistor is electrically connected to one of a source and a drain of the sixth transistor, wherein one of a source and a drain of the fourth transistor is electrically connected to the second wiring, wherein the other of the source and the drain of the fourth transistor is electrically connected to the sixth wiring, wherein the other of the source and the drain of the fourth transistor is electrically connected to a gate of the sixth transistor, wherein one of a source and a drain of the fifth transistor is electrically connected to the fourth wiring, and wherein the other of the source and the drain of the fifth transistor is electrically connected to the other of the source and the drain of the sixth transistor.

3. The semiconductor device according to claim 2, wherein the sixth circuits each comprises a seventh transistor, an eighth transistor, a first capacitor, and a second capacitor, wherein one of a source and a drain of the seventh transistor is electrically connected to the fifth wiring, wherein the other of the source and the drain of the seventh transistor is electrically connected to one terminal of the first capacitor, wherein one of a source and a drain of the eighth transistor is electrically connected to the sixth wiring, wherein the other of the source and the drain of the eighth transistor is electrically connected to one terminal of the second capacitor, wherein the other terminal of the first capacitor is electrically connected to the other terminal of the second capacitor, and wherein the seventh transistor and the eighth transistor each comprise an oxide semiconductor in an active layer.

4. The semiconductor device according to claim 1, wherein the third circuit comprises a latch circuit.

5. The semiconductor device according to claim 1, wherein the sixth circuits each comprises a seventh transistor, an eighth transistor, a first capacitor, and a second capacitor, wherein one of a source and a drain of the seventh transistor is electrically connected to the fifth wiring, wherein the other of the source and the drain of the seventh transistor is electrically connected to one terminal of the first capacitor, wherein one of a source and a drain of the eighth transistor is electrically connected to the sixth wiring, wherein the other of the source and the drain of the eighth transistor is electrically connected to one terminal of the second capacitor, wherein the other terminal of the first capacitor is electrically connected to the other terminal of the second capacitor, and wherein the seventh transistor and the eighth transistor each comprise an oxide semiconductor in an active layer.

6. The semiconductor device according to claim 5, wherein the oxide semiconductor contains In, Zn, and M, where M is Al, Ti, Ga, Sn, Y, Zr, La, Ce, Nd, or Hf.

7. The semiconductor device according to claim 1, wherein the fifth circuit comprises a region overlapping with each of the second circuit, the third circuit, and the fourth circuit.

8. An electronic device comprising the semiconductor device according to claim 1, wherein the electronic device comprises a display device.

9. The semiconductor device according to claim 1, wherein, in the circuit diagram, the other of the source and the drain of the first transistor is directly connected to a gate of the third transistor, wherein, in the circuit diagram, one of a source and a drain of the second transistor is directly connected to the third wiring, wherein, in the circuit diagram, the other of the source and the drain of the second transistor is directly connected to one of a source and a drain of the third transistor, wherein, in the circuit diagram, the other of the source and the drain of the third transistor is directly connected to one of a source and a drain of the sixth transistor, wherein, in the circuit diagram, one of a source and a drain of the fourth transistor is directly connected to the second wiring, wherein, in the circuit diagram, the other of the source and the drain of the fourth transistor is directly connected to the sixth wiring, wherein, in the circuit diagram, the other of the source and the drain of the fourth transistor is directly connected to a gate of the sixth transistor, wherein, in the circuit diagram, one of a source and a drain of the fifth transistor is directly connected to the fourth wiring, and wherein, in the circuit diagram, the other of the source and the drain of the fifth transistor is directly connected to the other of the source and the drain of the sixth transistor.

* * * * *